(12) United States Patent
Sharangpani et al.

(10) Patent No.: US 11,437,270 B2
(45) Date of Patent: Sep. 6, 2022

(54) THREE-DIMENSIONAL MEMORY DEVICE CONTAINING WORD LINES FORMED BY SELECTIVE TUNGSTEN GROWTH ON NUCLEATION CONTROLLING SURFACES AND METHODS OF MANUFACTURING THE SAME

(71) Applicant: SANDISK TECHNOLOGIES LLC, Plano, TX (US)

(72) Inventors: Rahul Sharangpani, Fremont, CA (US); Raghuveer S. Makala, Campbell, CA (US); Fei Zhou, San Jose, CA (US); Adarsh Rajashekhar, Santa Clara, CA (US); Senaka Krishna Kanakamedala, San Jose, CA (US); Fumitaka Amano, Yokkaichi (JP); Genta Mizuno, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 78 days.

(21) Appl. No.: 16/688,290

(22) Filed: Nov. 19, 2019

(65) Prior Publication Data

US 2020/0105595 A1 Apr. 2, 2020

Related U.S. Application Data

(60) Division of application No. 15/830,838, filed on Dec. 4, 2017, now Pat. No. 10,529,620, which is a
(Continued)

(51) Int. Cl.
*H01L 27/11524* (2017.01)
*H01L 21/768* (2006.01)
(Continued)

(52) U.S. Cl.
CPC .. *H01L 21/76879* (2013.01); *H01L 21/76816* (2013.01); *H01L 21/76843* (2013.01);
(Continued)

(58) Field of Classification Search
None
See application file for complete search history.

(56) References Cited

U.S. PATENT DOCUMENTS 5,084,417 A 1/1992 Joshi et al.
5,807,788 A 9/1998 Brodsky et al.
(Continued)

FOREIGN PATENT DOCUMENTS

WO WO2002/015277 A2 2/2002

OTHER PUBLICATIONS

Endoh et al., "Novel Ultra High Density Memory with a Stacked-Surrounding Gate Transistor (S-SGT) Structured Cell," IEDM Proc. pp. 33-36, (2001).
(Continued)

*Primary Examiner* — Abul Kalam
(74) *Attorney, Agent, or Firm* — The Marbury Law Group PLLC

(57) ABSTRACT

A method of forming a memory device includes forming an alternating stack of insulating layers and sacrificial material layers over a substrate forming memory stack structures through the alternating stack, forming a first backside trench and a second backside trench through the alternating stack, forming backside recesses by removing the sacrificial material layers, depositing a backside blocking dielectric layer after formation of the backside recesses, forming a liner that a lesser lateral extent than a lateral distance between the first backside trench and the second backside trench; and selectively growing a metal from surfaces of the liners while either not growing or growing at a lower rate the metal from surfaces of the backside recesses that are not covered by the liners.

20 Claims, 53 Drawing Sheets

Related U.S. Application Data continuation-in-part of application No. 15/332,429, filed on Oct. 24, 2016, now Pat. No. 10,381,372.

(60) Provisional application No. 62/361,778, filed on Jul. 13, 2016.

(51) Int. Cl.

| | | |
|---|---|---|
| *H01L 27/11556* | (2017.01) | |
| *H01L 27/11529* | (2017.01) | |
| *H01L 27/11519* | (2017.01) | |
| *H01L 27/1157* | (2017.01) | |
| *H01L 27/11582* | (2017.01) | |
| *H01L 27/11573* | (2017.01) | |
| *H01L 27/11565* | (2017.01) | |
| *H01L 23/532* | (2006.01) | |
| *H01L 23/528* | (2006.01) | |
| *H01L 23/522* | (2006.01) | |
| *H01L 21/28* | (2006.01) | |
| *H01L 21/285* | (2006.01) | |
| *H01L 27/11575* | (2017.01) | |

(52) U.S. Cl.
CPC .. *H01L 21/76865* (2013.01); *H01L 21/76876* (2013.01); *H01L 23/528* (2013.01); *H01L 23/5226* (2013.01); *H01L 23/53266* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01); *H01L 29/40114* (2019.08); *H01L 21/28562* (2013.01); *H01L 27/11575* (2013.01); *H01L 29/40117* (2019.08)

(56) References Cited

U.S. PATENT DOCUMENTS

| | | |
|---|---|---|
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,378,353 B2 | 5/2008 | Lee et al. |
| 7,514,321 B2 | 4/2009 | Mokhlesi et al. |
| 7,575,973 B2 | 8/2009 | Mokhlesi et al. |
| 7,608,195 B2 | 10/2009 | Wilson |
| 7,648,872 B2 | 1/2010 | Benson |
| 7,745,265 B2 | 6/2010 | Mokhlesi et al. |
| 7,745,312 B2 | 6/2010 | Herner et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,093,725 B2 | 1/2012 | Wilson |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,349,681 B2 | 1/2013 | Alsmeier et al. |
| 8,884,357 B2 | 11/2014 | Wang et al. |
| 8,987,089 B1 | 3/2015 | Pachamuthu et al. |
| 9,023,719 B2 | 5/2015 | Pachamuthu et al. |
| 9,023,973 B2 | 5/2015 | Morizur et al. |
| 9,230,976 B2 | 1/2016 | Alsmeier |
| 9,230,983 B1 | 1/2016 | Sharangpani et al. |
| 9,252,151 B2 | 2/2016 | Chien et al. |
| 9,331,094 B2 | 5/2016 | Hada |
| 9,397,046 B1 | 7/2016 | Sharangpani et al. |
| 9,397,093 B2 | 7/2016 | Makala et al. |
| 9,397,107 B2 | 7/2016 | Makala et al. |
| 9,449,983 B2 | 9/2016 | Yada et al. |
| 9,460,931 B2 | 10/2016 | Pachamuthu et al. |
| 9,496,274 B2 | 11/2016 | Pachamuthu et al. |
| 9,496,419 B2 | 11/2016 | Sharangpani et al. |
| 9,576,966 B1 | 2/2017 | Peri et al. |
| 9,748,174 B1 | 8/2017 | Amano |
| 9,793,139 B2 | 10/2017 | Sharangpani et al. |
| 9,806,089 B2 | 10/2017 | Sharangpani et al. |
| 9,831,268 B2 | 11/2017 | Alsmeier |
| 9,922,987 B1 | 3/2018 | Mizutani et al. |
| 2002/0190379 A1 | 12/2002 | Jian et al. |
| 2006/0102586 A1 | 5/2006 | Lee et al. |
| 2007/0210338 A1 | 9/2007 | Orlowski |
| 2007/0252201 A1 | 11/2007 | Kito et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0015581 A1 | 6/2010 | Kim et al. |
| 2010/0155818 A1 | 6/2010 | Cho |
| 2010/0018161 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1* | 3/2011 | Kim .................. H01L 27/11556 438/279 |
| 2011/0133606 A1 | 6/2011 | Yoshida et al. |
| 2011/0266606 A1 | 11/2011 | Park et al. |
| 2011/0303971 A1 | 12/2011 | Lee et al. |
| 2012/0001247 A1 | 1/2012 | Alsmeier |
| 2012/0001249 A1 | 1/2012 | Alsmeier |
| 2012/0256247 A1 | 10/2012 | Alsmeier |
| 2013/0122712 A1 | 5/2013 | Kim et al. |
| 2013/0224960 A1 | 8/2013 | Payyapilly et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2015/0179662 A1* | 6/2015 | Makala ............. H01L 27/11578 257/314 |
| 2015/0243675 A1 | 8/2015 | Lim et al. |
| 2015/0380419 A1 | 12/2015 | Gunji-Yoneoka et al. |
| 2016/0148945 A1 | 5/2016 | Sharangpani et al. |
| 2016/0149002 A1 | 5/2016 | Sharangpani et al. |
| 2016/0204122 A1 | 7/2016 | Shoji et al. |
| 2016/0268297 A1 | 9/2016 | Murakami et al. |
| 2016/0307908 A1 | 10/2016 | Sharangpani et al. |
| 2017/0092733 A1 | 3/2017 | Makala et al. |
| 2017/0125436 A1 | 5/2017 | Sharangpani et al. |
| 2017/0125538 A1 | 5/2017 | Sharangpani et al. |

OTHER PUBLICATIONS

Gueye, M. et al., "Silicon Deposition From Disilane: Experimental Study and Modeling," Journal de Physique IV Colloque, vol. 2, pp. C2-63 to C2-70, (1991).

Nakayama, Y. et al., "Deposition Mechanism of a-Si: H Film in Distance-Hydrogen Plasma," Japanese Journal of Applied Physics, vol. 23, No. 7, pp. L470-L472, (1984).

Voutsas, A. et al., "Deposition and Crystallization of a-Si Low Pressure Chemically Vapor Deposited Films Obtained by Low-Temperature Pyrolysis of Disilane," J. Electrochem., Soc., vol. 140, No. 3, pp. 871-877, (1993).

Invitation to Pay Additional Fees and, Where Applicable, Protest Fee, and Communication Relating to the Results of the Partial International Search for International Application No. PCT/US2016/049496, dated Nov. 21, 2016, 9 pages.

Park, H. L., et al., "The Deposition Mechanism and Microstructures of Tungsten Films Produced By Silicon Reduction of Wf6", Thin Solid Films, vol. 166, pp. 37-43 (1988).

Leusink, G. J., et al., "Growth kinetics and inhibition of growth of chemical vapor deposited thin tungsten films on silicon from tungsten hexafluoride", J. Appl. Phys. Vol. 72, No. 2, pp. 490-498, (1992).

Jang, et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(56) References Cited

OTHER PUBLICATIONS

Katsumata, et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda, et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6 pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, June. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Kim et al., "Direct Copper Electroless Deposition on a Tungsten Barrier Layer for Ultralarge Scale Integration," Journal of the Electrochemical Society, vol. 152 (2) 2005.

Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

Williams, K. R., et al., "Etch Rates for Micromachining Processing," Journal of Microelectromechanical Systems, vol. 5, No. 4, Dec. 1996.

Williams, K. R., et al., "Etch Rates for Micromachining Processing Part II," Journal of the Microelectromechanical Systems, vol. 12, No. 6, Dec. 2003.

Claes, M. et al., "Selective Wet Etching of Hf-based Layers," Abstracts, 204th Meeting of the Electrochemical Society, 2003.

Clancey, J. W. et al., "Atomic layer deposition of ultrathin platinum films on tungsten atomic layer deposition adhesion layers: Application to high surface area substrates," J. Vac. Sci. Technol. A 33(1), Jan./Feb. 2015, 01A130-1.

Jiang, P.C. et al., "Dependence of crystal structure and work function of WNx films on the nitrogen content," American Institute of Physics, Applied Physics Letters, vol. 89, pp. 122107-1-122107-3, (2006).

Jeon, S. et al., "Direct Synthesis of $W_{18}O_{49}$ Nanorods from $W_2N$ film by Thermal Annealing," NanoTechnology, vol. 18, pp. 1-7, (2007).

USPTO Non-Final Office Action for parent U.S. Appl. No. 15/322,429, dated Jul. 12, 2018, 11 pages.

\* cited by examiner

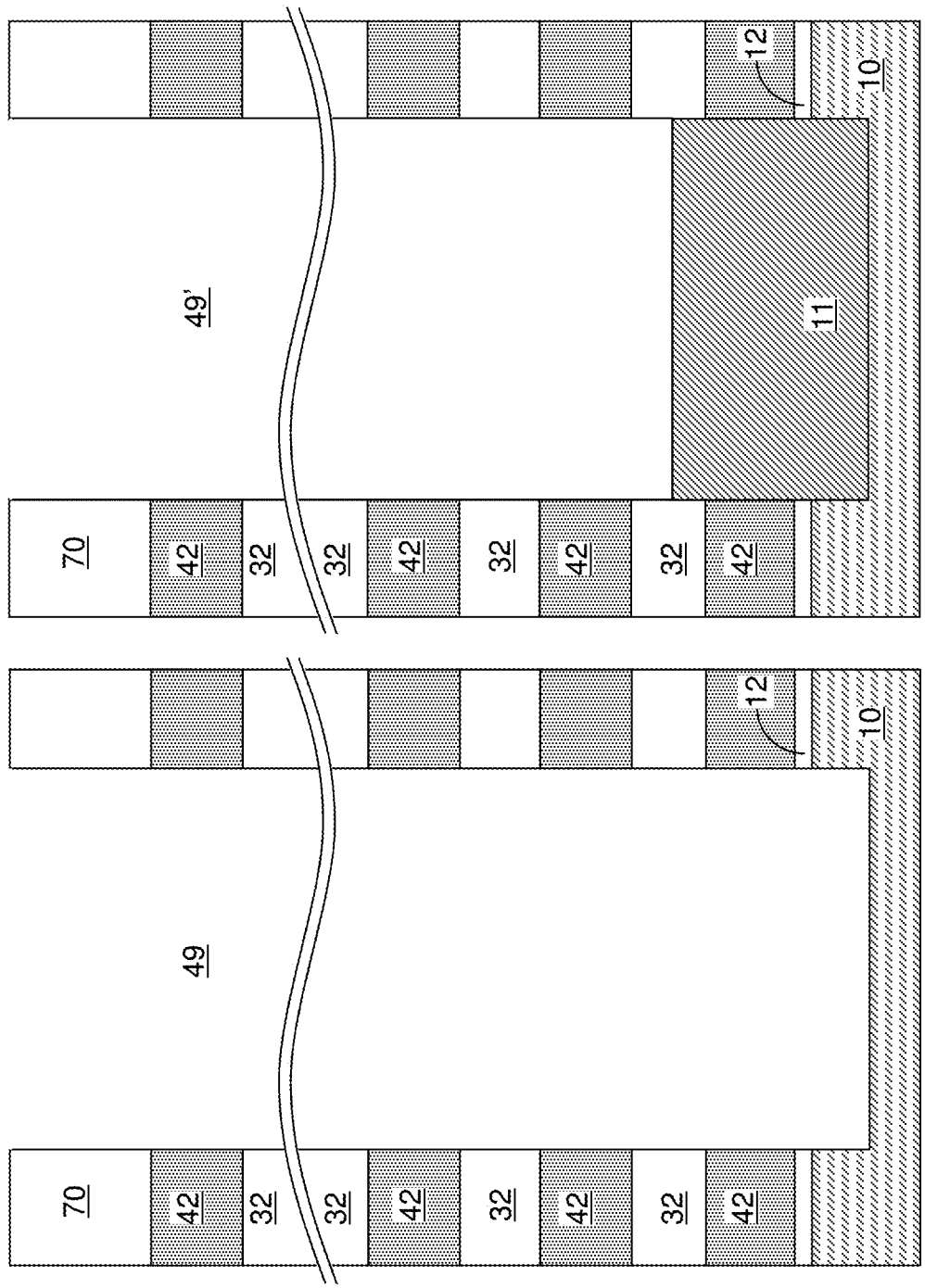

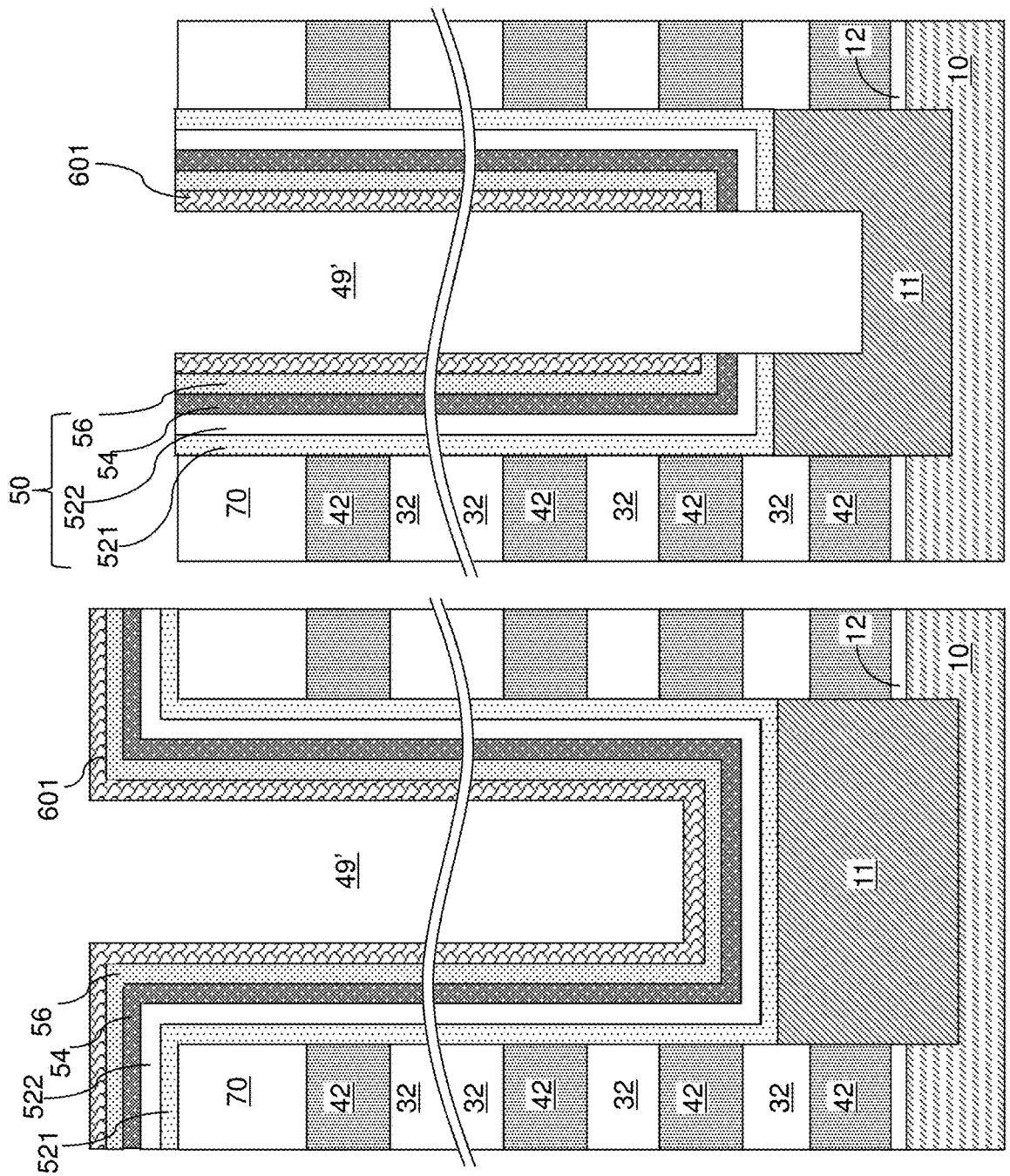

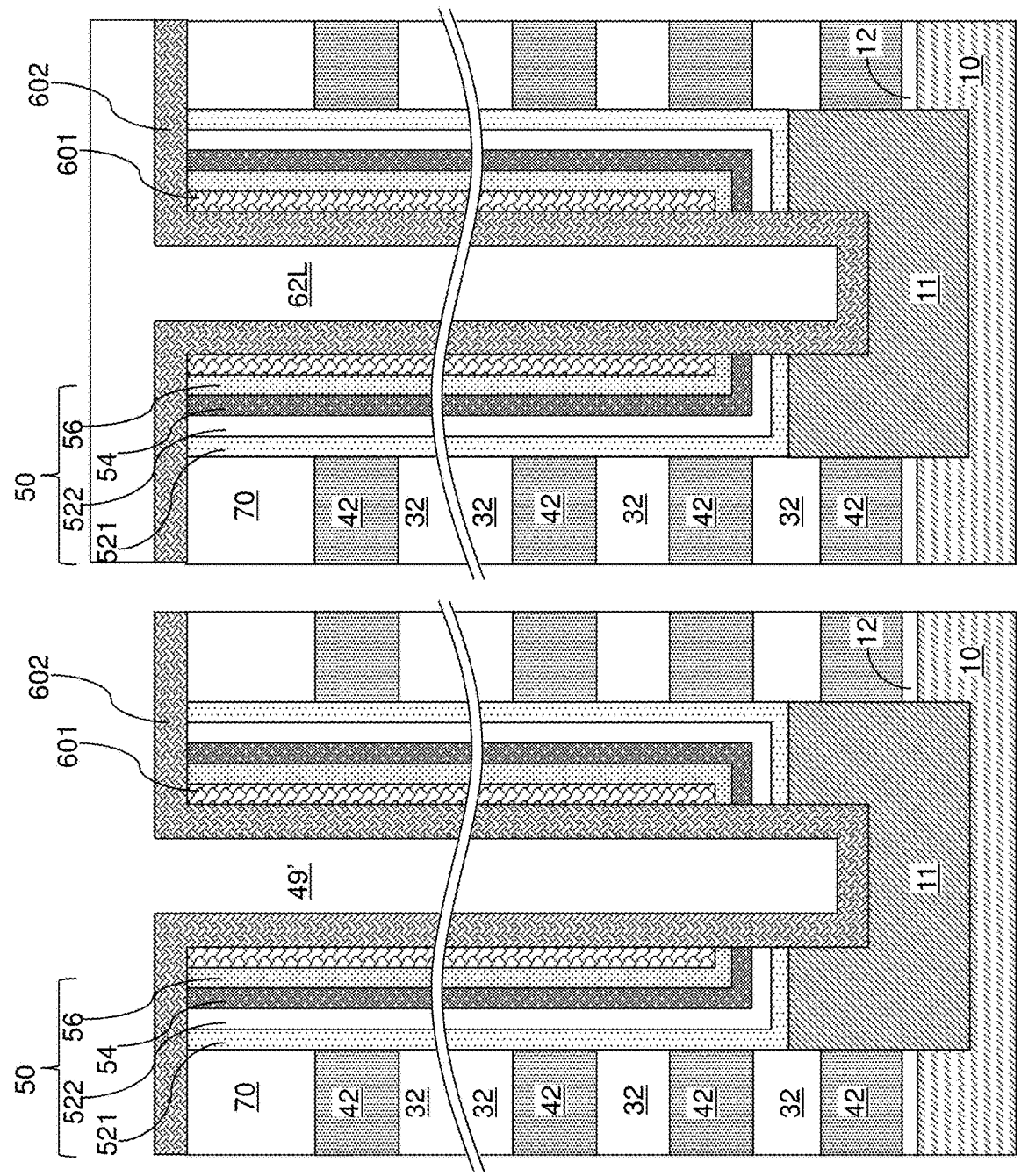

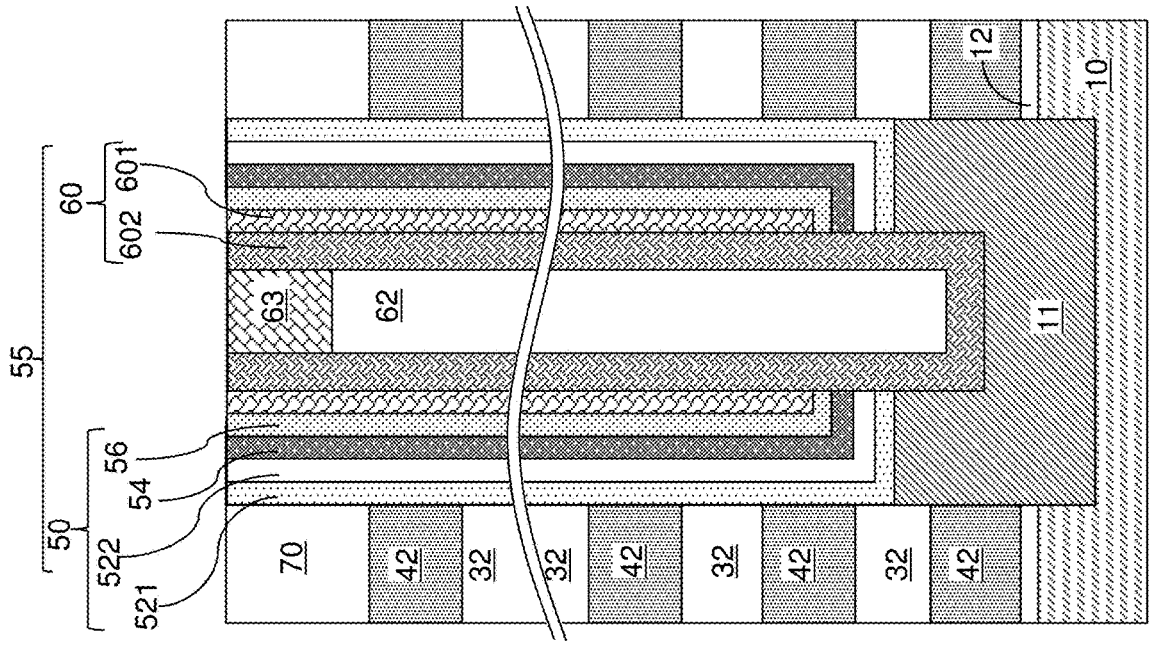
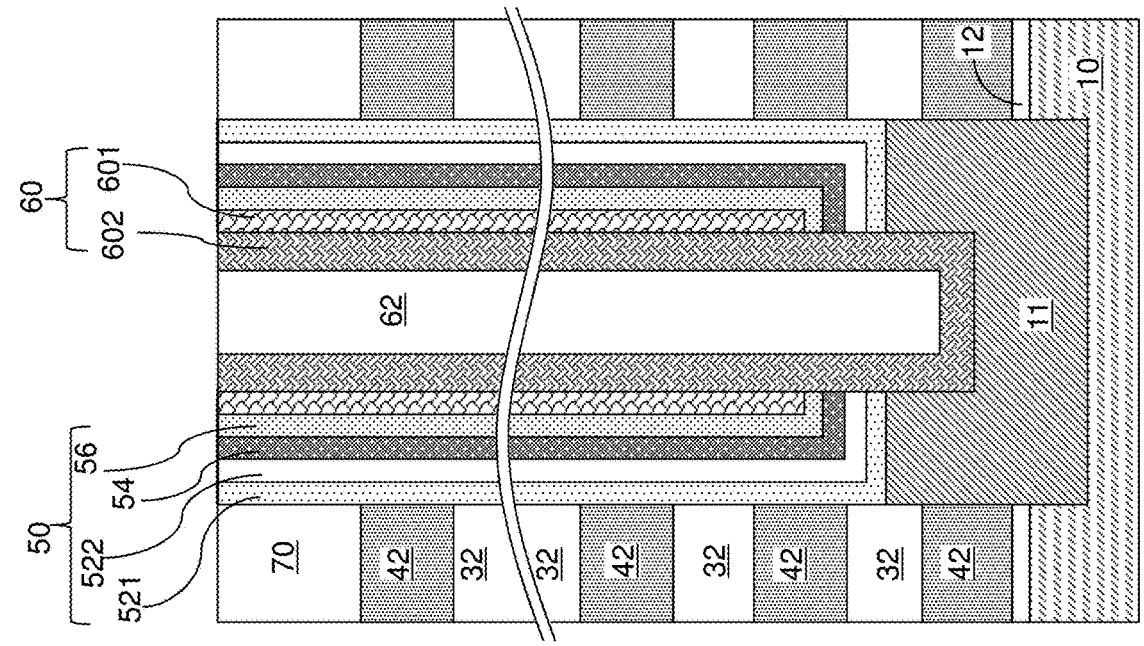

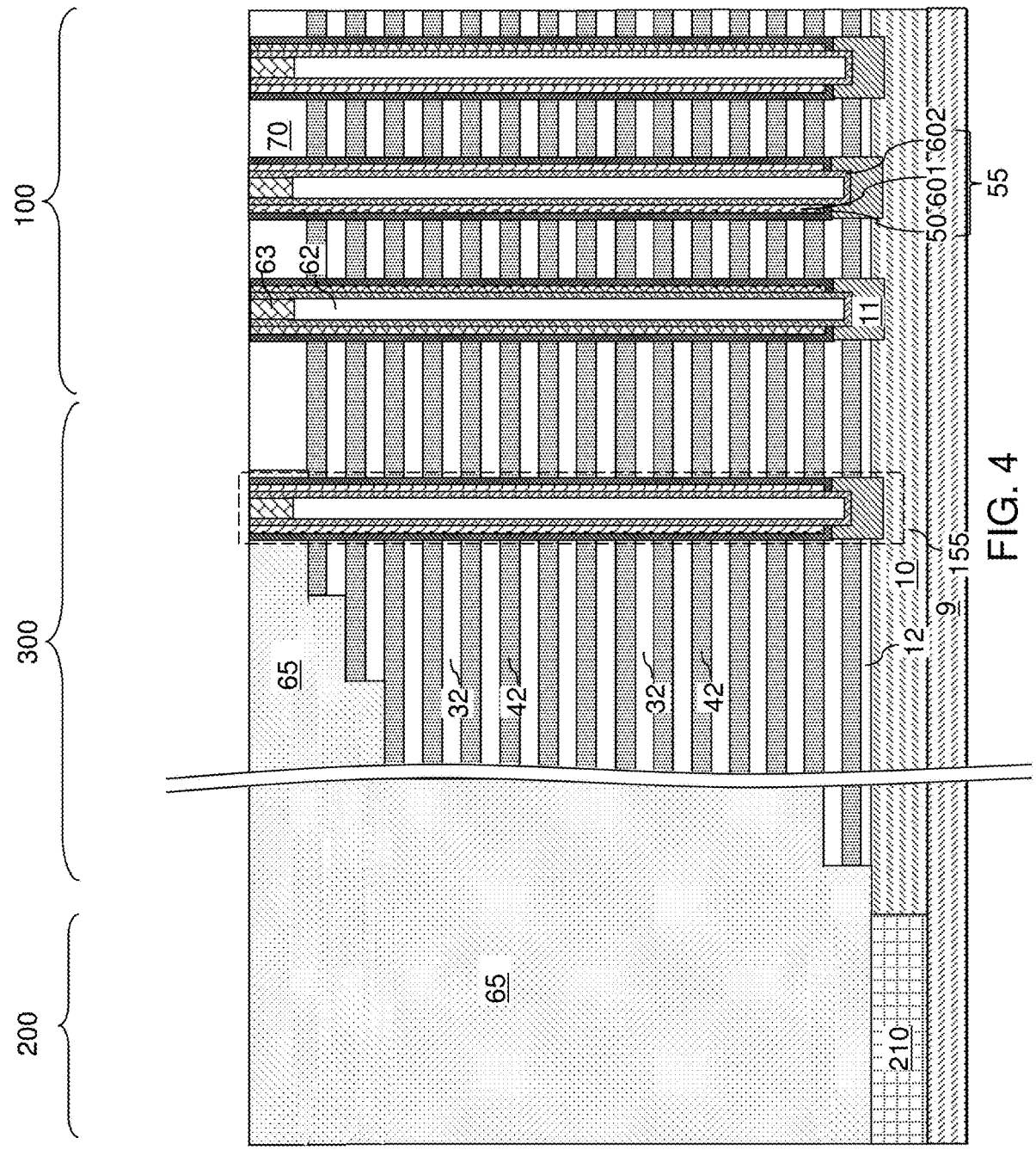

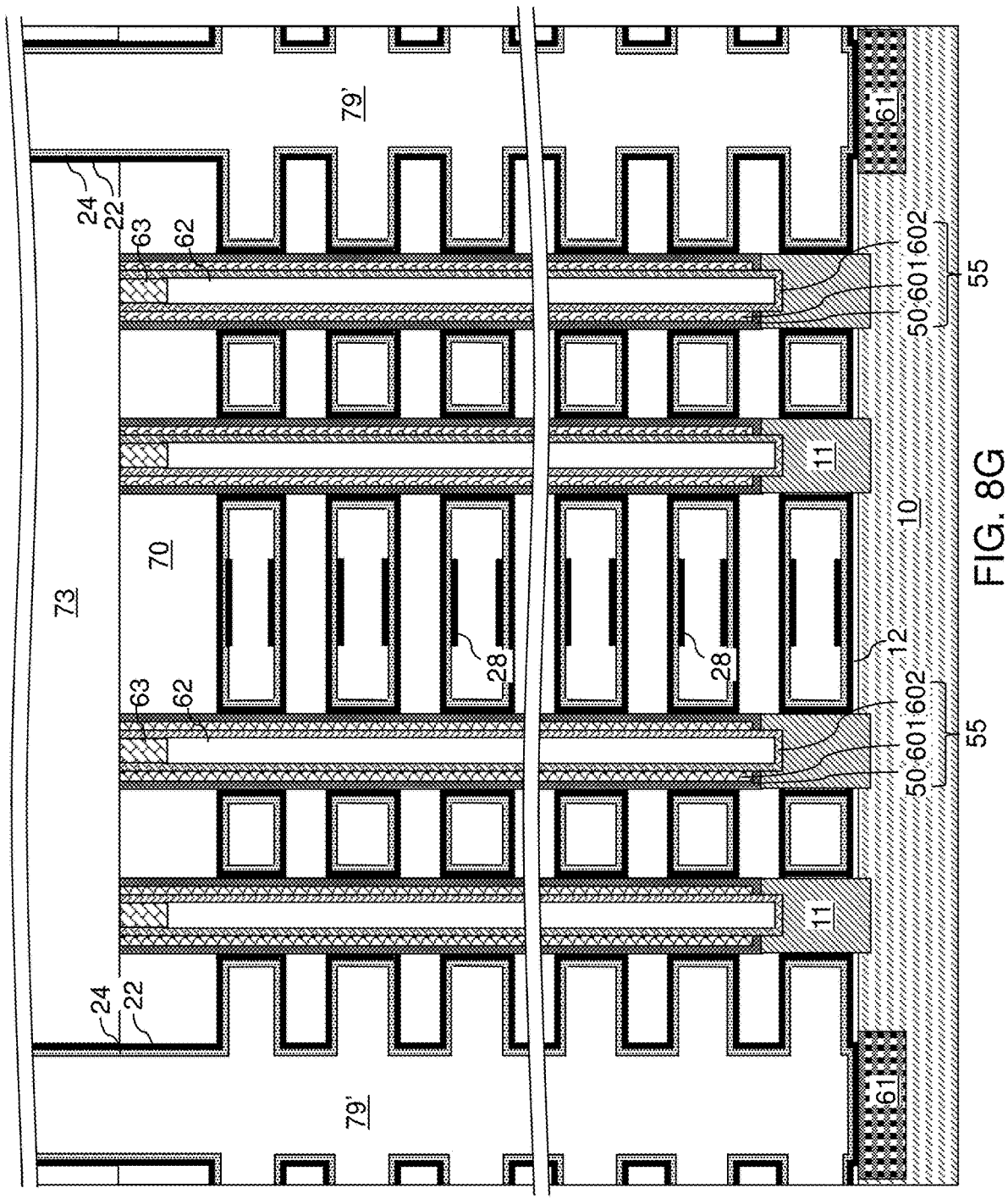

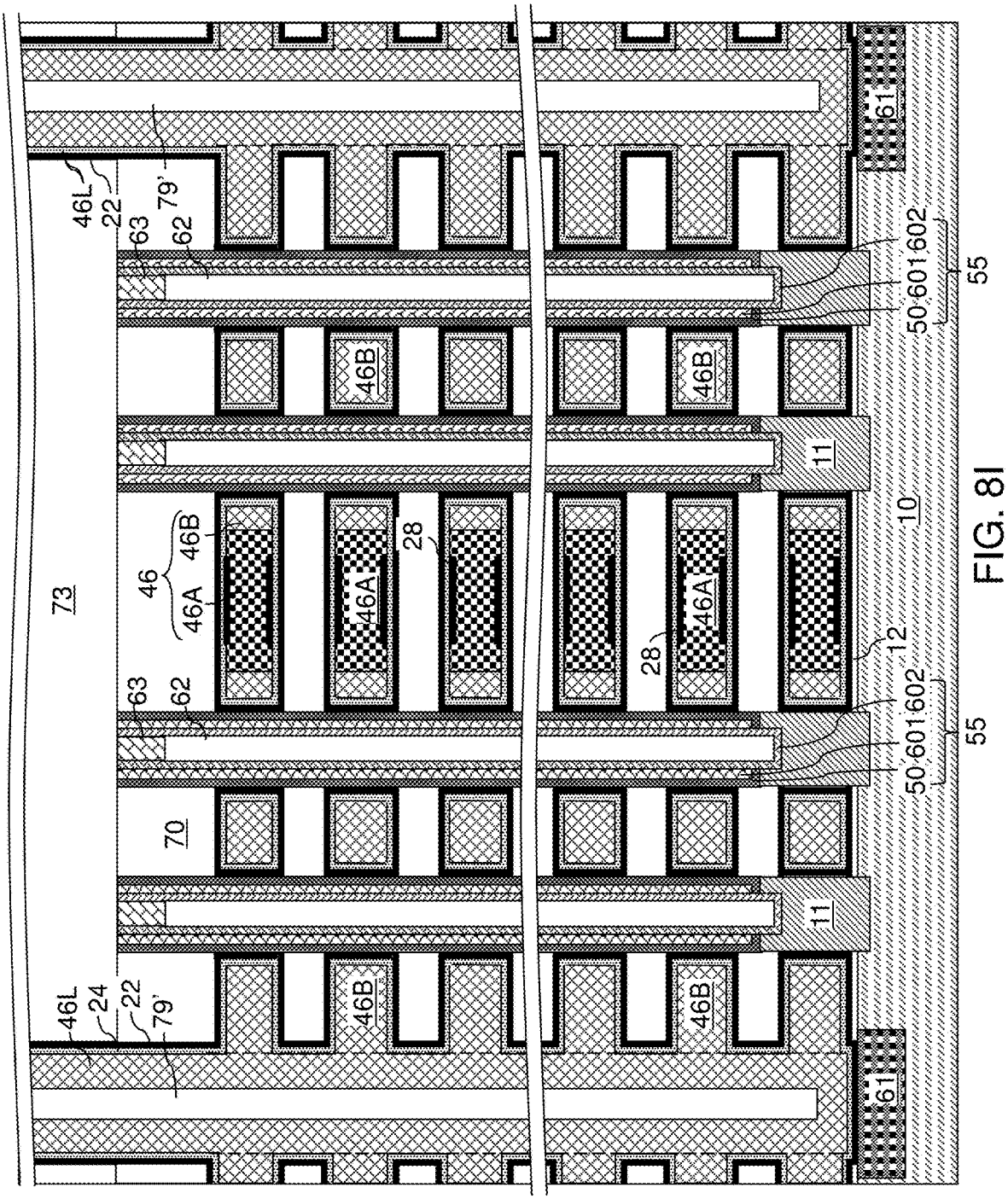

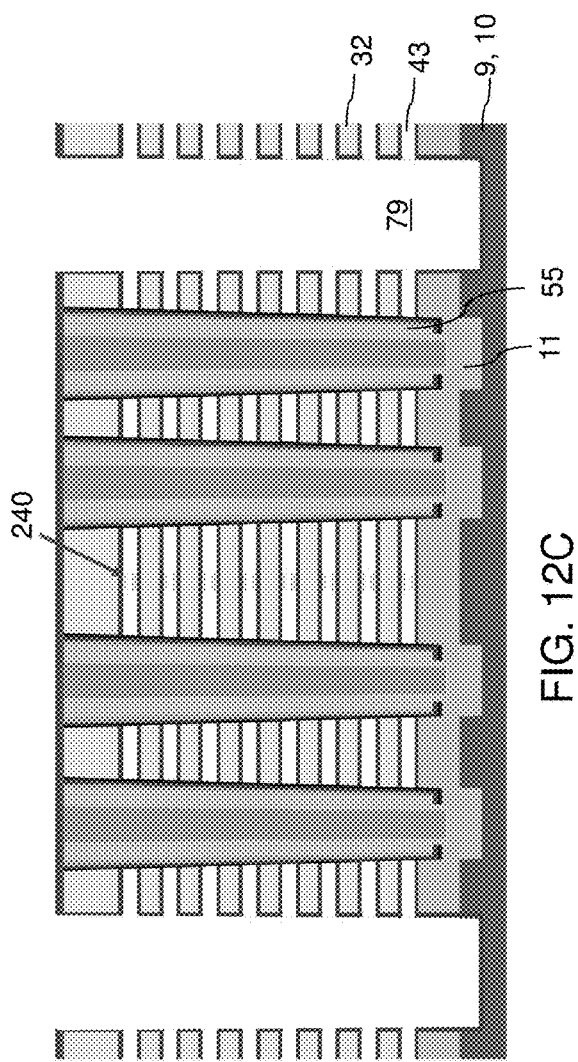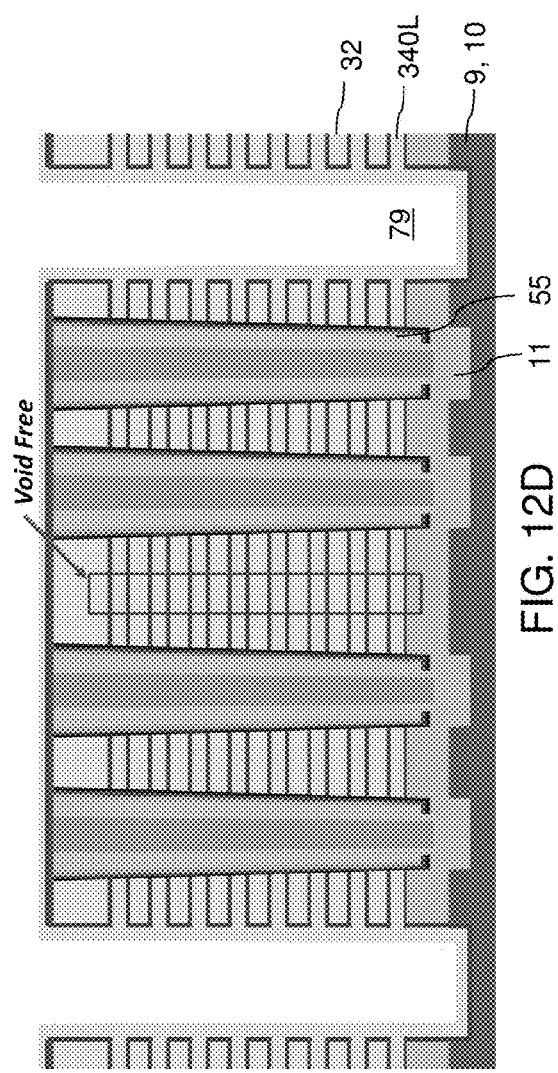

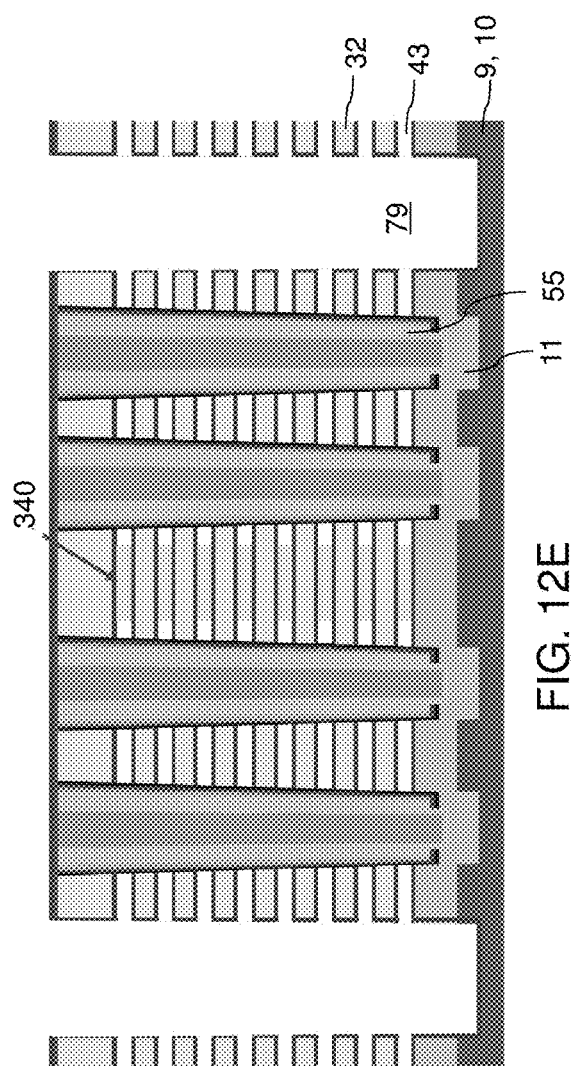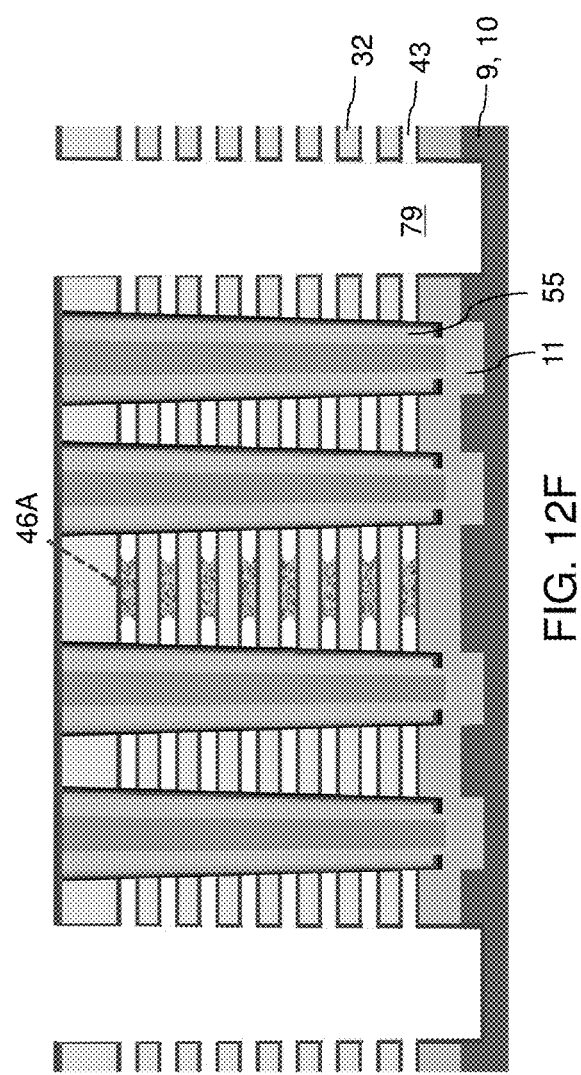

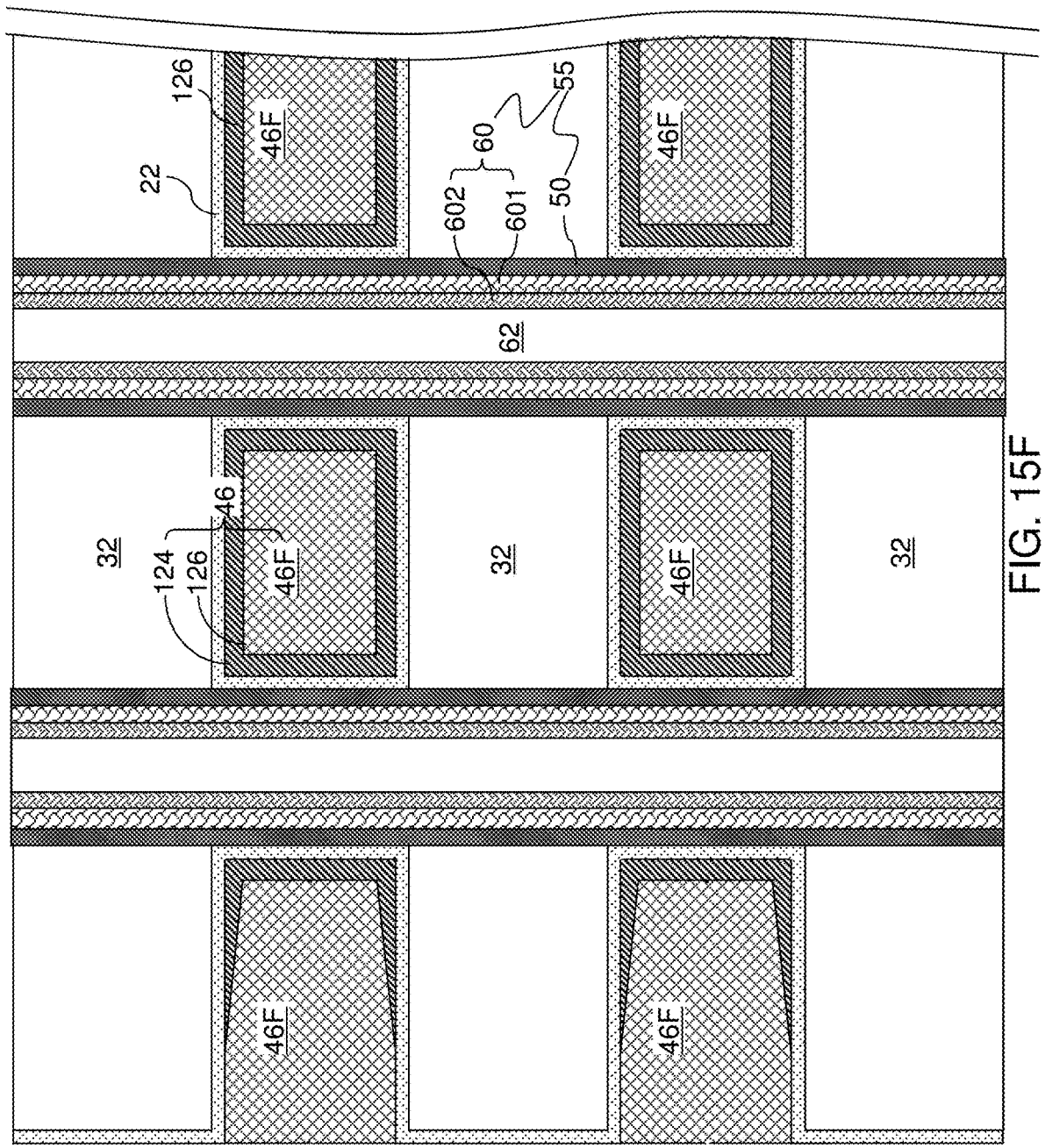

THREE-DIMENSIONAL MEMORY DEVICE CONTAINING WORD LINES FORMED BY SELECTIVE TUNGSTEN GROWTH ON NUCLEATION CONTROLLING SURFACES AND METHODS OF MANUFACTURING THE SAME

RELATED APPLICATIONS

This application is a divisional application of U.S. application Ser. No. 15/830,838 filed on Dec. 4, 2017, which is a continuation-in-part (CIP) application of U.S. application Ser. No. 15/332,429 filed on Oct. 24, 2016, which claims benefit of priority of U.S. Provisional Application Ser. No. 62/361,778 filed Jul. 13, 2016, the entire contents of which are incorporated herein by reference.

FIELD

The present disclosure relates generally to the field of semiconductor devices, and particular to a three-dimensional memory device including word lines formed by selective tungsten growth on nucleation controlling surfaces and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory stack structures extending through the alternating stack, each of the memory stack structures including charge storage elements, a tunneling dielectric, and a vertical semiconductor channel; a first backside trench and a second backside trench that extend through the alternating stack to the substrate; and a backside blocking dielectric layer located between each vertically neighboring pair of an insulating layer and an electrically conductive layer and laterally extending from the first backside trench to the second backside trench. Each of the electrically conductive layers comprises a respective metal fill portion that laterally extends from the first backside trench to the second backside trench and a liner having a lesser lateral extent than a lateral distance between the first backside trench and the second backside trench.

According to another aspect of the present disclosure, a method of forming a memory device is provided, which includes the steps of: forming an alternating stack of insulating layers and sacrificial material layers over a substrate; forming memory stack structures comprising a semiconductor channel and a memory film through the alternating stack; forming a first backside trench and a second backside trench through the alternating stack; forming backside recesses by removing the sacrificial material layers from the alternating stack selective to the insulating layers; depositing a backside blocking dielectric layer on surfaces of the insulating layers and the memory stack structures after formation of the backside recesses; forming a liner in each of the backside recesses, wherein each of the liners has a lesser lateral extent than a lateral distance between the first backside trench and the second backside trench; and selectively growing a metal from surfaces of the liners while either not growing or growing at a lower rate the metal from surfaces of the backside recesses that are not covered by the liners.

According to an aspect of the present disclosure, a three-dimensional memory device is provided, which comprises: an alternating stack of insulating layers and electrically conductive layers located over a substrate; memory stack structures extending through the alternating stack, each of the memory stack structures including a memory material layer, a tunneling dielectric, and a vertical semiconductor channel; a pair of backside trenches extending through the alternating stack and including respective backside contact via structures contacting a respective portion of the substrate; metallic liner layers laterally extending between the pair of backside trenches; and polycrystalline aluminum oxide liners located between a respective metallic liner layer and a respective electrically conductive layer and laterally spaced from each of the pair of backside trenches by a respective lateral offset distance.

According to another aspect of the present disclosure, a method of forming a memory device is provided. An alternating stack of insulating layers and sacrificial material layers is formed over a substrate. Memory stack structures are formed through the alternating stack. A pair of backside trenches is formed through the alternating stack. Backside recesses are formed by removing the sacrificial material layers from the alternating stack. A metallic liner layer is formed in the backside recesses and the pair of backside trenches. Tungsten nucleation layers are formed in portions of the backside recesses that are laterally spaced from the pair of backside trenches by more than a lateral offset distance, while the metallic liner layer is physically exposed in portions of the backside recesses that are laterally offset from the backside trenches by less than the lateral offset distance. Tungsten electrically conductive layers are selectively formed in the backside recesses using the tungsten nucleation layers.

BRIEF DESCRIPTION OF THE DRAWINGS

FIGS. 3A-3H are sequential vertical cross-sectional views of a memory opening within the exemplary structure during various processing steps employed to form a memory stack structure according to an embodiment of the present disclosure.

FIG. 4 is a vertical cross-sectional view of the exemplary structure after formation of a set of stepped surfaces and a retro-stepped dielectric material portion according to an embodiment of the present disclosure.

FIGS. 8A-8J are sequential vertical cross-sectional views of the exemplary structure during formation of electrically conductive layers along the vertical plane denoted by dashed line X-X' shown in FIG. 6B.

FIGS. 12A-12G are sequential vertical cross-sectional views of a first alternative exemplary structure during formation of electrically conductive layers.

FIGS. 15A-15F are sequential vertical cross-sectional views of a fourth alternative exemplary structure during formation of electrically conductive layers.

DETAILED DESCRIPTION

Figure 1:
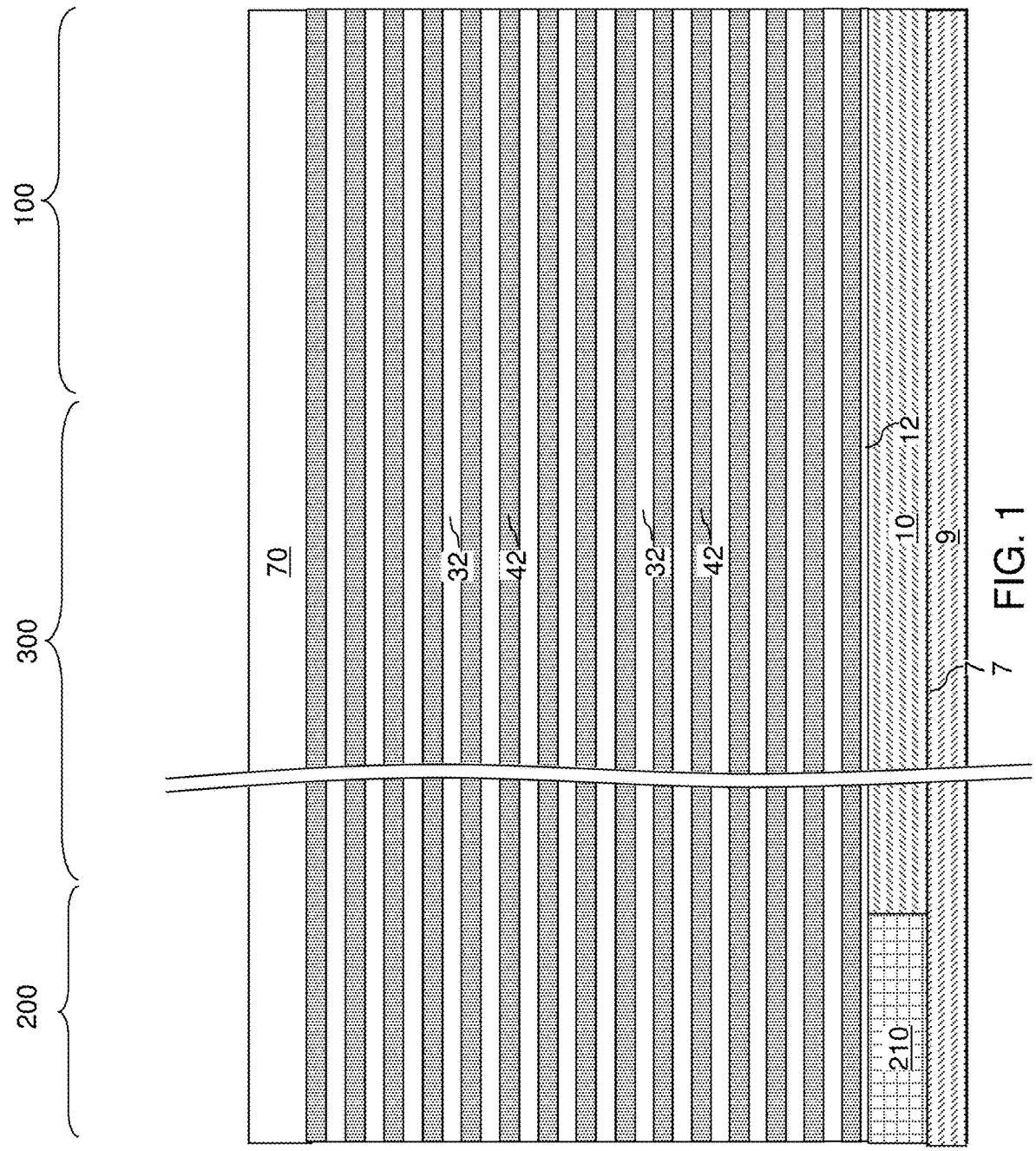
FIG. 1 is a vertical cross-sectional view of an exemplary structure after formation of an alternating stack of insulating layers and sacrificial material layers and memory openings extending through the alternating stack according to an embodiment of the present disclosure.

As discussed above, the present disclosure is directed to a three-dimensional memory device including word lines formed by selective tungsten growth and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/cm. As used herein, an "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to an electrically conductive material including at least one metal element therein. All measurements for electrical conductivities are made at the standard condition.

At least one semiconductor device 210 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. The at least one semiconductor device 210 can include field effect transistors, diodes, capacitors, inductors, or other semiconductor devices known in the art. The least one semiconductor device 210 for the peripheral circuitry can contain a driver circuit for memory devices to be subsequently formed, which can include at least one NAND device. An optional planarization dielectric layer (not expressly shown) can be formed over the at least one semiconductor device 210, and can be planarized to provide a horizontal top surface that is formed above the top surface of the substrate semiconductor layer 9.

An optional semiconductor material layer 10 can be formed on the top surface of the substrate semiconductor layer 9 by deposition of a single crystalline semiconductor material, for example, single crystal silicon by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Optionally, portions of the deposited semiconductor material located above the top surface of the planarization dielectric layer may be removed, for example, by chemical mechanical planarization (CMP). In this case, the semiconductor material layer 10 can have a top surface that is coplanar with the top surface of the planarization dielectric layer.

The region (i.e., area) of the at least one semiconductor device 210 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer. The gate dielectric layer 12 can be, for example, silicon oxide layer. The thickness of the gate dielectric layer 12 can be in a range from 3 nm to 30 nm, although lesser and greater thicknesses can also be employed.

A stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the spacer material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
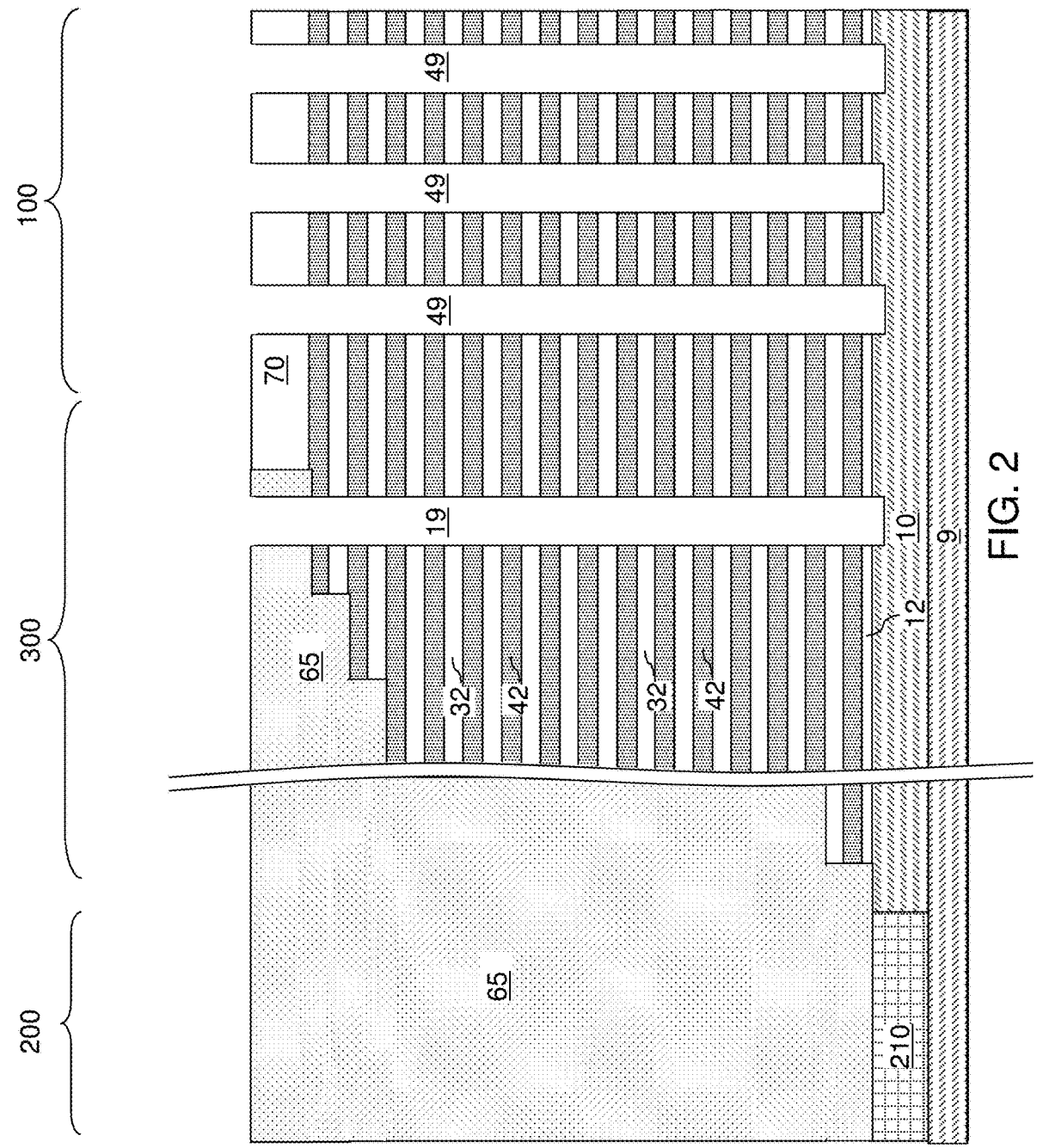
FIG. 2 is a vertical cross-sectional view of an exemplary structure after formation of a retro-stepped dielectric material portion and memory openings extending through the alternating stack according to an embodiment of the present disclosure.

Referring to FIG. 2, a stepped cavity can be formed within the contact region 300. The stepped cavity can have various stepped surfaces such that the horizontal cross-sectional shape of the stepped cavity changes in steps as a function of the vertical distance from the top surface of the substrate (9, 10) in the contact region 300. In one embodiment, the stepped cavity can extend through the entirety of the alternating stack (32, 42) and the insulating cap layer 70 in the contact region 300. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including the alternating stack is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed in the contact region 300 by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating sacrificial masking material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures (not shown) can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

A lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 3A-3H illustrate formation of various layers in a memory opening 49, which is one of the memory openings 49 in the exemplary structure of FIG. 2. The layer deposition occurs simultaneously in each of the other memory openings 49 and in each support opening 19.

Referring to FIG. 3A, a memory opening 49 in the exemplary device structure of FIG. 2 is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 3B, an optional epitaxial channel portion (e.g., an epitaxial pedestal) 11 can be formed at the bottom portion of each memory opening 49 and each support openings 19, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 3C, a stack of layers including a blocking dielectric layer (521, 522), a memory material layer 54, a tunneling dielectric layer 56, and an optional first semiconductor channel layer 601 can be sequentially deposited in the memory openings 49.

The blocking dielectric layer (521, 522) can include a single dielectric material layer or a stack of a plurality of dielectric material layers. For example, the blocking dielectric layer (521, 522) can include a layer stack, from outside to inside, or a first blocking dielectric layer 521 and a second blocking dielectric layer 522. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer (521, 522) can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer (521, 522) includes aluminum oxide. In one embodiment, the blocking dielectric layer (521, 522) can include multiple dielectric metal oxide layers having different material compositions.

Alternatively or additionally, the blocking dielectric layer (521, 522) can include a dielectric semiconductor compound such as silicon oxide, silicon oxynitride, silicon nitride, or a combination thereof. In one embodiment, the blocking dielectric layer (521, 522) can include silicon oxide. In this case, the dielectric semiconductor compound of the blocking dielectric layer (521, 522) can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer (521, 522) can be omitted, and a backside blocking dielectric layer can be formed after formation of backside recesses on surfaces of memory films to be subsequently formed. In one embodiment, the blocking dielectric layer (521, 522) can include a layer stack of a first blocking dielectric layer 521 including a dielectric metal oxide and a second blocking dielectric layer 522 including a semiconductor oxide (such as silicon oxide).

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (521, 522, 54, 56, 601).

Referring to FIG. 3D, the optional first semiconductor channel layer 601, the tunneling dielectric layer 56, the memory material layer 54, the blocking dielectric layer (521, 522) are sequentially anisotropically etched employing at least one anisotropic etch process. The portions of the first semiconductor channel layer 601, the tunneling dielectric layer 56, the memory material layer 54, and the blocking dielectric layer (521, 522) located above the top surface of the insulating cap layer 70 can be removed by the at least one anisotropic etch process. Further, the horizontal portions of the first semiconductor channel layer 601, the tunneling dielectric layer 56, the memory material layer 54, and the blocking dielectric layer (521, 522) at a bottom of each cavity 49' can be removed to form openings in remaining portions thereof. Each of the first semiconductor channel layer 601, the tunneling dielectric layer 56, the memory material layer 54, and the blocking dielectric layer (521, 522) can be etched by anisotropic etch process.

Each remaining portion of the first semiconductor channel layer 601 can have a tubular configuration. The memory material layer 54 can comprise a charge trapping material or a floating gate material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the memory material layer 54, and the blocking dielectric layer (521, 522). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the memory material layer 54. A set of a blocking dielectric layer (521, 522), a memory material layer 54, and a tunneling dielectric layer 56 in a memory opening 49 constitutes a memory film 50, which includes a plurality of charge storage regions (as embodied as the memory material layer 54) that are insulated from surrounding materials by the blocking dielectric layer (521, 522) and the tunneling dielectric layer 56. In one embodiment, the first semiconductor channel layer 601, the tunneling dielectric layer 56, the memory material layer 54, and the blocking dielectric layer (521, 522) can have vertically coincident sidewalls.

Referring to FIG. 3E, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 3F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 3G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a memory material layer 54, and laterally surrounds a portion of the vertical semiconductor channel 60. Each adjoining set of a blocking dielectric layer (521, 522), a memory material layer 54, and a tunneling dielectric layer 56 collectively constitute a memory film 50, which can store electrical charges with a macroscopic retention time. In some embodiments, a blocking dielectric layer (521, 522) may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 3H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer (521, 522).

Referring to FIG. 4, the exemplary structure is illustrated after formation of memory opening fill structures (11, 55, 62, 63) and support pillar structure 155 within the memory openings 49 and the support openings 19, respectively. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial channel portion 11 (if present), a memory film 50, a vertical semiconductor channel 60, a dielectric core 62, and a drain region 63 within each support opening 19 fills the respective support openings 19, and constitutes a support pillar structure 155. An instance of a memory opening fill structure (11, 55, 62, 63) can be formed within each memory opening 49 of the structure of FIG. 2. An instance of the support pillar structure 155 can be formed within each support opening 19 of the structure of FIG. 2. While each drain region 63 in the memory opening fill structure electrically contacts a bit line which is formed at a later step, each drain region 63 in the support pillar structure 155 is a dummy drain region which is not electrically connected to a bit line.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer (521, 522). While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 5:
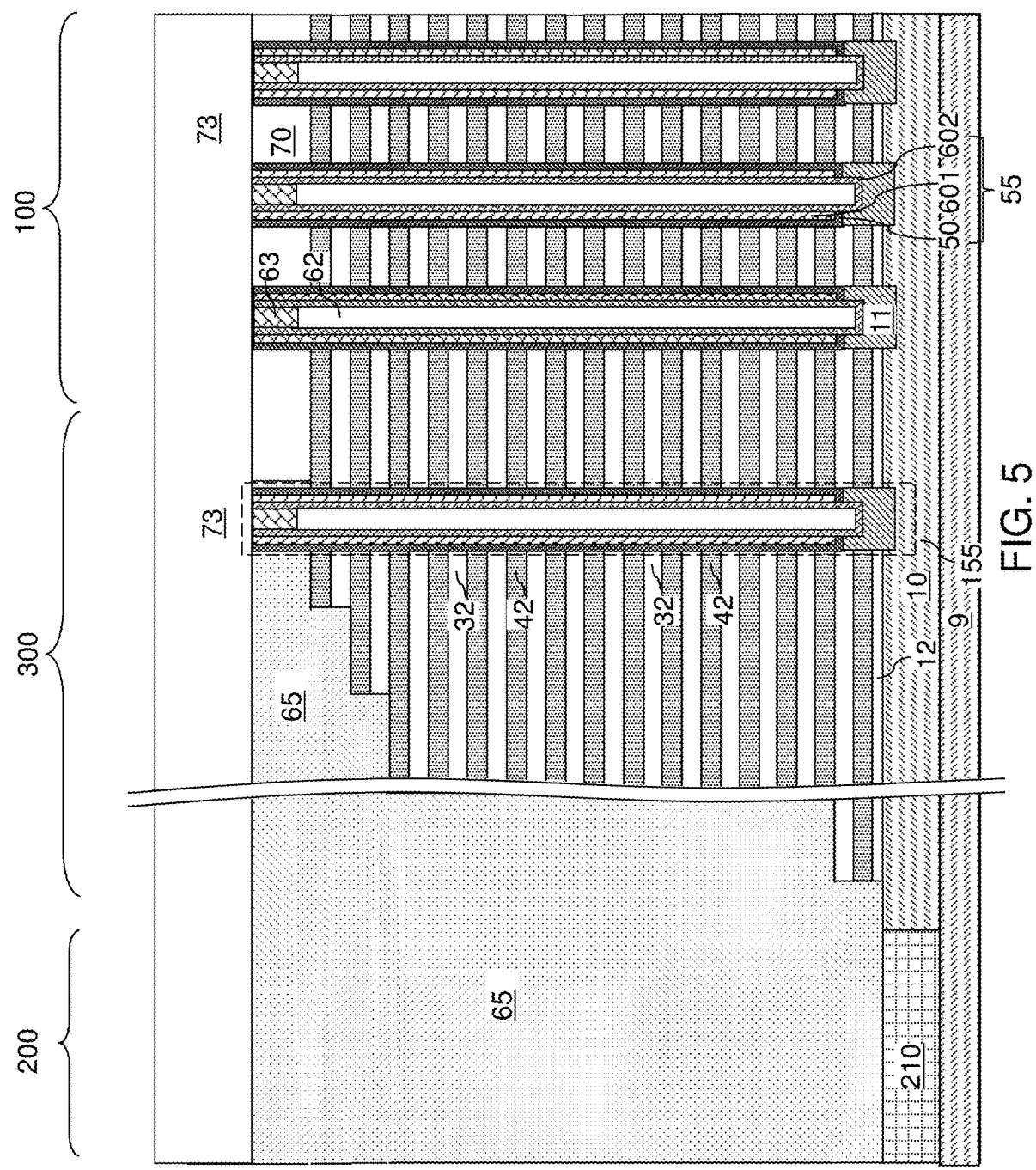
FIG. 5 is a vertical cross-sectional view of the exemplary structure after formation of dielectric pillar structures according to an embodiment of the present disclosure.

Referring to FIG. 5, a contact level dielectric layer 73 can be formed over the alternating stack (32, 42) of insulating layer 32 and sacrificial material layers 42, and over the memory stack structures 55 and the support pillar structures 155. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

Figure 6A:
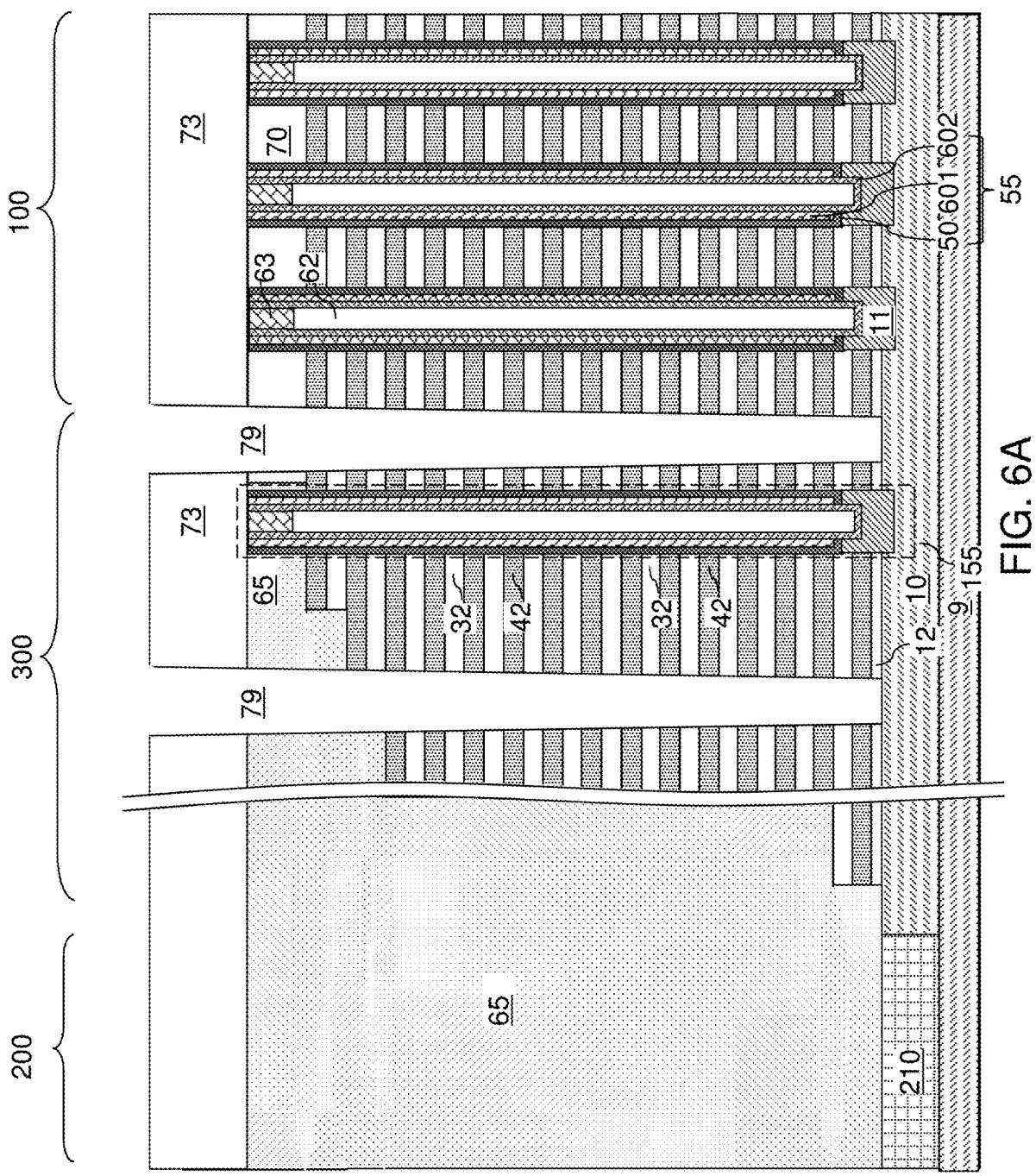
FIG. 6A is a vertical cross-sectional view of the exemplary structure after formation of backside trenches according to an embodiment of the present disclosure.
Figure 6B:
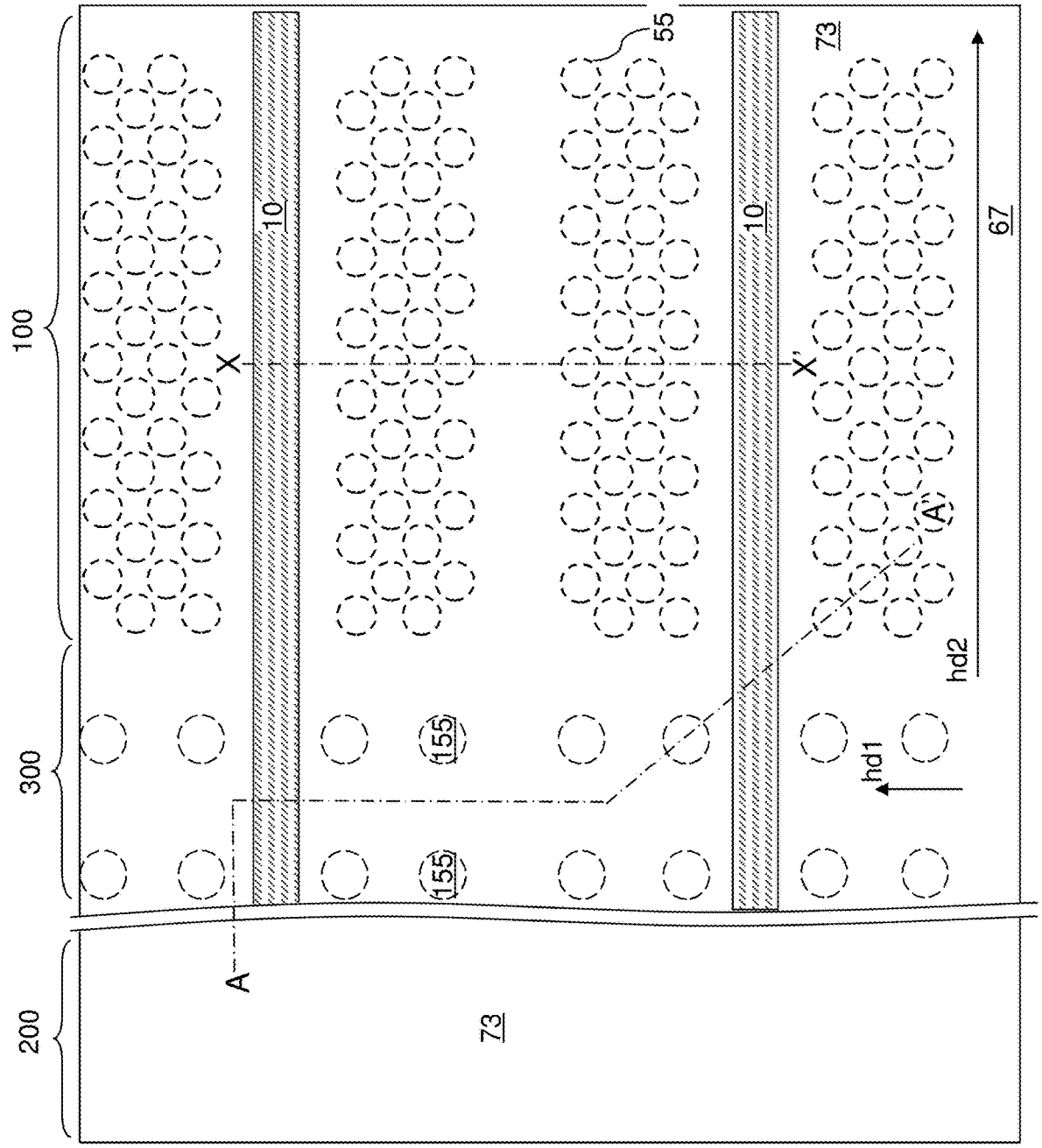
FIG. 6B is a see-through top-down view of the exemplary structure of FIG. 6A. Dashed line(s) A-A' show the vertical planes of the vertical cross-sectional view of FIG. 6A.

Referring to FIGS. 6A and 6B, a photoresist layer (not shown) can be applied over the alternating stack (32, 42), and is lithographically patterned to form openings in areas between clusters of memory stack structures 55. Locations of the memory stack structures 55 and support pillar structures 155 are marked with dotted lines in FIG. 6B. The pattern in the photoresist layer can be transferred through the alternating stack (32, 42) and/or the retro-stepped dielectric material portion 65 employing an anisotropic etch to form the backside trenches 79, which vertically extend at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing. The backside trenches 79 are laterally spaced apart from one another along a first horizontal direction hd1. Each of the backside trenches 79 can laterally extend along a second horizontal direction hd2, which can be perpendicular to the first horizontal direction hd1. Each of the backside trenches 79 can have a uniform width along the first horizontal direction hd1, which is invariant under translation along the second horizontal direction hd2.

Figure 7:
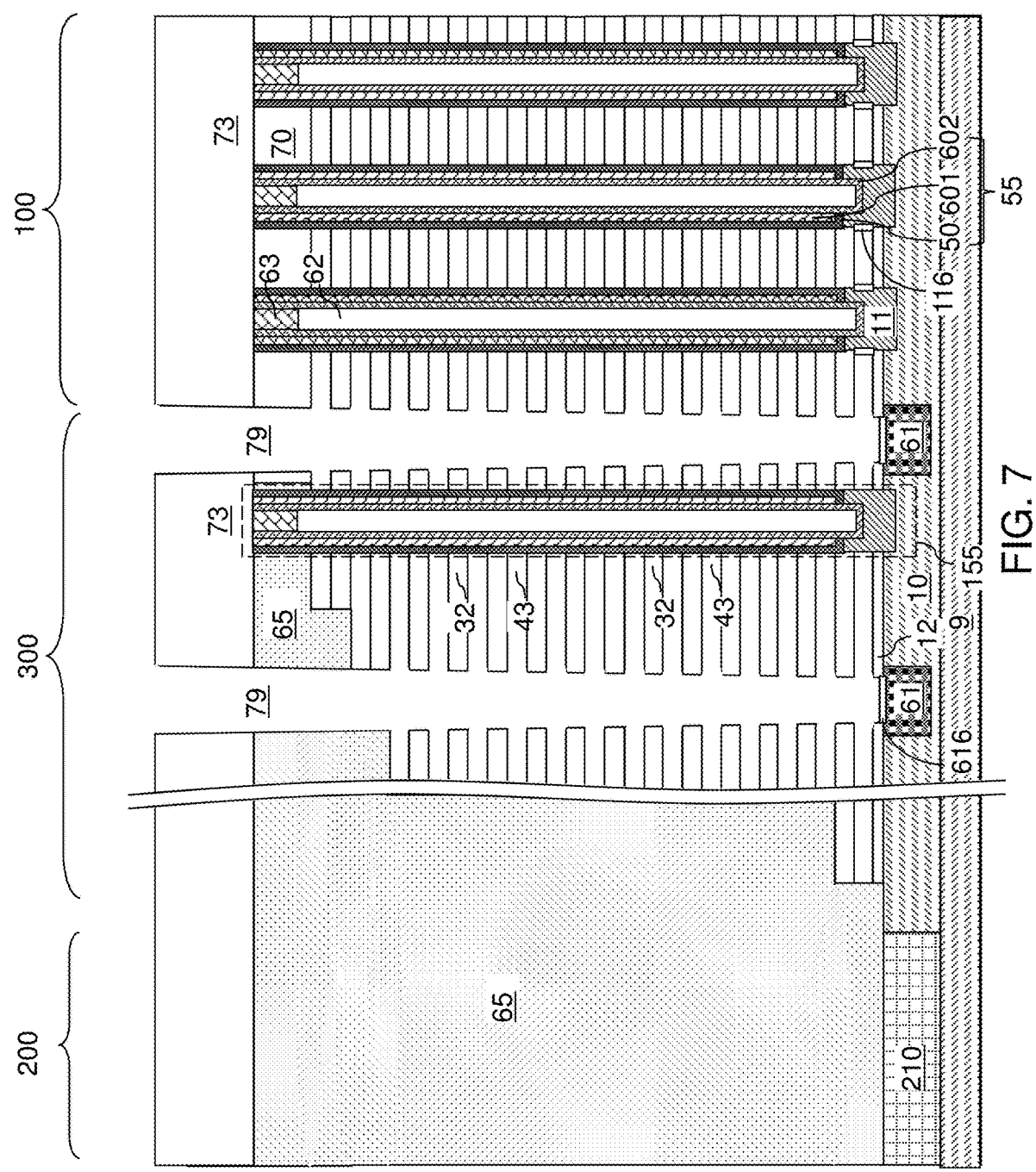
FIG. 7 is a vertical cross-sectional view of the exemplary structure after formation of backside recesses according to an embodiment of the present disclosure.

Referring to FIG. 7, a source region 61 can be formed at a surface portion of the semiconductor material layer 10 under each backside trench 79 by implantation of electrical dopants into physically exposed surface portions of the semiconductor material layer 10. Each source region 61 is formed in a surface portion of the substrate (9, 10) that underlies a respective backside trench 79. The conductivity type of the source region 61 can be the opposite of the conductivity type of the semiconductor material layer 10. If the semiconductor material layer has a doping of a first conductivity type, the source regions 61 can have a doping of a second conductivity type, which is the opposite of the first conductivity type. For example, if the first conductivity type is p-type, the second conductivity type can be n-type, and vice versa. Alternatively, formation of the source regions 61 can be performed at a later processing step.

Figure 8A:
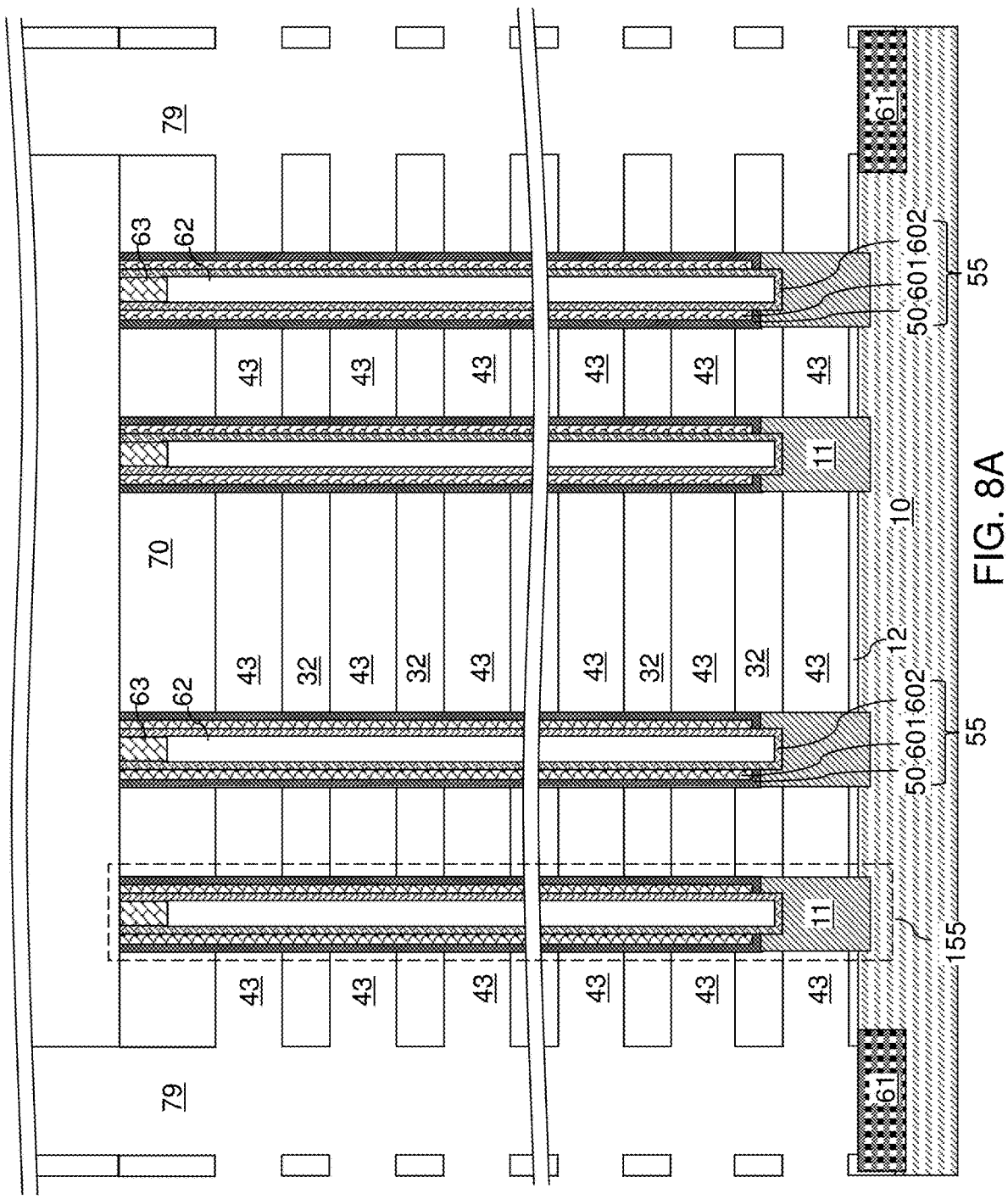

An etchant that selectively etches the second material of the sacrificial material layers 42 with respect to the first material of the insulating layers 32 can be introduced into the backside trenches 79, for example, employing an etch process. FIG. 8A illustrates another view of the exemplary structure of FIG. 7 along a vertical plane along line X-X' illustrated in FIG. 6B.

Referring collectively to FIGS. 7 and 8A, backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 155, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 8B:
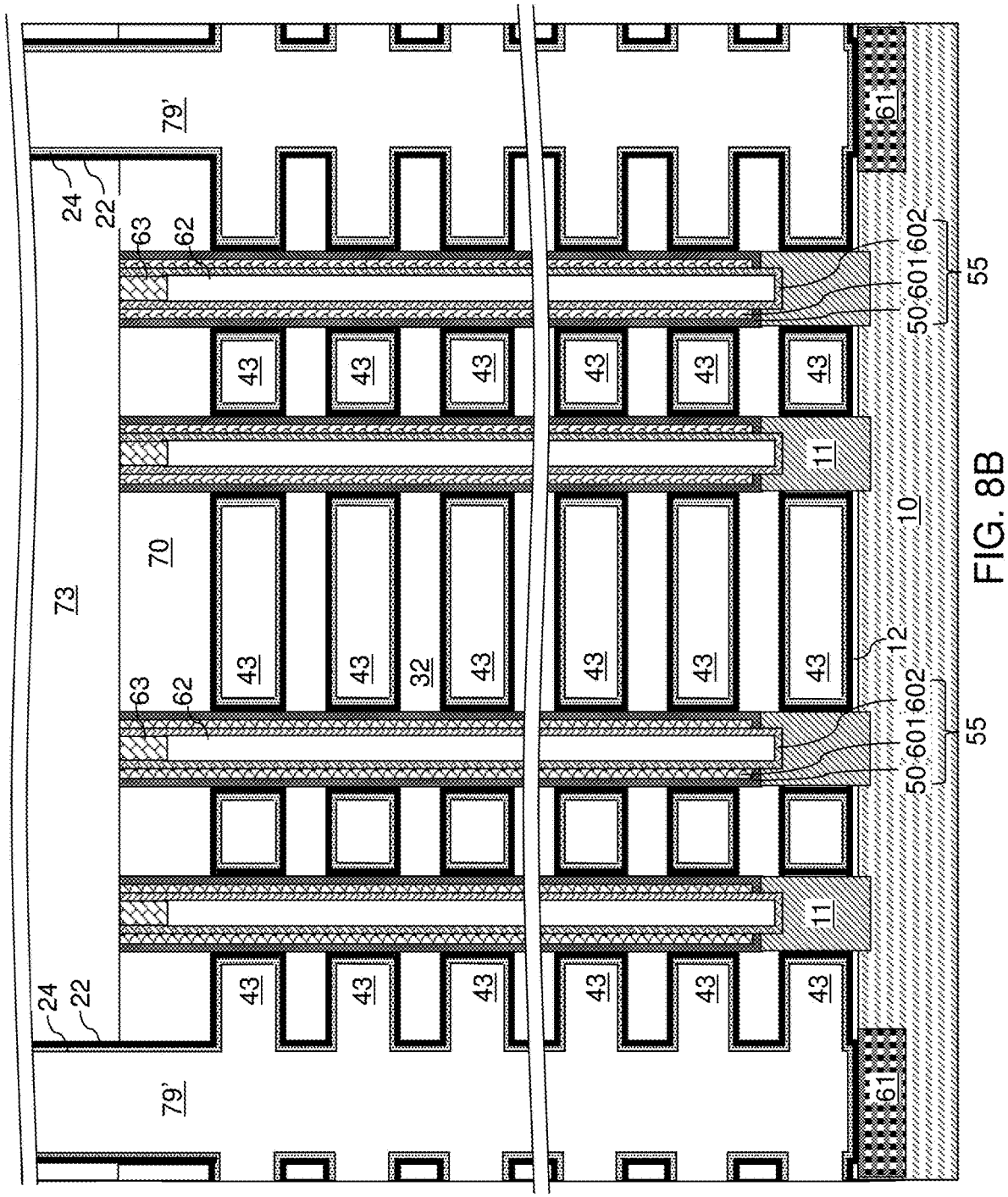

Referring to FIG. 8B, an optional backside blocking dielectric layer 22 can be formed in the backside recesses 43, on the sidewalls of the backside trenches 79, and on the physically exposed surfaces of the memory films 50 (which are outermost layers of the memory stack structures 55 and support pillar structures 155). The backside blocking dielectric layer 22 can be formed as a conformal material layer by a conformal deposition process such as atomic layer deposition (ALD) or chemical vapor deposition (CVD). In one embodiment, the backside blocking dielectric layer 22 can include a dielectric metal oxide such as aluminum oxide. The thickness of the backside blocking dielectric layer 22 can be in a range from 1 nm to 5 nm, although lesser and greater thicknesses can also be employed. The backside blocking dielectric layer 22 can continuously extend from the bottommost insulating layer 32 among the insulating layers 32 to the topmost insulating layer 32 among the insulating layers 32. In one embodiment, the backside blocking dielectric layer 22 can contact top surfaces of the source regions 61 or portions of the top surface of the semiconductor material layer 10 underlying the backside cavities 79' (which are unfilled volumes of the backside trenches 79).

A metallic liner layer 24 can be deposited directly on the backside blocking dielectric layer 22. In case the backside blocking dielectric layer 22 is not employed, the metallic liner layer 24 can be deposited directly on the sidewalls of the backside trenches 79, and directly on the physically exposed surfaces of the memory films 50. The metallic liner layer 24 can be formed as a conformal material layer by a conformal deposition process such as atomic layer deposition (ALD) or chemical vapor deposition (CVD). In one embodiment, the metallic liner layer 24 can include a conductive metal nitride such as TiN, TaN, WN, an alloy thereof, or a layer stack thereof. In one embodiment, the metallic liner layer 24 can be a TiN layer. The thickness of the metallic liner layer 24 can be in a range from 1 nm to 5 nm, although lesser and greater thicknesses can also be employed. The metallic liner layer 24 can continuously extend from the bottommost insulating layer 32 among the insulating layers 32 to the topmost insulating layer 32 among the insulating layers 32. In one embodiment, the metallic liner layer 24 can be formed on all physically exposed surfaces of the backside blocking dielectric layer 22. The volumes of the backside recesses 43 decrease due to the deposited materials of the backside blocking dielectric layer 22 and the metallic liner layer 24. For each neighboring pair of backside trenches 79, the backside blocking dielectric layer 22 and the metallic liner layer 24 can be deposited on the sidewalls of the pair of backside trenches 79 and within each backside recess 43 therebetween and on each physically exposed sidewalls of the memory films 50 therebetween.

Figure 8C:
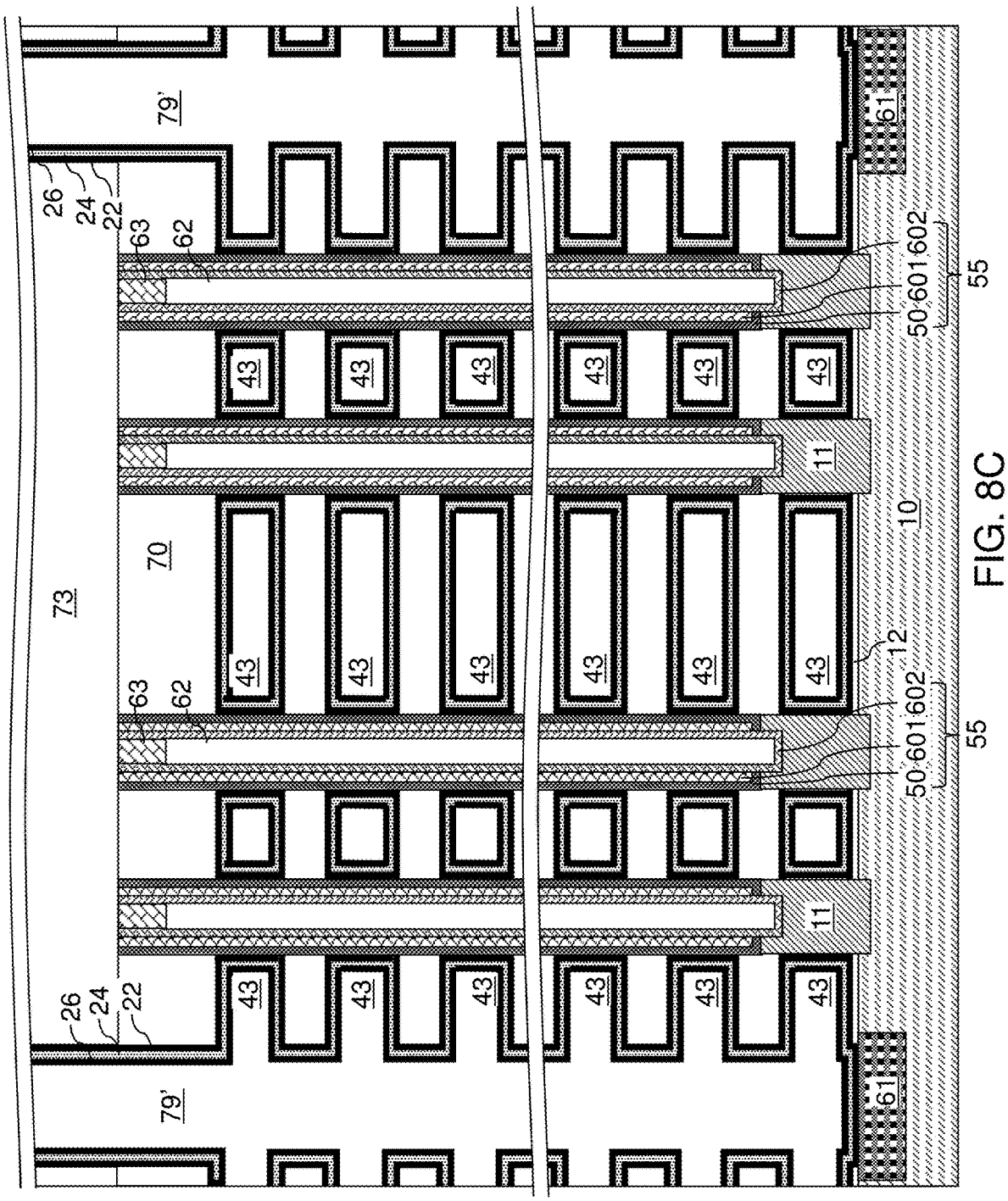

Referring to FIG. 8C, a tungsten nucleation layer can be deposited on the metallic liner layer 24. In a first embodiment, the tungsten nucleation layer precursor comprises an amorphous aluminum oxide layer 26 which is deposited on the metallic liner layer 24. The amorphous aluminum oxide layer 26 can be formed as a conformal material layer by a conformal deposition process such as atomic layer deposition (ALD) or chemical vapor deposition (CVD). The thickness of the amorphous aluminum oxide layer 26 can be in a range from 1 nm to 3 nm, although lesser and greater thicknesses can also be employed. The amorphous aluminum oxide layer 26 can continuously extend from the bottommost insulating layer 32 among the insulating layers 32 to the topmost insulating layer 32 among the insulating layers 32. In one embodiment, the amorphous aluminum oxide layer 26 can be formed on all physically exposed surface of a metallic liner layer 24.

Figure 8D:
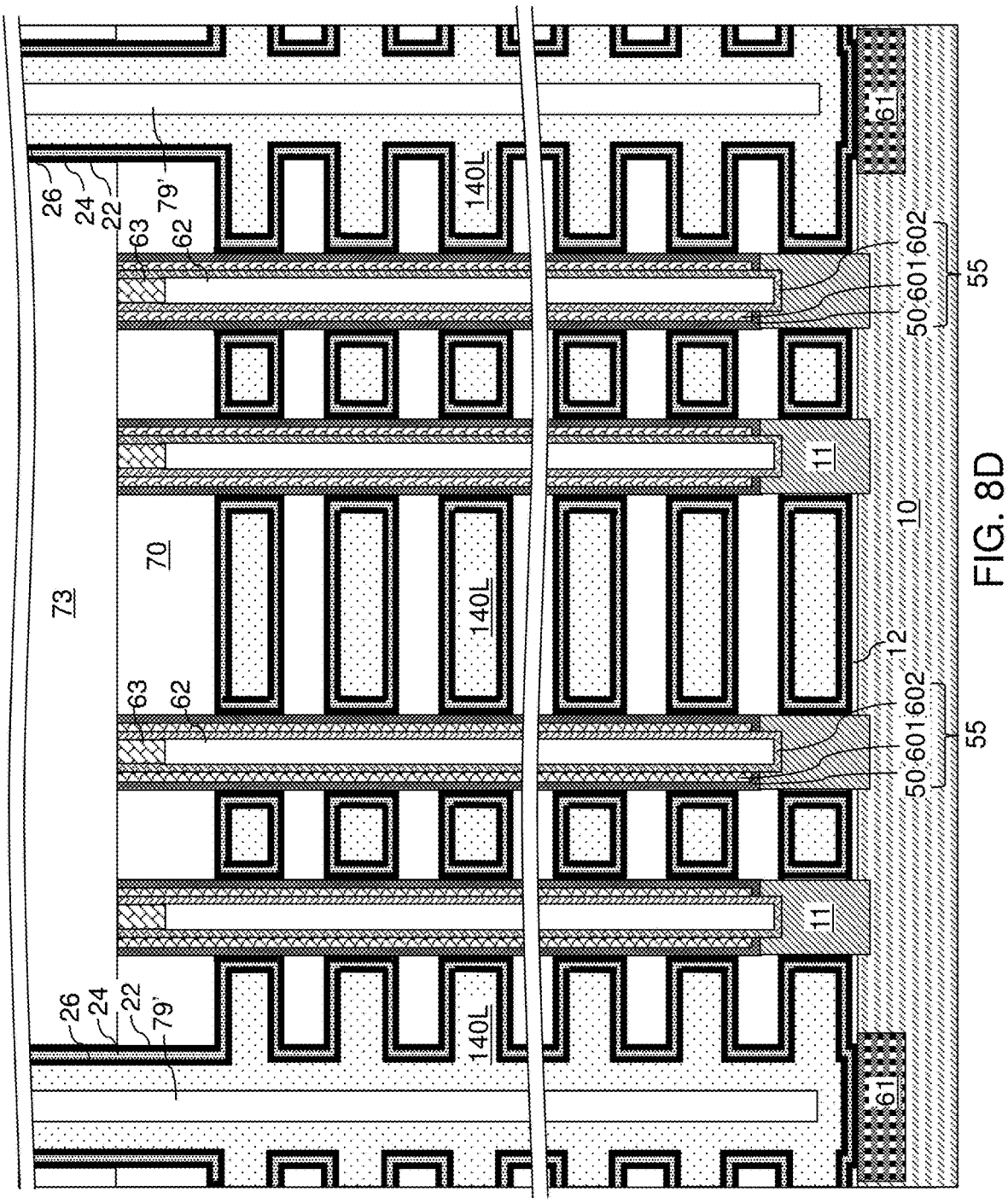

Referring to FIG. 8D, a sacrificial masking material layer 140L is deposited in the backside recesses 43 and at peripheral portions of each backside trench 79. The thickness of the sacrificial masking material layer 140L (as measured on the sidewalls of the backside trenches 79) can be selected such that sacrificial masking material layer 140 fills each of the backside recesses 43, and only partially fills each of the backside trenches 79. Thus, a backside cavity 79' laterally extending along the second horizontal direction hd2 can be present within each backside trench 79. In other words, the sacrificial masking material layer 140L fills only peripheral portions of the backside trenches 79, while a backside cavity 79' is present with each unfilled volume of the backside trenches 79.

The sacrificial masking material layer 140L includes a fill material that can be subsequently removed selective to the amorphous aluminum oxide layer 26, or alternatively, selective to the metallic liner layer 24. For example, the sacrificial masking material layer 140L can include a doped silicate glass (such as borophosphosilicate glass or borosilicate glass), a low temperature oxide (which is a silicon oxide material deposited by a process such as ALD, at a low temperature and has a high hydrogen content and high etch rate in hydrofluoric acid), a semiconductor material (such as amorphous silicon), or a carbon-containing material (such as amorphous carbon). In one embodiment, the sacrificial masking material layer 140L can include undoped silicate glass or doped silicate glass, i.e., undoped or doped silicon oxide. The sacrificial masking material layer 140L is a single continuous material layer.

Figure 8E:
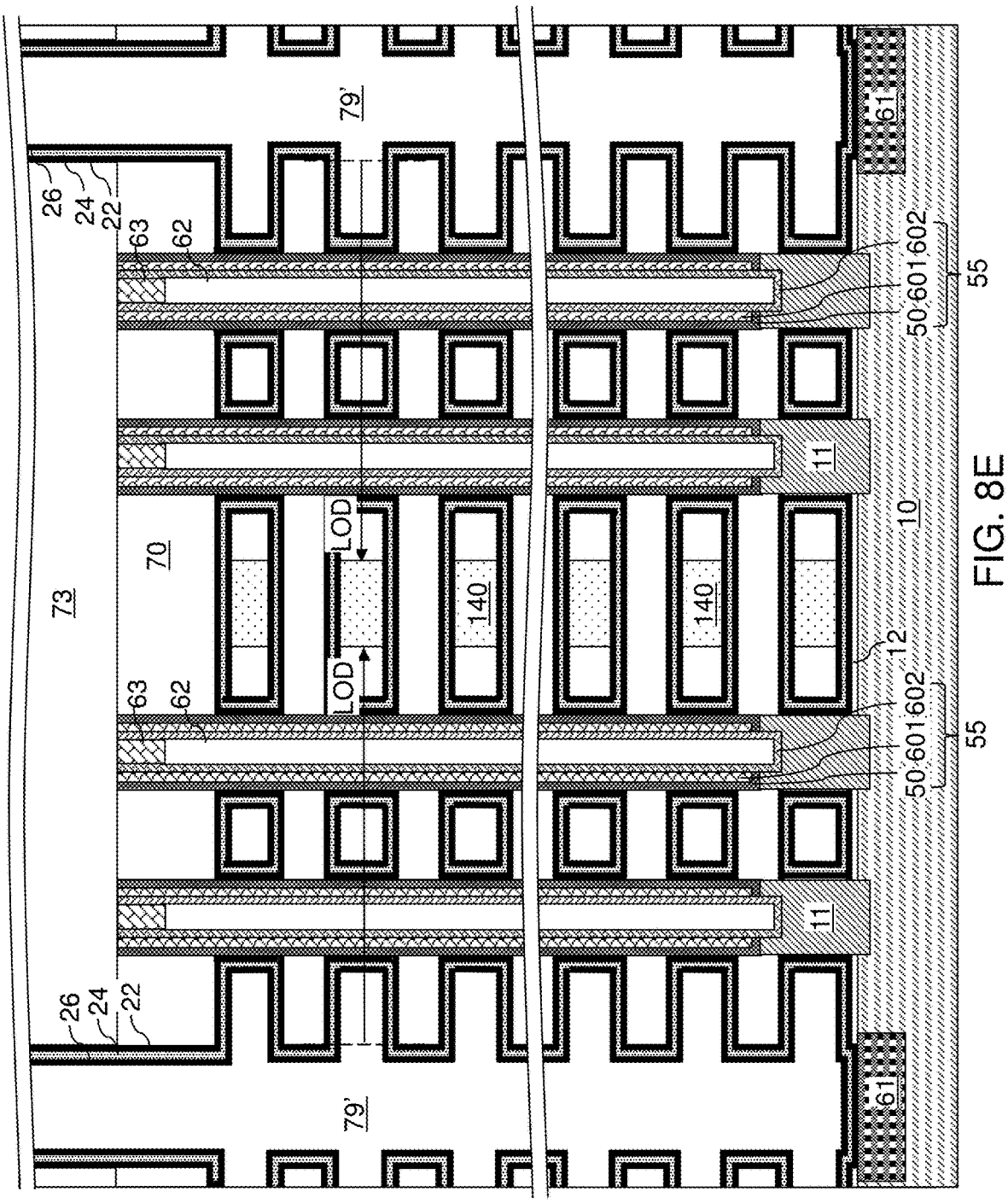

Referring to FIG. 8E, the sacrificial masking material layer 140L is removed from inside the backside trenches 79 and proximal portions of the backside recesses 43 that are within a lateral offset distance LOD from sidewalls of the backside trenches 79. As used herein, "proximal portions" of the backside recesses 43 refer to portions of the backside recesses 43 that are proximal to the backside trenches 79, and "distal portions" of the backside recesses refer to portions of the backside recesses 43 that are distal from the backside trenches 79. In one embodiment, an isotropic etch process can be employed to isotropically etch the portions of the sacrificial masking material layer 140L from inside the backside trenches 79 and from the proximal portions of the backside recesses 43. The sacrificial masking material of the sacrificial masking material layer 140L is removed from inside the backside trenches 79, and then is laterally recessed from the proximal portions of the backside recesses 43 during the anisotropic etch process.

A distal portion of the sacrificial masking material layer 140L can remain within each backside recess 43 between a pair of backside trenches 79. Each remaining distal portion of the sacrificial masking material layer 140L is herein referred to as a sacrificial masking material portion 140. The sacrificial masking material portions 140 are present within volumes of the backside recesses 43 that are laterally spaced from the sidewalls of the backside trenches 79 by more than the lateral offset distance LOD. The sidewalls of each sacrificial masking material portion 140 can be laterally spaced from a most proximal sidewall of the backside trench 79 by the lateral offset distance LOD. Thus, the sacrificial masking material portions 140 are formed over portions of the metallic liner layer 24 and amorphous aluminum oxide layer 26 that are laterally spaced from a nearest pair of backside trenches 79 by the lateral offset distance LOD. In one embodiment, a sacrificial masking material portion 140 can be present between each vertically neighboring pair of insulating layers 32 in regions that are laterally spaced from the backside trenches 79 by more than the lateral offset distance LOD. The lateral offset distance LOD is selected to be less than one half of the lateral separation distance between each neighboring pair of backside trenches 79.

In one embodiment, the duration of the isotropic etch process can be selected such that the sacrificial masking material layer 140L is removed from around each memory stack structure 55. In other words, the sacrificial masking material portions 140 do not laterally surround any of the memory stack structures 55. Thus, the sacrificial masking material layer 140 in the backside recesses 43 laterally surrounds the memory stack structures 55 prior to the isotropic etch process, and the sacrificial masking material portions 140 provided after the isotropic etch process does not laterally surround any of the memory stack structures 55.

In one embodiment, the isotropic etch process that etches the sacrificial masking material can be selective to at least one layer selected from the amorphous aluminum oxide layer 26 and the metallic liner layer 24.

Figure 8F:
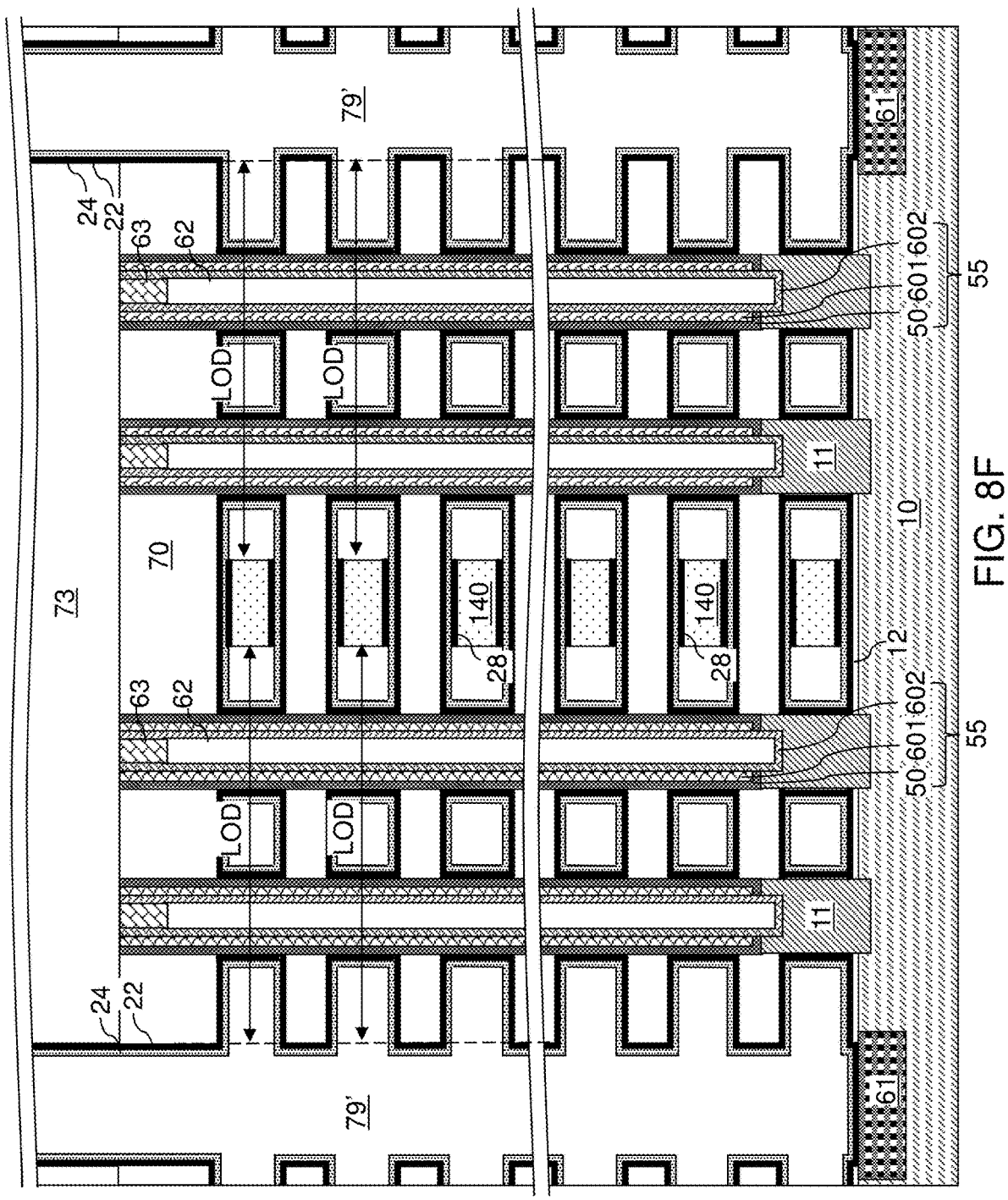

Referring to FIG. 8F, in case the isotropic etch process that etches the sacrificial masking material can be selective to the amorphous aluminum oxide layer 26, portions of the amorphous aluminum oxide layer 26 that are not covered by the sacrificial masking material portions 140 can be removed by an isotropic etch process employing an etchant. In other words, physically exposed portions of the amorphous aluminum oxide layer 26 can be removed by the isotropic etch process, which can be, for example, by a wet etch. For example, a wet etch employing a 1:1:3 volume mixture of ammonium hydroxide, water, and hydrogen peroxide or phosphoric acid including chromium oxide can be employed to etch the portions of the amorphous aluminum oxide layer 26 that are not covered by the sacrificial masking material portions 140.

In case the isotropic etch process that etches the sacrificial masking material at the processing step of FIG. 8E also etches the amorphous aluminum oxide layer 26, and is selective to the metallic liner layer 24, a separate isotropic etch process for etching the amorphous aluminum oxide layer 26 is not necessary.

After removal of the unmasked portions of the amorphous aluminum oxide layer 26, an anneal process can be performed to crystallize the remaining portions of the amorphous aluminum oxide layer 26 overlying, or underlying, the sacrificial masking material portions into polycrystalline aluminum oxide liners 28. In one embodiment, each polycrystalline aluminum oxide liner 28 can be formed in a tubular configuration including a horizontal top portion, a horizontal bottom portion, and a pair of sidewall portions adjoined to the horizontal top portion and the horizontal bottom portion. In case the backside blocking dielectric layer 22 as deposited includes amorphous aluminum oxide, the amorphous aluminum oxide material of the backside blocking dielectric layer 22 can be converted into crystalline aluminum oxide material.

The polycrystalline aluminum oxide liners 28 are formed in the distal portions of the backside recesses 43, i.e., in portions of the backside recesses 43 that are laterally spaced from a neighboring pair of backside trenches 79 by more than the lateral offset distance LSD, while the metallic liner layer 24 is physically exposed in the proximal portions of the backside recesses 43, i.e., in the portions of the backside recesses 43 that are laterally offset from the backside trenches 79 by less than the lateral offset distance LOD.

Referring to FIG. 8G, the sacrificial masking material portions 140 can be removed from inside the backside recesses 43, for example, by a wet etch that is selective to the polycrystalline aluminum oxide liners 28 and the metallic liner layer 24. Surfaces of the polycrystalline aluminum oxide liners 28 are physically exposed in the distal portions of the backside recesses 43, i.e., in portions of the lateral recesses 43 that are farther away from the backside trenches 79 than the lateral offset distance LOD. Surfaces of the metallic liner layer 24 are physically exposed in the proximal portions of the lateral recesses 43, i.e., in the portions of the lateral recesses 43 that are separated from the backside trenches 799 by a lateral distance less than the lateral offset distance LOD.

Figure 8H:
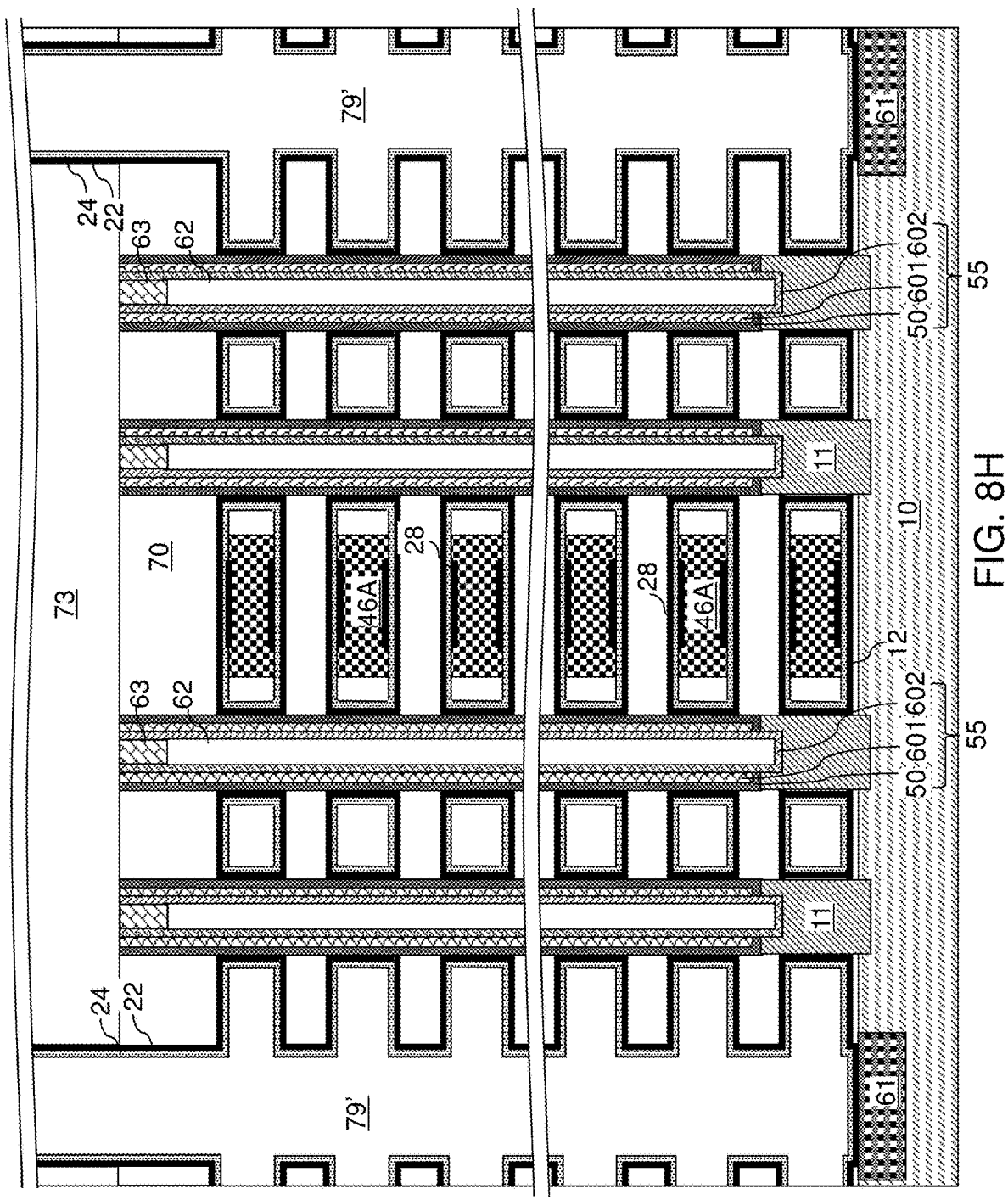

Referring to FIG. 8H, a tungsten material portion 46A can be selectively formed (i.e., selectively deposited) on each of the tungsten nucleation layers, such as the polycrystalline aluminum oxide liners 28 employing a selective deposition process, such as selective ALD. The deposition may include a nucleation process that nucleates a tungsten-containing material on the polycrystalline aluminum oxide layers 28 with a lesser incubation time than on the metallic liner layer 24. In one embodiment, reduction of $WF_6$ or other halogen-containing tungsten precursor can be used to deposit tungsten. The polycrystalline aluminum oxide surfaces function as effective nucleating surfaces during the reduction of the tungsten precursor with hydrogen or the hydride gas. In one embodiment, low fluorine tungsten (LFW) ALD deposition process may be used. This ALD process include an initial silicon containing material (e.g., silane) nucleation cycle followed by LFW ALD cycles to deposit tungsten. Other suitable CVD or ALD processes may also be used, such as an ALD process that alternates tungsten precursor (e.g., tungsten hexafluoride) and silicon containing material (e.g., silane or disilane) cycles. Further, because nucleation of tungsten occurs faster on surfaces of the polycrystalline aluminum oxide liners 28 than on the surface of the metallic liner layer 24, growth of tungsten proceeds from the surfaces of the polycrystalline aluminum oxide liners 28 before proceeding from the surfaces of the metallic liner layer 24.

In one embodiment, nucleation and growth of tungsten on the metallic liner layer 24 can be suppressed by repeating cycles of a tungsten deposition process and an isotropic tungsten etch process. The duration of the isotropic tungsten etch process is selected to remove all nucleated tungsten material from the metallic liner layer 24, while not removing all of the deposited tungsten material from the polycrystalline aluminum oxide liners 28 because the initial tungsten deposit is thicker on the aluminum oxide liners 28 than on the metallic liner layer 24. With each cycle of the tungsten deposition process and the isotropic tungsten etch process, tungsten accumulates on the polycrystalline aluminum oxide liners 28 and does not accumulate on the metallic liner layer 24. At the end of the cycles of the tungsten deposition process and the isotropic tungsten etch process, the tungsten material portions 46A can fill the entire volumes of the distal portions of the backside recesses 43, and can fill adjacent regions of the proximal portions of the backside recesses 43 without laterally surrounding any of the memory stack structures 55. In one embodiment, at least a portion of the surfaces of the metallic liner layer 24 can be physically exposed within regions of the proximal portions of the backside recesses 43.

Referring to FIG. 8I, an electrically conductive material can be deposited directly on the metallic liner layer 24 and the tungsten material portions 46A by a conformal deposition method such as chemical vapor deposition or atomic layer deposition. Electrically conductive material portions 46B are formed within the remaining volumes of the backside recesses 43, and a continuous metallic material layer 46L can be formed at peripheral portions of the backside trenches 79 and over the contact level dielectric layer 73. The electrically conductive material can be, for example, tungsten, cobalt, copper, ruthenium, molybdenum, titanium, tantalum, tungsten nitride, titanium nitride, tantalum nitride, and combinations thereof.

Each of the electrically conductive material portions 46B is laterally spaced from the polycrystalline aluminum oxide liner 28 located at the same level, and can be free of silicon and boron, and can be formed between the tungsten material portion 46A and a neighboring pair of backside trenches 79. The tungsten material portions 46A do not laterally surround any of the memory stack structures 55. The electrically conductive material portions 46B laterally surround the memory stack structures 55.

Each adjoining set including a tungsten material portion 46A and a pair of electrically conductive material portions 46B located at the same level and between a pair of backside trenches 79 constitutes an electrically conductive layer 46. Each electrically conductive layer 46 is formed in a respective backside recess 43, and directly on a respective polycrystalline aluminum oxide liner 28.

A plurality of electrically conductive layers 46 can be formed in the plurality of backside recesses 43. The continuous metallic material layer 46L can be formed at the same time as the electrically conductive material portions 46B over the sidewalls of each backside trench 79 and directly on vertical portions of the metallic liner layer 24. A backside cavity 79' is present in the portion of each backside trench 79 that is not filled with the backside blocking dielectric layer and the continuous metallic material layer 46L.

Figure 8J:
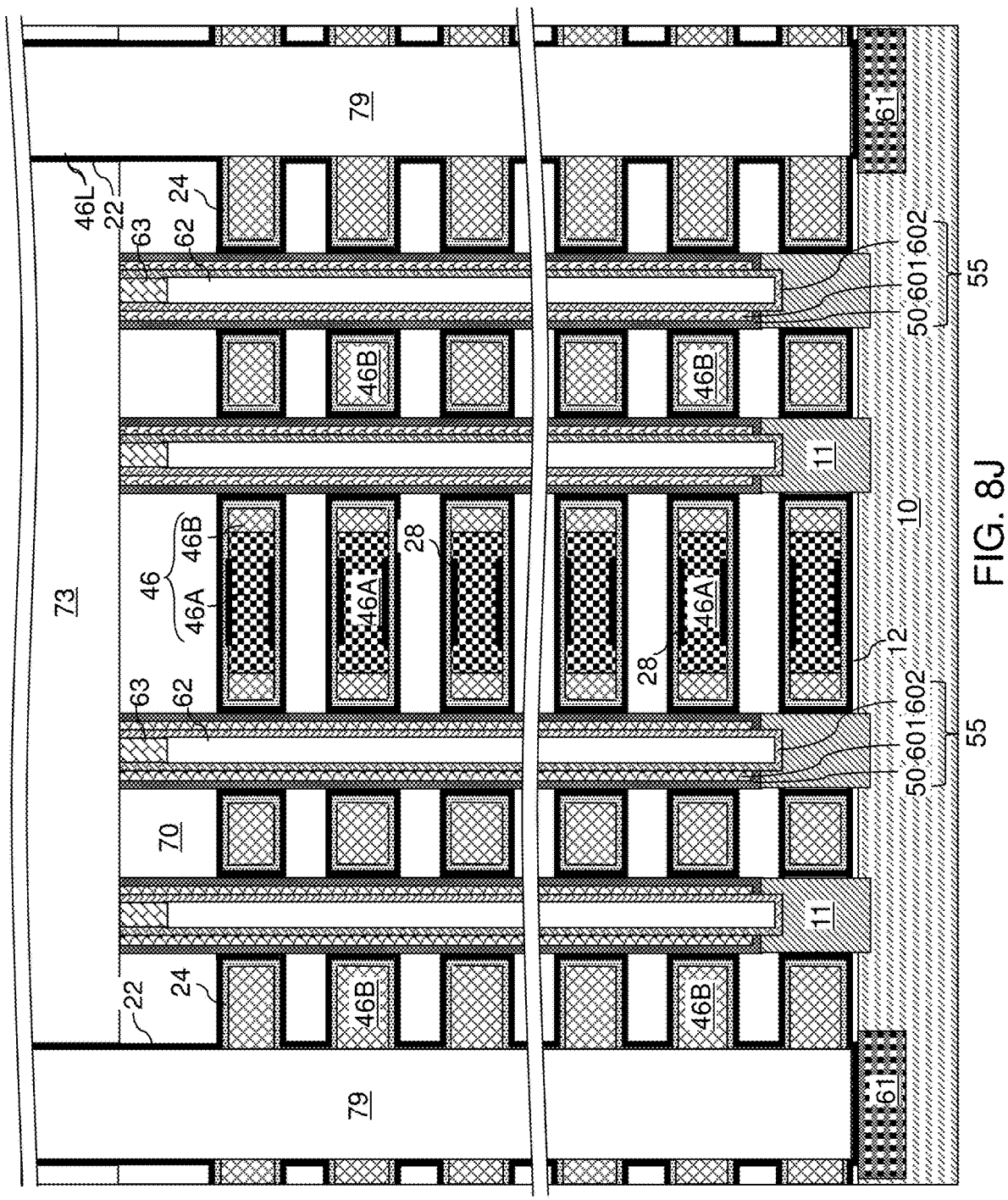
Figure 9:
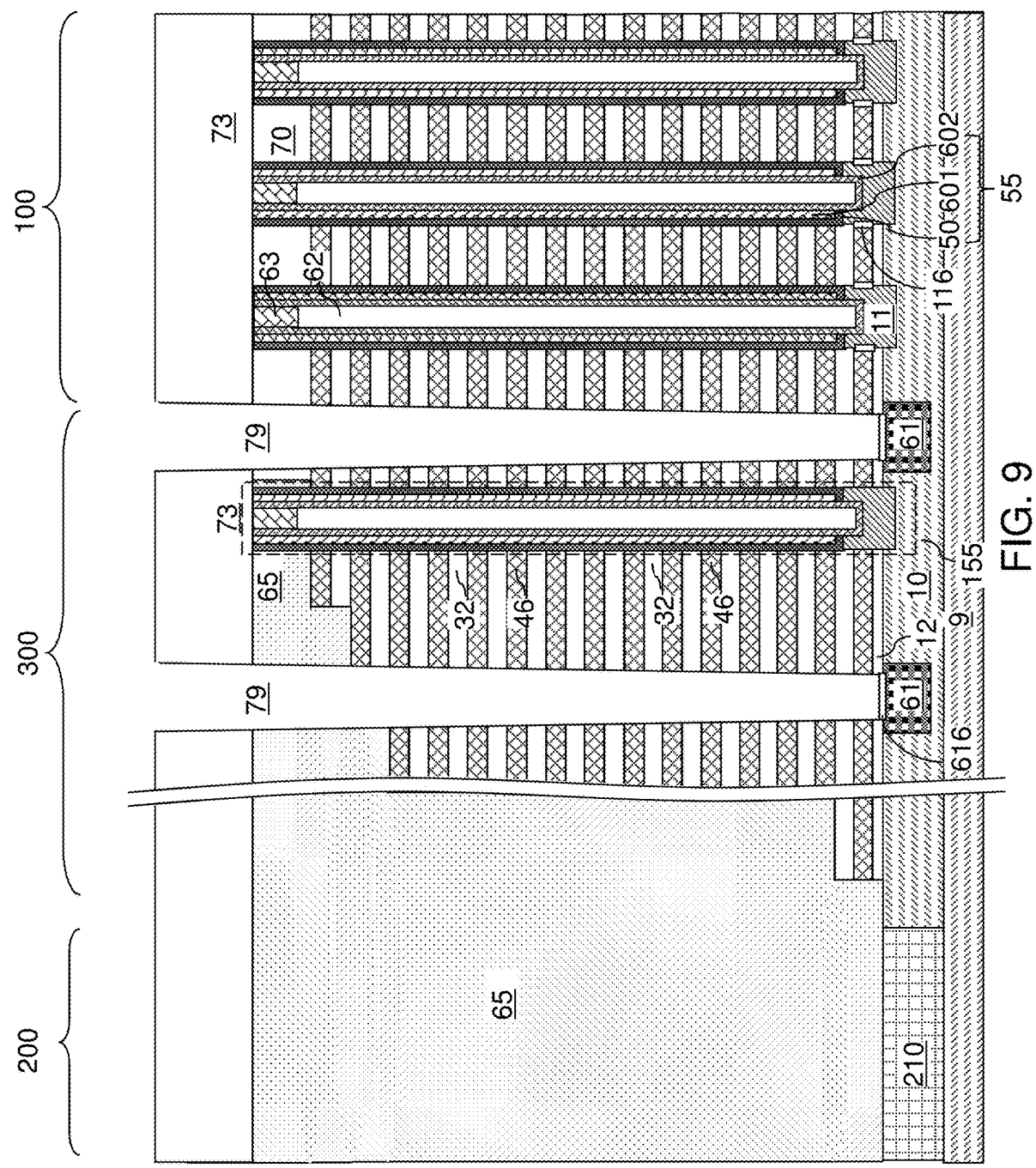
FIG. 9 is a vertical cross-sectional view of the exemplary structure after formation of electrically conductive layers according to an embodiment of the present disclosure.

Referring to FIGS. 8J and 9, the deposited metallic material of the continuous metallic material layer 46L and underlying portions of the metallic liner layer 24 are etched back from within each backside trench 79 and from above the contact level dielectric layer 73, for example, by an isotropic wet etch, an anisotropic dry etch, or a combination thereof. The electrically conductive layers 46, which are located outside the backside trenches 79, remain substantially intact during removal of the continuous metallic material layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer (e.g., continuous metallic material layer) 46L can be selective to the material of the backside blocking dielectric layer 22. In this case, the backside blocking dielectric layer 22 can remain on the sidewalls of the backside trenches 79 and at the bottom of each backside trench 79.

In another embodiment, the removal of the continuous electrically conductive material layer 46L may not be selective to the material of the backside blocking dielectric layer 22 or, the backside blocking dielectric layer 22 may not be employed. In this case, sidewalls of the insulating layers 32 can be physically exposed to the backside trenches 79.

Figure 12A:
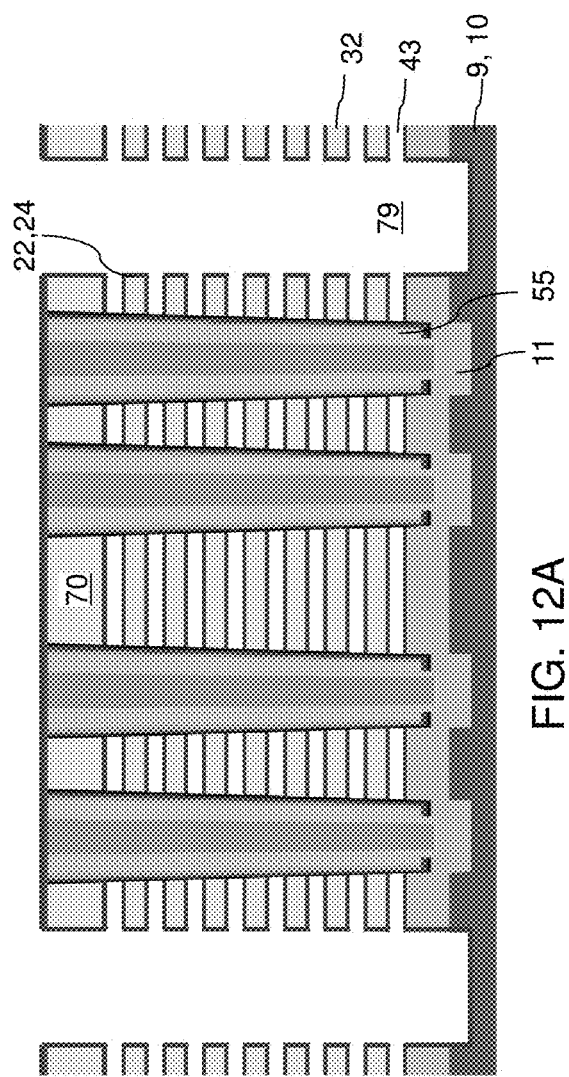

FIGS. 12A-12G illustrate sequential vertical cross-sectional views of an alternative embodiment structure during formation of electrically conductive layers 46 using a sacrificial silicon tungsten nucleation layers instead of the polycrystalline aluminum oxide liners 28 as the tungsten nucleation layers. FIG. 12A illustrates the structure of a first alternative embodiment at the stage shown in FIG. 8B. The elements having the same numbers in FIGS. 8B and 12A have the same function, structure and composition. The deposition of the amorphous aluminum oxide layer 26 shown in FIG. 8C can be omitted in this alternative embodiment.

Figure 12B:
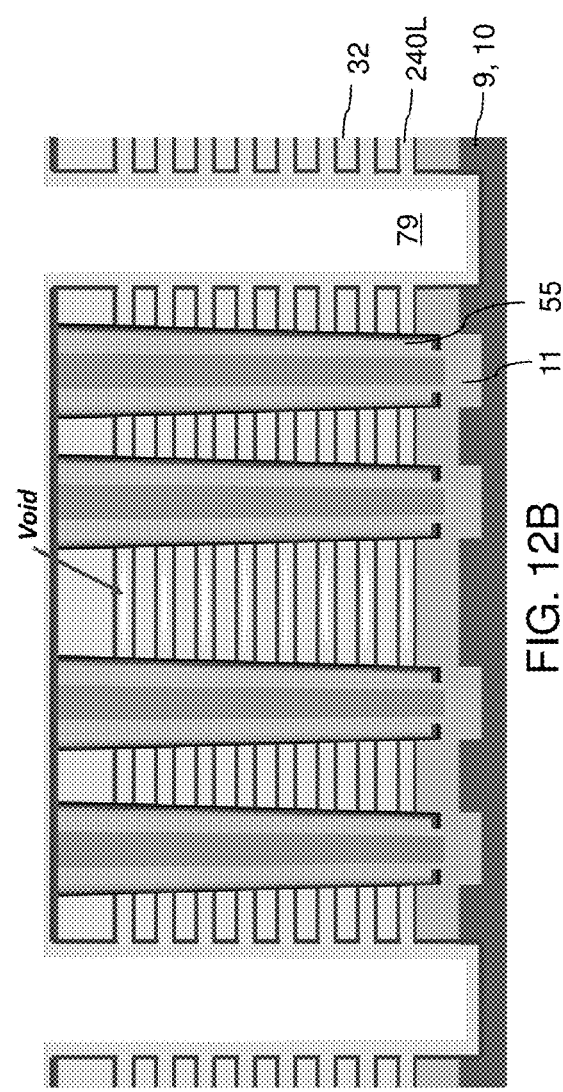

As shown in FIG. 12B, an optional first sacrificial silicon layer 240L is deposited on the metallic liner layer 24 in the backside recesses 43 through the backside trenches 79. The first sacrificial silicon layer 240L fills the entire volumes of the backside recesses 43 and extends into the backside trenches 79 similar to the sacrificial masking material layer 140L shown in FIG. 8D. The first sacrificial silicon layer 240L may be a polysilicon or an amorphous silicon layer deposited by CVD or ALD. A void may be formed in the portions of the first sacrificial silicon layer 240L located in the distal portions of the backside recesses 43, as shown in FIG. 12B.

In order to avoid or reduce the voids in the portions first sacrificial silicon layer 240L located in the distal portions of the backside recesses 43, the first sacrificial silicon layer 240L may be selectively etched back by an anisotropic etch through the backside trenches 79. The selective etch back leaves distal portions 240 of the first sacrificial silicon layer 240L in distal portions of the backside recesses 43 and removes the remaining portions of the first sacrificial silicon layer 240L from the proximal portions of the backside recesses 43, as shown in FIG. 12C.

As shown in FIG. 12D, a second sacrificial silicon layer 340L is deposited on the distal portions 240 of the first sacrificial silicon layer and on the metallic liner layer 24 in the backside recesses 43 through the backside trenches 79. The second sacrificial silicon layer 340L may comprise polysilicon or amorphous silicon. The second sacrificial silicon layer 340L fills in the voids in the distal portions 240 of the first sacrificial silicon layer. Alternatively, the formation of the first sacrificial silicon layer 240L may be omitted and the a second sacrificial silicon layer 340L may comprise the initial sacrificial silicon layer 340L in this embodiment.

The second sacrificial silicon layer 340L is then selectively etched back by an anisotropic etch through the backside trenches 79. The selective etch back leaves sacrificial silicon tungsten nucleation layer 340 portions of the second sacrificial silicon layer 340L in distal portions of the backside recesses 43 and removes the remaining portions of the second sacrificial silicon layer 340L from the proximal portions of the backside recesses 43, as shown in FIG. 12E.

As shown in FIG. 12F, the tungsten material portions 46A are selectively formed using the sacrificial silicon tungsten nucleation layers 340. For example, the tungsten material portions 46A are selectively by CVD or ALD using tungsten hexafluoride precursor in a following chemical reaction: 2WF6+3Si=2W+3SiF4. Thus, the solid tungsten material portions 46A replace the sacrificial silicon tungsten nucleation layers 340, which are converted to silicon tetrafluoride gas. Thus, the alternative embodiment includes the steps of forming a sacrificial silicon layer (240L and/or 340L) in the backside recesses 43, recessing the sacrificial silicon layer in the backside recesses through the pair of backside trenches 79 to remove the sacrificial silicon layer from proximal portions of the backside recesses and to leave the sacrificial silicon tungsten nucleation layers 340 in distal portions of the backside recesses 43, replacing the sacrificial silicon tungsten nucleation layers 340 with the tungsten electrically conductive layers which comprise the tungsten material portions 46A.

Figure 12G:
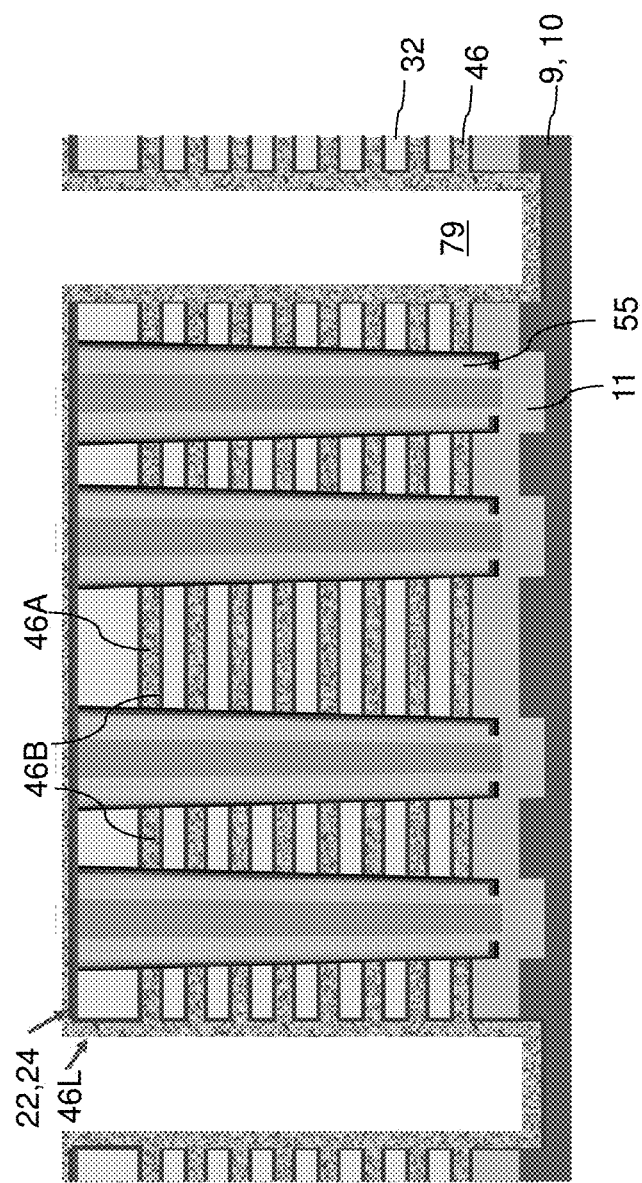

As shown in FIG. 12G, the electrically conductive material portions 46B are formed within the remaining volumes of the backside recesses 43, and a continuous metallic material layer 46L can be formed at peripheral portions of the backside trenches 79 and over the contact level dielectric layer (not shown in FIG. 12G), similar to the step shown in FIG. 8I. The alternative embodiment process then proceeds in the same way as described above with respect to FIGS. 8J to 9.

Figure 10A:
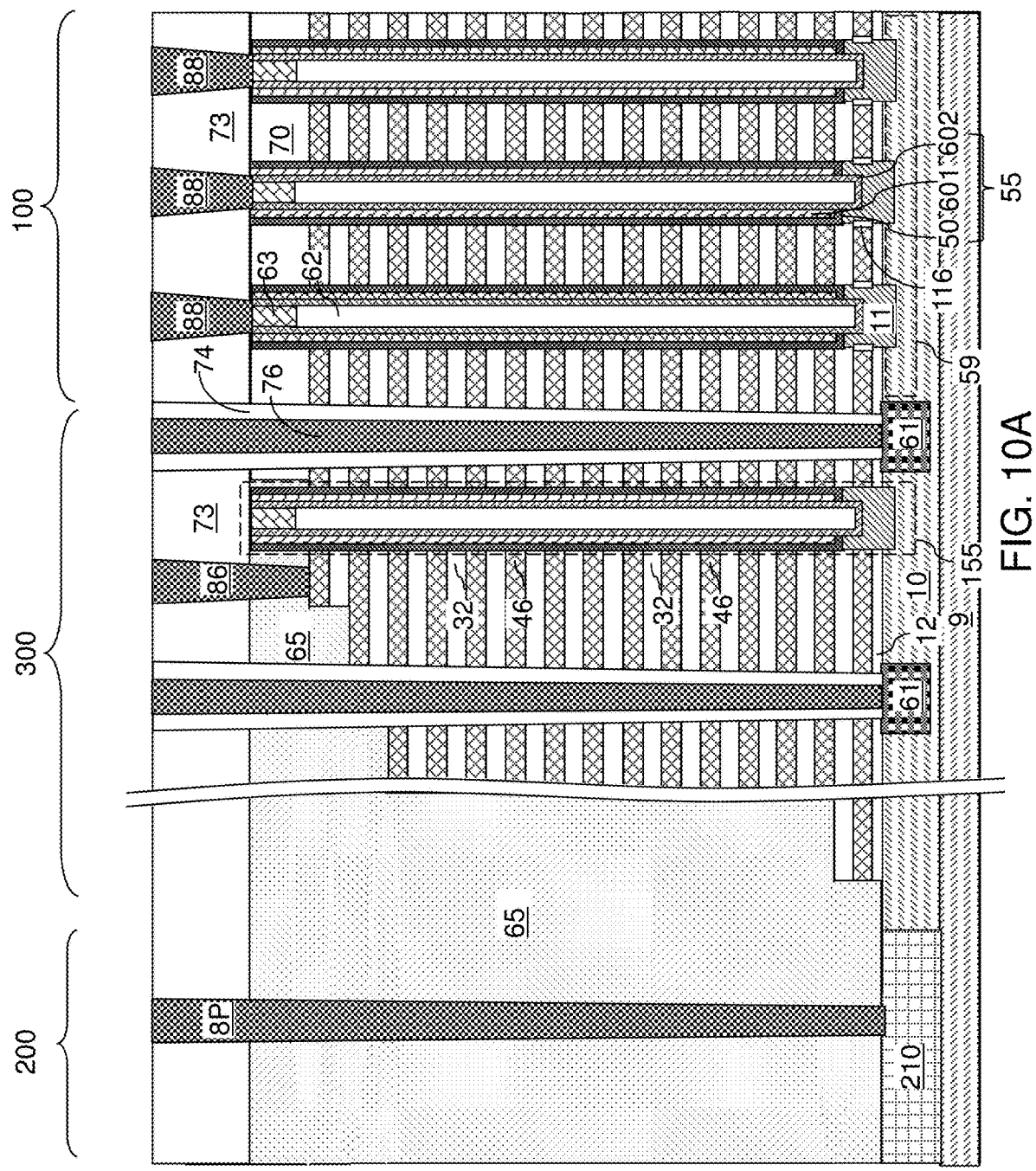
FIG. 10A is a vertical cross-sectional view of the exemplary structure after formation of various contact via structures according to an embodiment of the present disclosure.
Figure 10B:
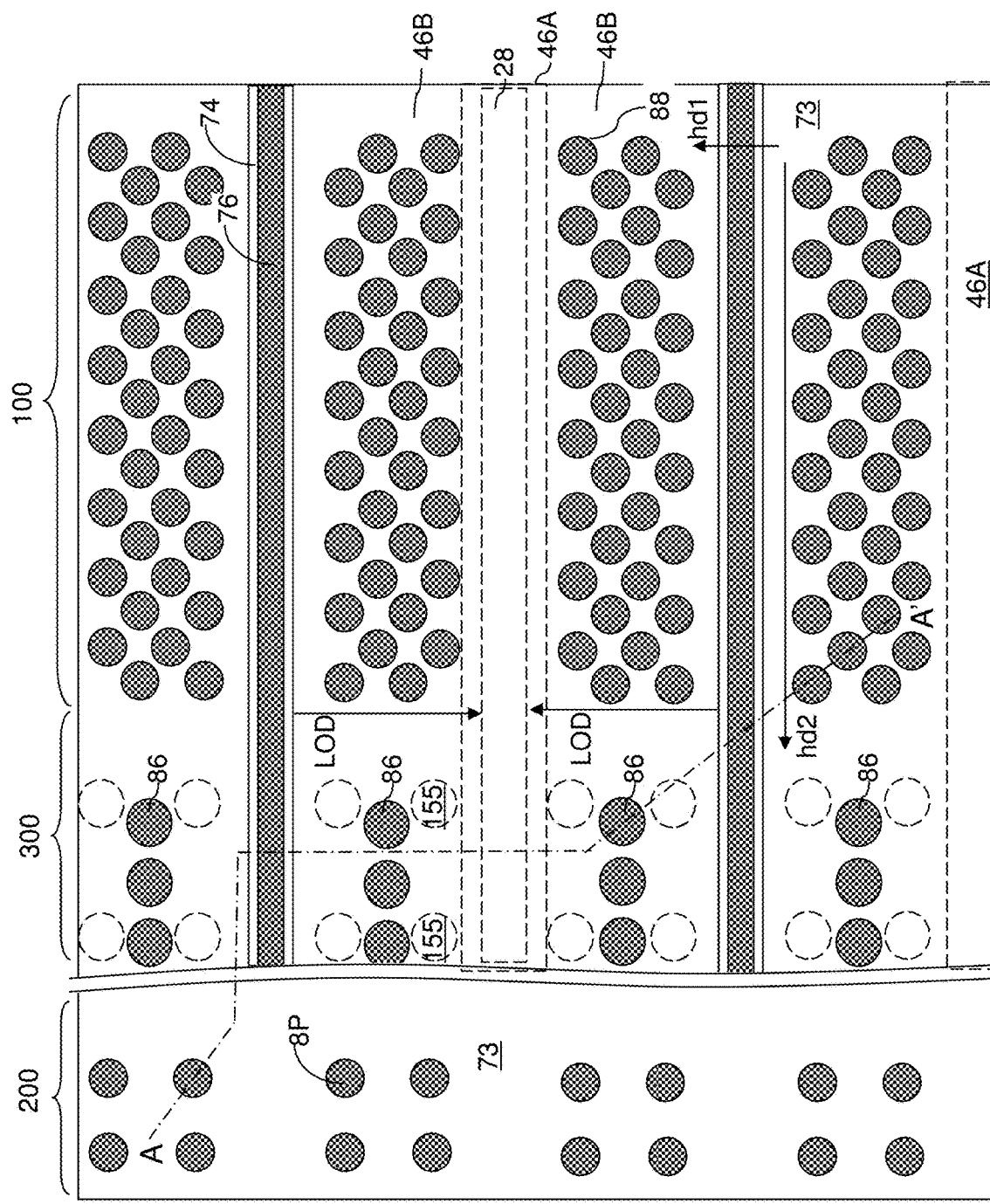
FIG. 10B is a see-through top-down view of the exemplary structure of FIG. 10A. Dashed line(s) A-A' show the vertical planes of the vertical cross-sectional view of FIG. 10A.

FIGS. 10A and 10B illustrate a step that occurs after the structure shown in FIG. 9 is formed by either embodiment described above having an aluminum oxide or sacrificial silicon tungsten nucleation layers. An insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 22 is present, the insulating material layer can be formed directly on surfaces of the backside blocking dielectric layer 22 and directly on the sidewalls of the electrically conductive layers 46. If a backside blocking dielectric layer 22 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. The anisotropic etch process can continue with, or without, a change in the etch chemistry to remove portions of the optional backside blocking dielectric layer 22 that underlie the opening through each insulating spacer 74. A top surface of a source region 61 can be physically exposed at the bottom of each backside trench 79.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner and a conductive sacrificial masking material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive sacrificial masking material portion can include a metal or a metallic alloy. For example, the conductive sacrificial masking material portion can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 22 is employed, the backside contact via structure 76 can contact a sidewall of the backside blocking dielectric layer 22.

Additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 11:
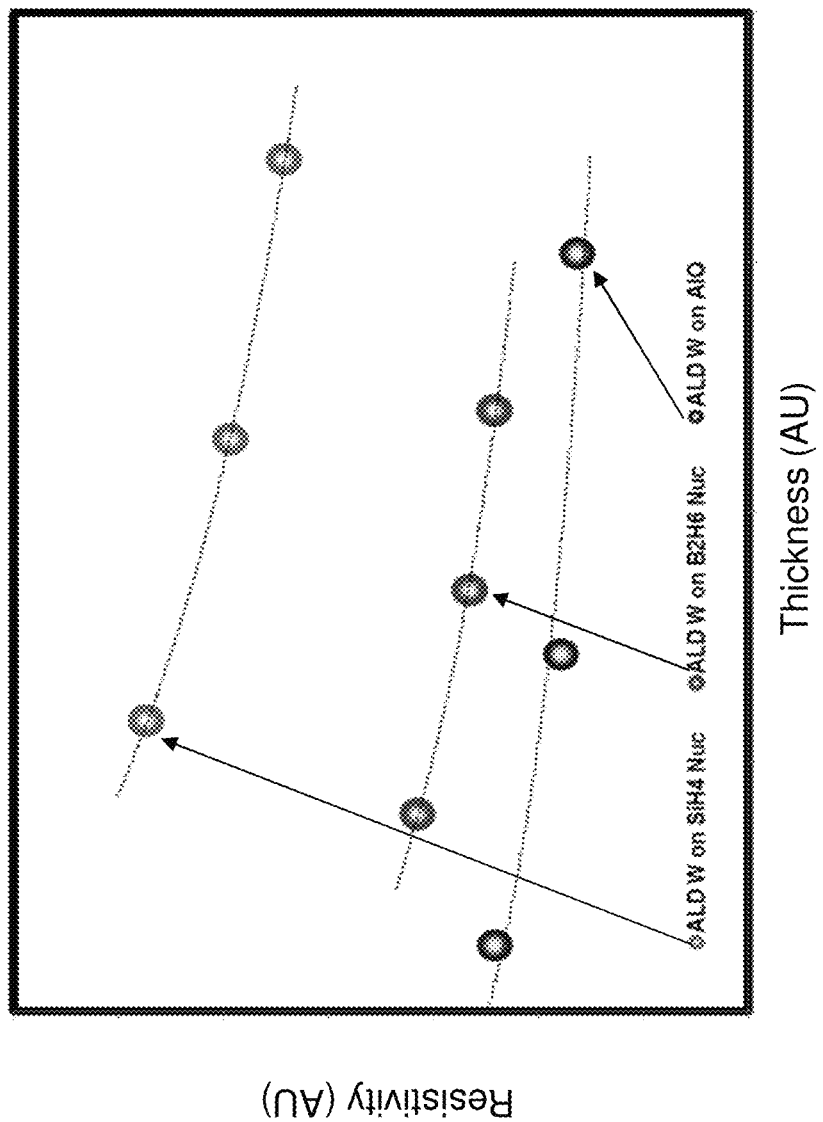
FIG. 11 is a graph comparing the electrical resistivity of various tungsten material portions formed by different deposition methods including a method according to the present disclosure.

Referring to FIG. 11, resistivity of various tungsten materials deposited by different tungsten deposition methods is illustrated after a same anneal process. Nucleation on polycrystalline aluminum oxide provides lower resistivity than nucleation employing a combination of $WF_6$ and $SiH_4$ on a TiN surface and nucleation employing a combination of $WF_6$ and $B_2H_6$ on a TiN surface. Thus, polycrystalline aluminum oxide can function as an effective nucleating surface for depositing tungsten by reduction of tungsten hexafluoride with hydrogen, and can provide lower resistivity than tungsten deposited by silane or diborane based reduction of tungsten hexafluoride on a metallic surface such as a surface of TiN.

The exemplary structure of the present disclosure can include a three-dimensional memory device, which can include an alternating stack of insulating layers 32 and electrically conductive layers 46 located over a substrate (9, 10); memory stack structures 55 extending through the alternating stack (32, 46), each of the memory stack structures including a memory material layer 54, a tunneling dielectric 56, and a vertical semiconductor channel 60; a pair of backside trenches 79 extending through the alternating stack (32, 46) and including respective backside contact via structures 76 contacting a respective portion of the substrate (9, 10) (e.g., a source region 61 in the substrate); metallic liner layers 24 laterally extending between the pair of backside trenches 79; and polycrystalline aluminum oxide liners 28 located between a respective metallic liner layer 24 and a respective electrically conductive layer 46 and laterally spaced from each of the pair of backside trenches 79 by a respective lateral offset distance LOD.

In one embodiment, each of the polycrystalline aluminum oxide liners 28 is laterally spaced from each of the pair of backside trenches 79 by a same lateral offset distance LOD. In one embodiment, the polycrystalline aluminum oxide liners 28 are not in physical contact with any of the memory stack structures 55.

In one embodiment, each of the polycrystalline aluminum oxide liners 28 is spaced from the insulating layers 32 at least by a horizontal portion of a backside blocking dielectric layer 22. In one embodiment, the backside blocking dielectric layer 22 continuously extends from a bottommost layer of the alternating stack (32, 46) to a topmost layer of the alternating stack (32, 46), and comprises horizontal portions that contact horizontal surfaces of the insulating layers 32, first vertical portions that contact sidewalls of the insulating layers 32, and second vertical portions that contact outer sidewalls of the memory stack structures 55.

In one embodiment, each of the polycrystalline aluminum oxide liners 28 is spaced from the insulating layers 32 by a horizontal portion of a metallic liner layer 24. In one embodiment, the metallic liner layer 24 continuously extends from a bottommost layer of the alternating stack (32, 46) to a topmost layer of the alternating stack (32, 46), and comprises horizontal portions that contact horizontal surfaces of the backside blocking dielectric layer 22 and vertical portions that contact vertical surfaces of the backside blocking dielectric layer 22.

In one embodiment, at least one of the memory stack structures 55 is located between each of the polycrystalline aluminum oxide liners 28 and each of the pair of backside trenches 79. In one embodiment, each of the pair of backside trenches 79 laterally extends along a horizontal direction (such as the second horizontal direction hd2), and each of the polycrystalline aluminum oxide liners 28 laterally extends along the horizontal direction. Each of the polycrystalline aluminum oxide liners 28 can have a substantially uniform width throughout. As used herein, a "substantially uniform width" refers to a width that does not vary by more than 5% from the average width.

Each of the electrically conductive layers 46 comprises: a tungsten material portion 46A in contact with a respective one of the polycrystalline aluminum oxide liners 28 composed predominantly of tungsten; and electrically conductive material portions 46B laterally spaced from the respective one of the polycrystalline aluminum oxide liners 28, and located between the tungsten material portion and the pair of backside trenches. The electrically conductive material portions 46B may include tungsten, and/or may include a metal other than tungsten.

In one embodiment, the tungsten material portion 46A does not laterally surround any of the memory stack structures 55; and the electrically conductive material portions 46B laterally surround the memory stack structures 55.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46); and support pillar structures 155 extend through the stepped surfaces and through a retro-stepped dielectric material portion 65 that overlies the stepped surfaces.

Figure 13A:
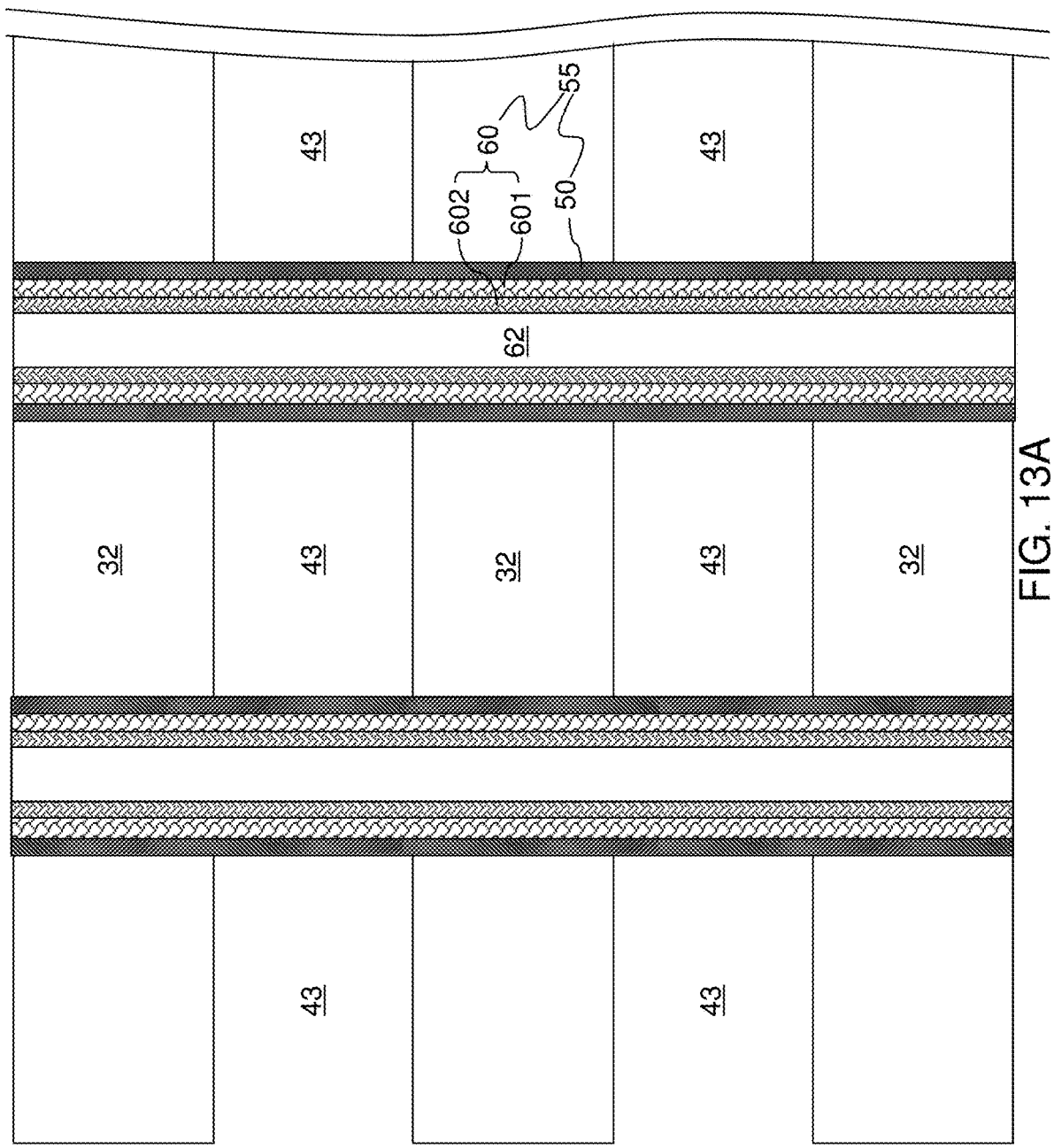
FIGS. 13A-13H are sequential vertical cross-sectional views of a second alternative exemplary structure during formation of electrically conductive layers.

Referring to FIG. 13A, a second alternative exemplary structure for a three-dimensional memory device is illustrated, which can be the same as the exemplary structure illustrated in FIG. 8A. Generally speaking, an alternating stack of insulating layers 32 and sacrificial material layers 42 is formed over a substrate (9, 10). Memory stack structures 55 are formed through the alternating stack (32, 42). The backside trenches 79 can include a first backside trench and a second backside trench that are formed through the alternating stack (32, 42) as a neighboring pair of backside trenches 79. The backside recesses 43 can be formed by removing the sacrificial material layers 42 from the alternating stack (32, 42) selective to the insulating layers 32 as described above.

Figure 13B:
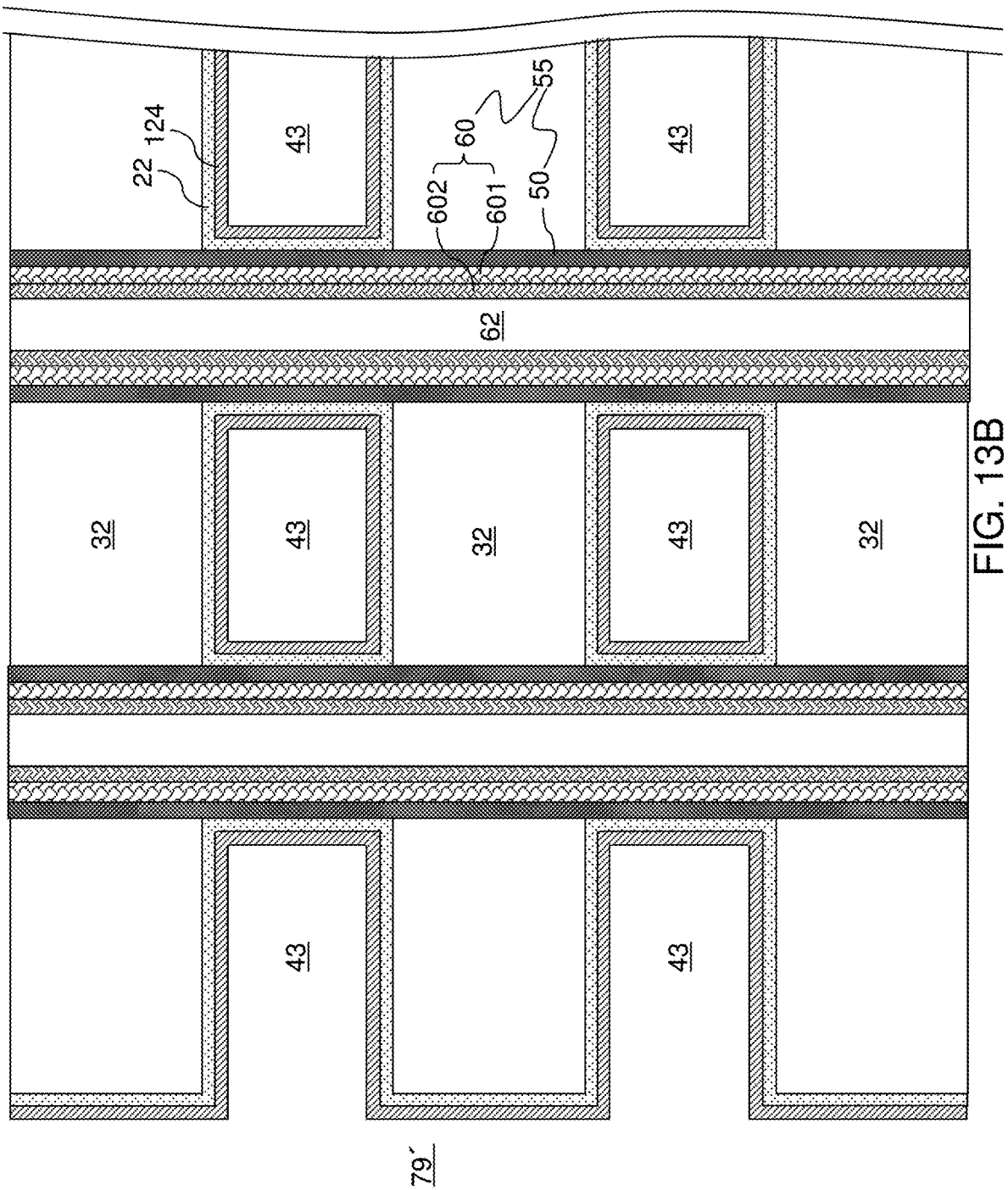

Referring to FIG. 13B, a backside blocking dielectric layer 22 is deposited on surfaces of the insulating layers 32 and the memory stack structures 55 inside the backside recesses 43 and the backside trenches 79. The backside blocking dielectric layer 22 includes any of the dielectric material described above. The backside blocking dielectric layer 22 can be deposited by a conformal deposition process such as atomic layer deposition process or chemical vapor deposition process. The backside blocking dielectric layer 22 can continuously extend from a bottommost one of the insulating layers 32 to a topmost one of the insulating layers 32. The backside blocking dielectric layer 32 can comprise horizontal portions that contact horizontal surfaces of the insulating layers 32, first vertical portions that contact sidewalls of the insulating layers 32, and second vertical portions that contact outer sidewalls of the memory stack structures 55. In one embodiment, the backside blocking dielectric layer 22 can include, or can consist essentially of, aluminum oxide.

A metal-nucleation-suppressing liner 124 can be subsequently deposited by a conformal deposition method directly on the surfaces of the backside blocking dielectric layer 22. The metal-nucleation-suppressing liner 124 includes a material that is less conducive to nucleation of a metal, such as tungsten, than a metal-nucleation-promoting liner to be subsequently formed on the metal-nucleation-suppressing liner 124. As used herein, "nucleation" or a "nucleation process" of a material refers to a process of formation of islands of clusters of atoms derived from a gas phase reactant on a pre-existing surface. A nucleation process can be characterized by an incubation time, which is herein defined as a time between beginning of exposure to a reactant gas to coverage of 90% of a surface by atoms derived from the reactant gas.

Figure 13C:
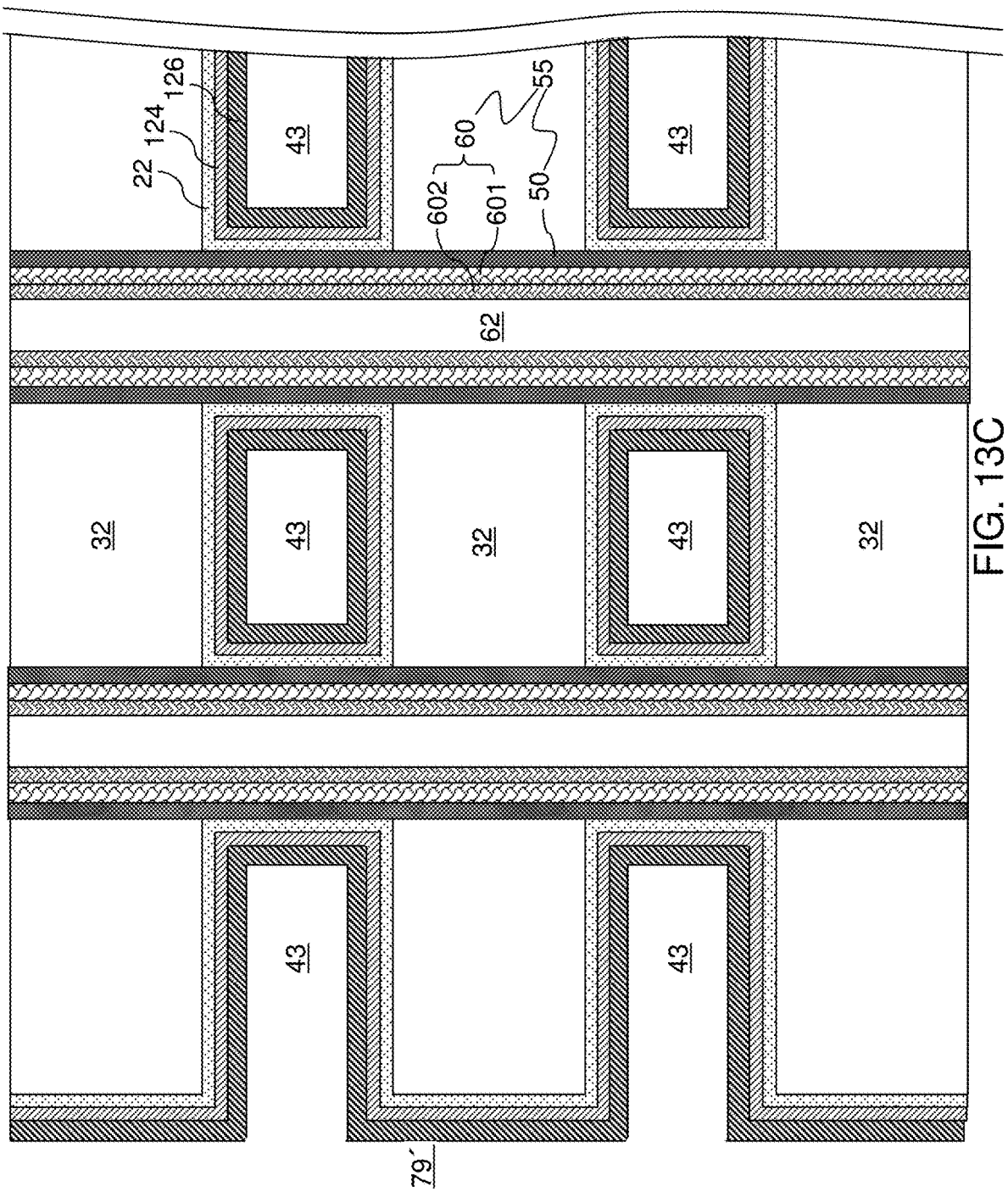

Referring to FIG. 13C, another liner, which is herein referred to as a metal-nucleation-promoting liner 126, can be deposited on the metal-nucleation-suppressing liner 124 by a conformal deposition process. In one embodiment, the metal-nucleation-promoting liner 126 is formed as a continuous liner material layer that continuously extends without a hole therein and covers all physically exposed surfaces of the metal-nucleation-suppressing liner 124 around the backside recesses 43 and the backside trenches 79. As a continuous liner material layer, the metal-nucleation-promoting liner 126 can continuously extend between each neighboring pair of backside trenches 79 through each backside recess 43 therebetween.

The materials of the metal-nucleation-suppressing liner 124 and the metal-nucleation-promoting liner 126 are selected such that the material of the metal-nucleation-promoting liner 126 provides a shorter incubation time for the metal (e.g., tungsten) to be subsequently deposited than the material of the metal-nucleation-suppressing liner 124. In one embodiment, the incubation time of the metal-nucleation-promoting liner 126 for the metal can be less than 50%, 25%, 10%, 5%, 1%, 0.1%, and/or 0.01% of the incubation time for the metal-nucleation-suppressing liner 124. In other words, the surfaces of the metal-nucleation-promoting liner 126 is conducive to nucleation of the metal to be subsequently deposited, and the surfaces of the metal-nucleation-suppressing liner 124 can suppress nucleation of the metal to be subsequently deposited.

In one embodiment, the metal-nucleation-suppressing liner 124 can include a material that strongly suppresses deposition of a metal such as tungsten thereupon. For example, the metal-nucleation-suppressing liner 124 can include titanium nitride or amorphous aluminum oxide. In such cases, the incubation time can be greater than 1 minute, and may be greater than 1 hour such as 24 hours or greater, and can essentially prevent deposition of the metal on the surfaces of the metal-nucleation-suppressing liner 124. In one embodiment, the metal-nucleation-suppressing liner 124 comprises an electrically conductive material, such as titanium nitride. An exemplary metal deposition process for providing such an incubation time for titanium nitride is a tungsten deposition process that employs a tungsten precursor gas (such as tungsten hexafluoride or tungsten hexachloride) as a reactant gas and hydrogen as a reducing agent, such as the LFW ALD deposition process described above. Other suitable CVD or ALD processes may also be used, such as an ALD process that alternates tungsten precursor (e.g., tungsten hexafluoride) and silicon containing material (e.g., silane or disilane) cycles.

In one embodiment, the metal-nucleation-promoting liner 126 can include a material that provides a minimal incubation time such as less than 10 seconds and/or less than 1 second. For example, the metal-nucleation-promoting liner 126 can include a material such as silicon, titanium oxide, metal silicide or elemental metal, including a doped elemental metal, such as silicon-doped tungsten or boron-doped tungsten that can be deposited by alternately flowing a tungsten precursor gas (such as tungsten hexafluoride or tungsten hexachloride) and a hydride compound such as silane or diborane. An exemplary tungsten metal deposition process for providing such an incubation time for silicon, titanium oxide, or silicon-doped tungsten or boron-doped tungsten is the above described LFW ALD tungsten deposition process that employs a tungsten precursor gas (such as tungsten hexafluoride or tungsten hexachloride) as a reactant gas and hydrogen as a reducing agent.

In one embodiment, the metal-nucleation-promoting liner 126 can comprise, and/or can consist essentially of an electrically conductive or semiconductor material selected from silicon, a metal silicide, and an elemental metal. In one embodiment, the metal-nucleation-promoting liner 126 can comprise, and/or can consist essentially of, a material selected from silicon, tungsten silicide, ruthenium, and tungsten, including tungsten doped with silicon or boron.

Many materials can be employed either as the material of the metal-nucleation-suppressing liner 124 or as the material of the metal-nucleation-promoting liner 126 provided that another material providing a different nucleation time is employed as the other of the metal-nucleation-suppressing liner 124 and the metal-nucleation-promoting liner 126. For example, materials such as boron and tungsten carbonitride (WCN) provide an intermediate nucleation time that is greater than the nucleation times for silicon, titanium oxide, metal silicide or elemental metal and is less than the incubation time for titanium nitride. An exemplary metal deposition process for providing such an incubation time is the above described LFW ALD tungsten deposition process.

Therefore, if titanium nitride or amorphous aluminum oxide is employed as the material of the metal-nucleation-suppressing liner 124, then silicon, titanium oxide, metal silicide, elemental metal, boron, or WCN may be employed as the material of the metal-nucleation-promoting liner 126. If silicon, titanium oxide, metal silicide or elemental metal is employed as the material of the metal-nucleation-promoting liner 126, then titanium nitride, amorphous aluminum oxide, boron, or WCN may be employed as the material of the metal-nucleation-suppressing liner 124.

The thickness of the metal-nucleation-suppressing liner 124 and the thickness of the metal-nucleation-promoting liner 126 can be selected such that each of the metal-nucleation-suppressing liner 124 and the metal-nucleation-promoting liner 126 is formed as a continuous material layer without holes therein. For example, the thickness of the metal-nucleation-suppressing liner 124 can be in a range from 0.8 nm to 3 nm, and the thickness of the metal-nucleation-promoting liner 126 can be in a range from 0.8 nm to 3 nm, although lesser and greater thicknesses can also be employed for each of the two layers. A backside cavity 79' is present within each backside trench 79.

The thicknesses of LFW ALD tungsten deposited under the same conditions on tungsten, titanium oxide, boron, WCN, TiN, and amorphous aluminum oxide surfaces are about 24 nm, 24 nm, 15 nm, 15.5 nm, 0 nm, and 0 nm, respectively. Thus, the growth rate of LFW ALD tungsten is about zero on TiN and amorphous aluminum oxide metal-nucleation-suppressing liner surfaces during the first 15 to 25 nm thick tungsten layer growth on the metal-nucleation-promoting liner surfaces. Furthermore, if the TiN and amorphous aluminum oxide metal-nucleation-suppressing liner surfaces are covered by a 1.5 nm to 6 nm thick silicon metal-nucleation-promoting liners, then between about 15 nm and about 27 nm thick LFW ALD tungsten layers can be formed on the silicon metal-nucleation-promoting liners.

Figure 13D:
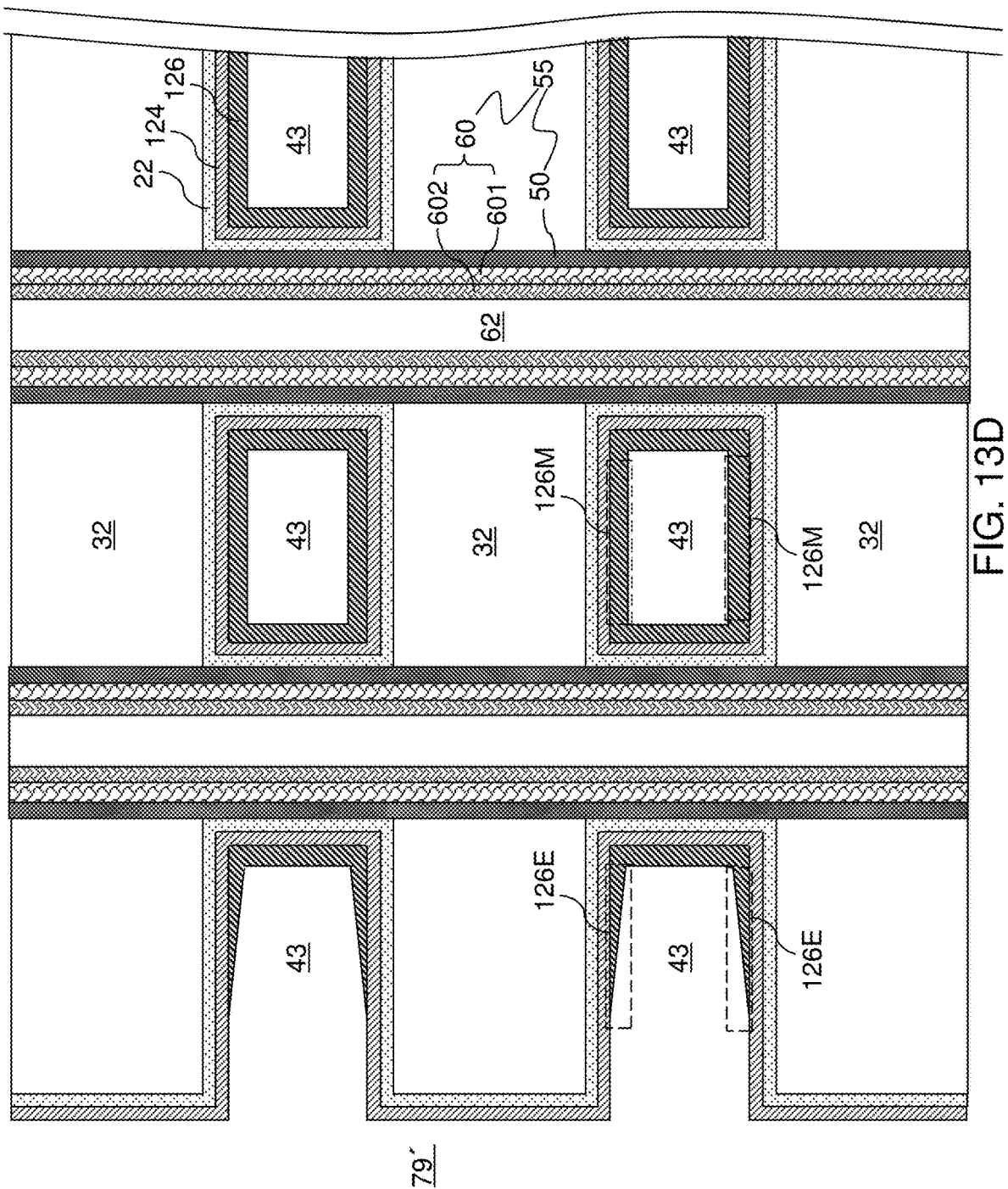

Referring to FIG. 13D, a selective etch, such as a hydrogen peroxide wet etch can be performed to remove the material of the metal-nucleation-promoting liner 126 (e.g., tungsten) with an etch rate that decreases with distance from a most proximal backside trench 79 selectively to the metal-nucleation-suppressing liner 124 (e.g., TiN). The metal-nucleation-promoting liner 126, as initially formed as a continuous liner material layer, is etched with a variable etch rate that decreases in the backside recesses 43 with a lateral distance from a proximal one of the backside trenches 79. Each remaining portion of the continuous liner material layer constitutes a discrete liner with end portions 126E recessed away from the closest backside trench 79. Thus, a single continuous structure of the metal-nucleation-promoting liner 126 as originally formed is divided into a plurality of metal-nucleation-promoting liners 126. Each of the metal-nucleation-promoting liners 126 can be located entirely within a level of a respective sacrificial material layer 42, and thus, can be located between a vertically neighboring pair of insulating layers 32.

Thus, each metal-nucleation-promoting liner 126 can be formed by depositing and patterning a liner material (i.e., the material of the metal-nucleation-promoting liner 126) on the metal-nucleation-suppressing liner 124 in each of the backside recesses 43. The metal-nucleation-suppressing liner 124 can be located between, and can directly contact, each of the metal-nucleation-promoting liners 126 and a respective portion of the backside blocking dielectric layer 22. Each of the metal-nucleation-promoting liner 126 has a lesser lateral extent than the lateral distance between a neighboring pair of backside trenches 79. For example, if an entire set of metal-nucleation-promoting liners 126 located between a neighboring pair of a first backside trench 79 and a second backside trench 79 can have a lesser lateral extent than the lateral distance between the first backside trench 79 and the second backside trench 79.

Each metal-nucleation-promoting liner 126 can have a first horizontal portion formed on an overlying horizontal surface (such as a bottom surface of an overlying insulating layer 32) of a respective one of the backside recesses 43, a second horizontal portion formed on an underlying horizontal surface (such as a top surface of an underlying insulating layer 32) of the respective one of the backside recesses 43, cylindrical portions that connect the first horizontal portion and the second horizontal portion and laterally surrounding a respective one of the memory stack structures 55. The total number of cylindrical portions per metal-nucleation-promoting liner 126 can be the same as the total number of memory stack structures 55 between a pair of backside trenches 79 that are adjacent to the metal-nucleation-promoting liner 126.

The etch rate of the anisotropic etch process that removes edge portions of the metal-nucleation-promoting liners 126 from the vicinities of the backside trenches 79 decreases with the lateral distance from the backside trenches 79. For the entire set of metal-nucleation-promoting liners 126 located between a first backside trench 79 and a second backside trench 79, each of the metal-nucleation-promoting liners 126 can be laterally spaced from the first backside trench 79 and from the second backside trench 79 by a same lateral offset distance. In one embodiment, each of the first and second horizontal portions can include a middle portion 126M having a uniform thickness, and recessed end portions 126E adjoined to the middle portion 126M having a tapered thickness that decreases with distance from the middle portion 126M. The duration of the selective etch process can be controlled to optimize the lateral extent of the metal-nucleation-promoting liners 126. A longer etch time leads to a lesser lateral extent of the metal-nucleation-promoting liners 126 after the selective etch process so that subsequently growth of a metal is suppressed over a greater area, while a shorter etch time leads to a greater lateral extent of the metal-nucleation-promoting liners 126 so that subsequent growth of the metal is suppressed over a smaller area. The optimal area with the backside recesses 43 from which the metal-nucleation-promoting liners 126 need to be removed can be determined based on the height of and the lateral extent of the backside recesses 43. For example, growth of metal can be suppressed over a greater area for denser and wider stacks than for less dense and narrower stacks.

Figure 13E:
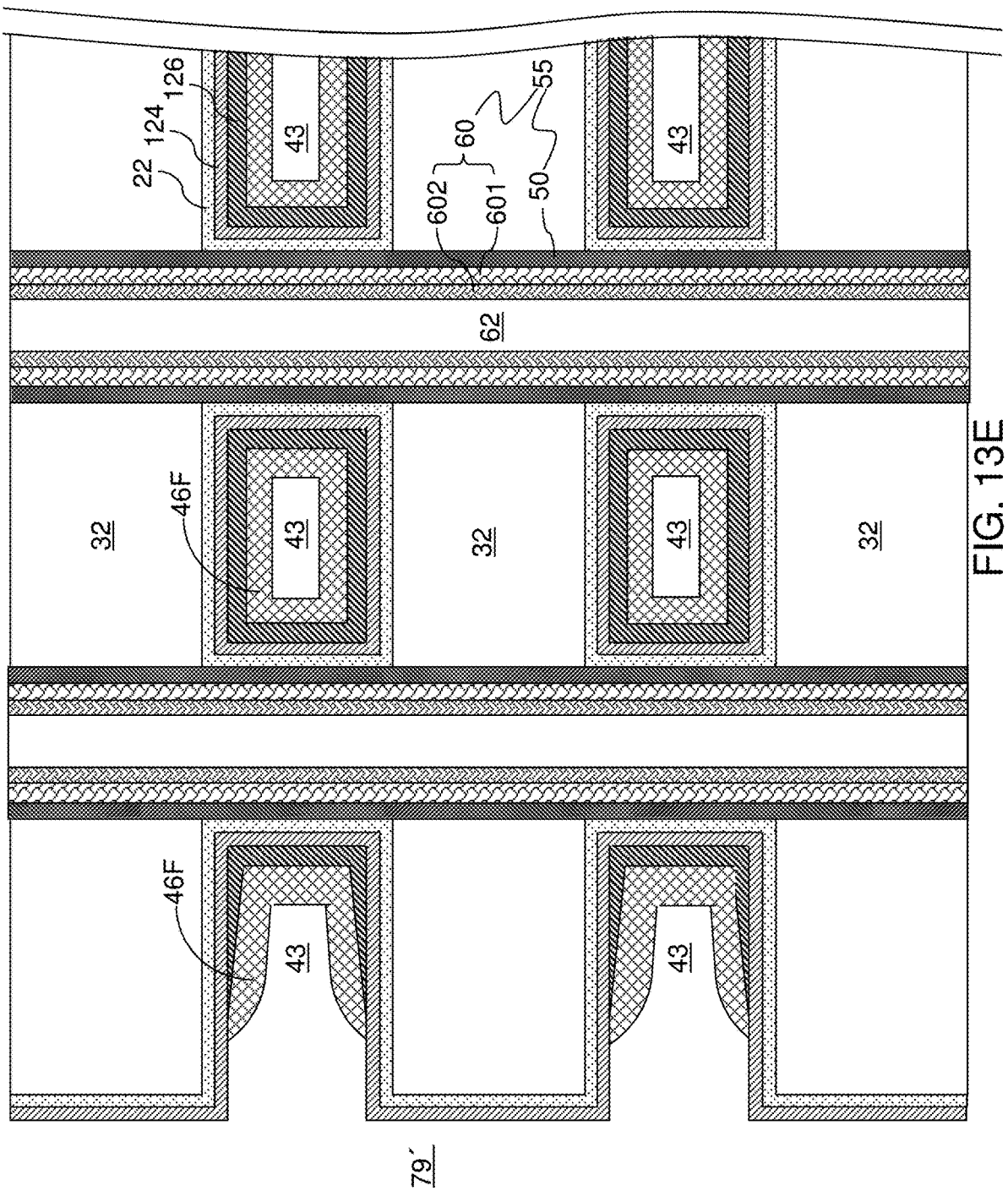

Referring to FIG. 13E, a metal, such as LFW ALD tungsten, can be selectively grown from surfaces of the metal-nucleation-promoting liners 126 while growing at a lower rate (which includes a rate of zero without any growth) the metal from surfaces of the backside recesses that are not covered by the metal-nucleation-promoting liners 126. Specifically, the metal grows from the surfaces of the metal-nucleation-promoting liners 126 while the metal grows at a lower rate (e.g., does not grow) from the surfaces of the metal-nucleation-suppressing liner 124. The metal that is deposited by the selective metal deposition process has a lesser incubation time on the surfaces of the metal-nucleation-promoting liner 126 than on the surfaces of the metal-nucleation-suppressing liner 124. Thus, the metal that is deposited by the selective metal deposition process can grow from the surfaces of the metal-nucleation-promoting liner 126 while growing at a lower rate (including not growing at all at a rate of about zero) from the surfaces of the metal-nucleation-suppressing liner 124, thereby shrinking the volume of each backside cavity 43 from between neighboring pairs of backside trenches 79 and optionally without deposition of the metal in portions of the backside recesses 43 that are proximal to the backside trenches 79. The deposited metal forms a metal fill portion 46F within each backside recess.

Figure 13F:
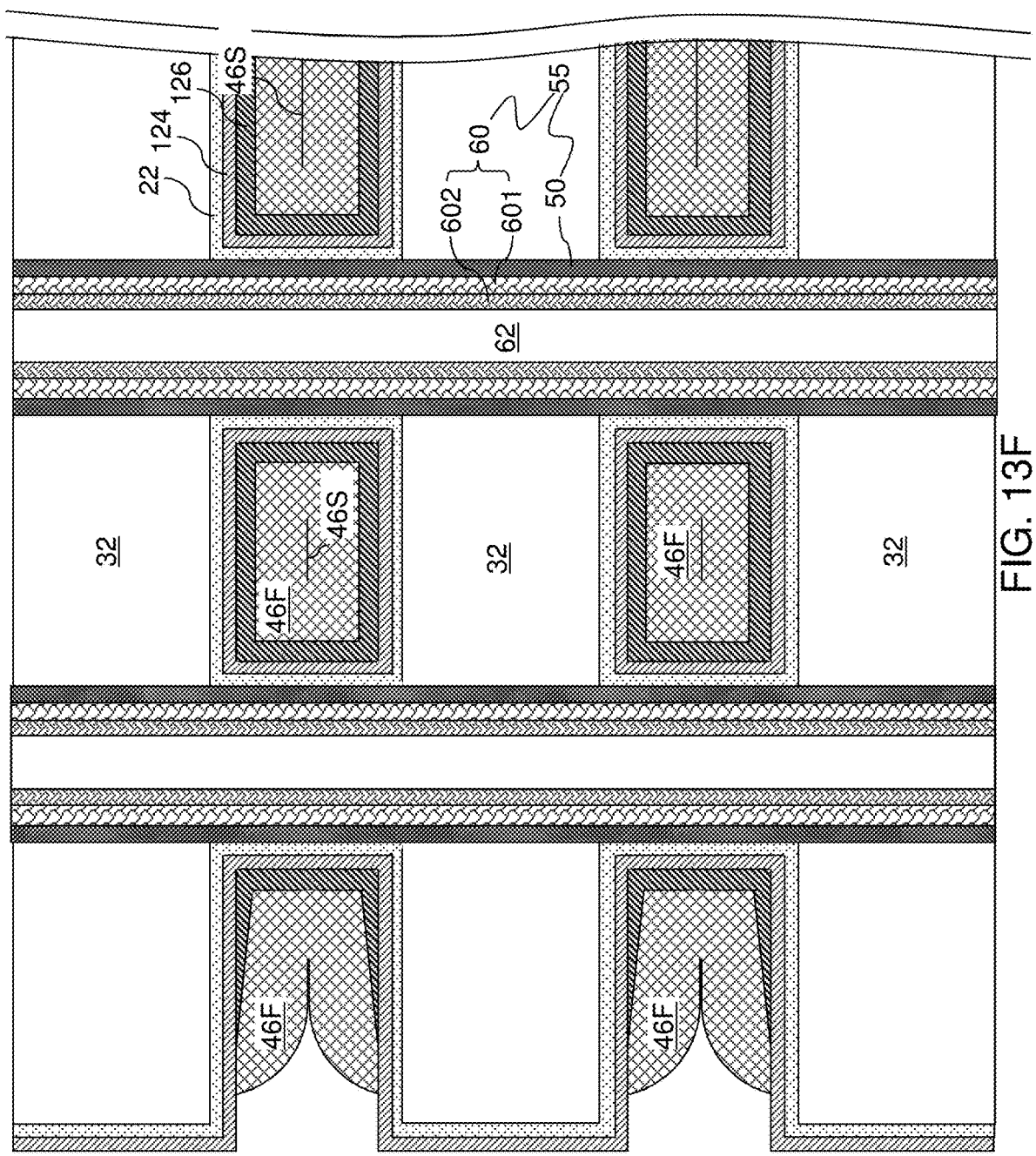

Referring to FIG. 13F, in one embodiment, horizontal portions of each metal fill portion 46F can merge within each backside recess to form horizontal seams 46S that laterally surround each of the memory stack structures 55 located between the first backside trench 79 and the second backside trench 79. After formation of the horizontal seams 46S, the metal fill portions 46F grow outward toward the backside trenches 79. In one embodiment, the incubation time on the surfaces of the metal-nucleation-suppressing liner 124 can be greater than the process time needed to form the horizontal seams 46S. In this case, the metal grows at a lower rate (including does not grow) from the surfaces of the metal-nucleation-suppressing liner 124 until, and/or after, formation of the horizontal seams 46S.

Figure 13G:
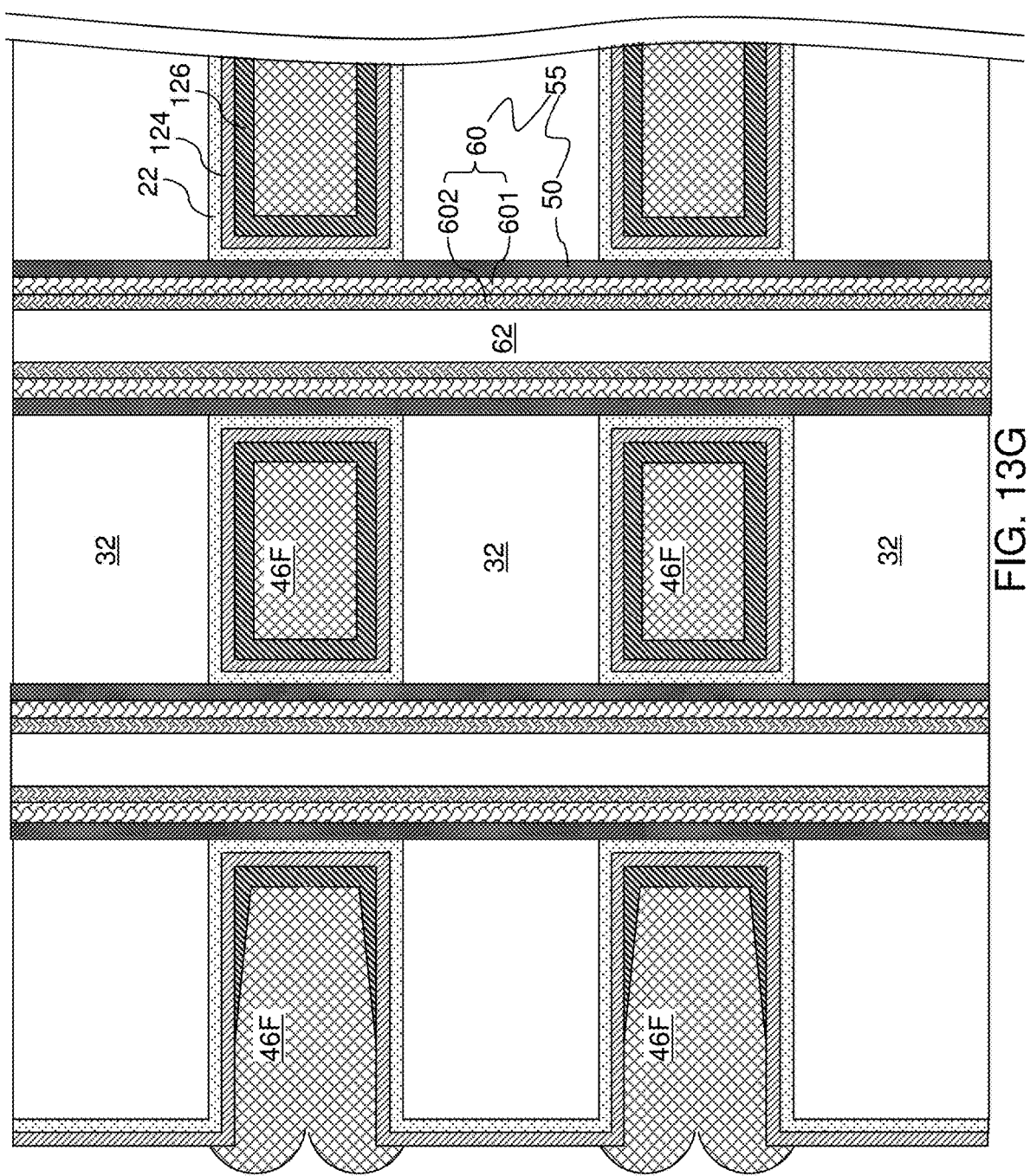

Referring to FIG. 13G, the selective metal deposition process continues until all volumes of the backside recesses 43 are filled with the remaining seam-containing metal fill portions 46F. In one embodiment, convex surfaces of the metal fill portions 46F can protrude into the volumes of the backside trenches 79 after all volumes of the backside recesses 43 are filled with the metal fill portions 46F. In one embodiment, the incubation time on the surfaces of the metal-nucleation-suppressing liner 124 can be greater than the process time needed to form the entire volumes of the backside recesses 43 with the metal fill portions 46F. In this case, the metal does not grow from the surfaces of the metal-nucleation-suppressing liner 124 even after completion of formation of the metal fill portions 46F.

In one embodiment, the metal to be subsequently deposited has an incubation time on the surfaces of the metal-nucleation-promoting liner 126 that is less than 1 second, and has an incubation time on the surfaces of the metal-nucleation-suppressing liners 124 that is greater than the total deposition time employed to deposit the metal. In such cases, the metal does not form a continuous layer on the surfaces of the metal-nucleation-suppressing liners 124. An anneal can be performed at an elevated temperature to remove all horizontal seams in the metal fill portions 46F. The temperature and the duration of the anneal can be optimized for the metal composition in the metal fill portions 46F. For example, if the metal fill portions 46F consist essentially of tungsten, an anneal process can be performed at an elevated temperature in a range from 650 degrees Celsius to 850 degrees Celsius, such as 750 to 800 degrees Celsius to remove all horizontal seams 46S. Removal of the horizontal seams 46S in the metal fill portions 46F prevents diffusion of etchants through seams, thereby enhancing the structural integrity of the metal fill portions 46F in a subsequent etch back process.

Figure 13H:
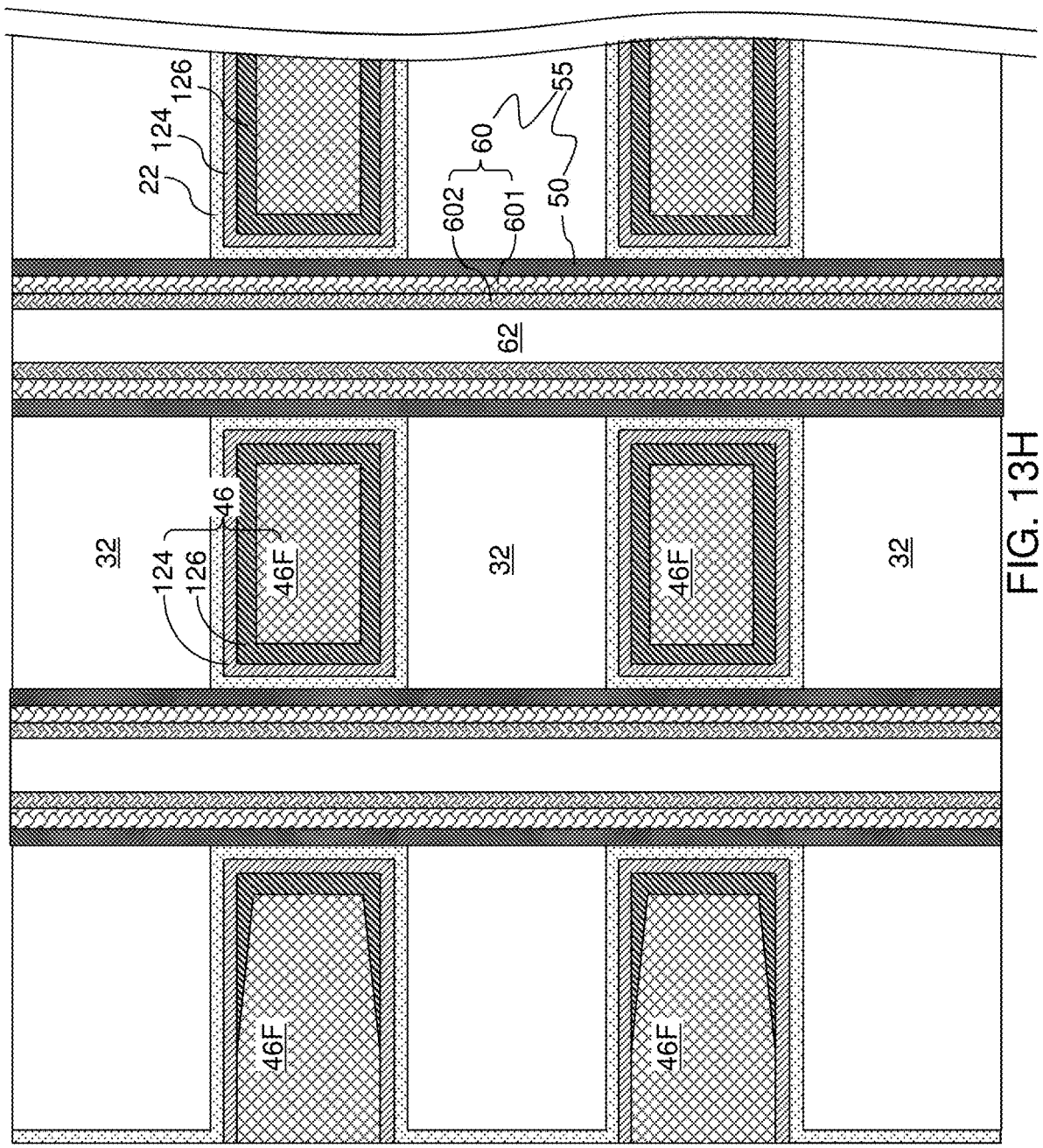

Referring to FIG. 13H, an etch process can be performed to remove regions of the metal fill portions 46F that are located in the backside trenches 79. The etch process may be an isotropic etch process (such as a wet etch process) and/or an anisotropic etch process (such as a reactive ion etch process). In this case, each of the metal fill portions 46F can have vertical sidewalls such that a first vertical sidewall of each metal fill portion 46F faces one of the backside trenches 79 (such as the first backside trench) and a second vertical sidewall of each metal fill portion 46F faces another one of the backside trenches 79 (such as the second backside trench).

The etch process removes portions of the metal-nucleation-suppressing liner 124 located within the backside trenches 79. Thus, the metal-nucleation-suppressing liner 124 is divided into a plurality of physically disjoined portions that are confined at a respective level of a sacrificial material layer 42, for example, between an overlying insulating layer 32 and an underlying insulating layer 32. Each metal-nucleation-suppressing liner 124, as divided by the anisotropic etch process, can laterally extend between a neighboring pair of backside trenches 79. In one embodiment, each combination of a metal-nucleation-suppressing liner 124 and a metal fill portion 46F embedded therein can have a pair of vertically coincident sidewalls that face two backside trenches 79.

Each adjacent combination of a metal-nucleation-suppressing liner 124, a metal-nucleation-promoting liner 126, and a metal fill portion 46F collectively constitutes an electrically conductive layer 46, which can provide the same function as the electrically conducive layers 46 described above. In one embodiment, the metal fill portions 46F can comprise, and/or consist essentially of, tungsten. Subsequently, the processing steps of FIG. 9 can be performed to form source regions 61. Thereafter, the processing steps of FIGS. 10A and 10B can be performed.

Figure 14A:
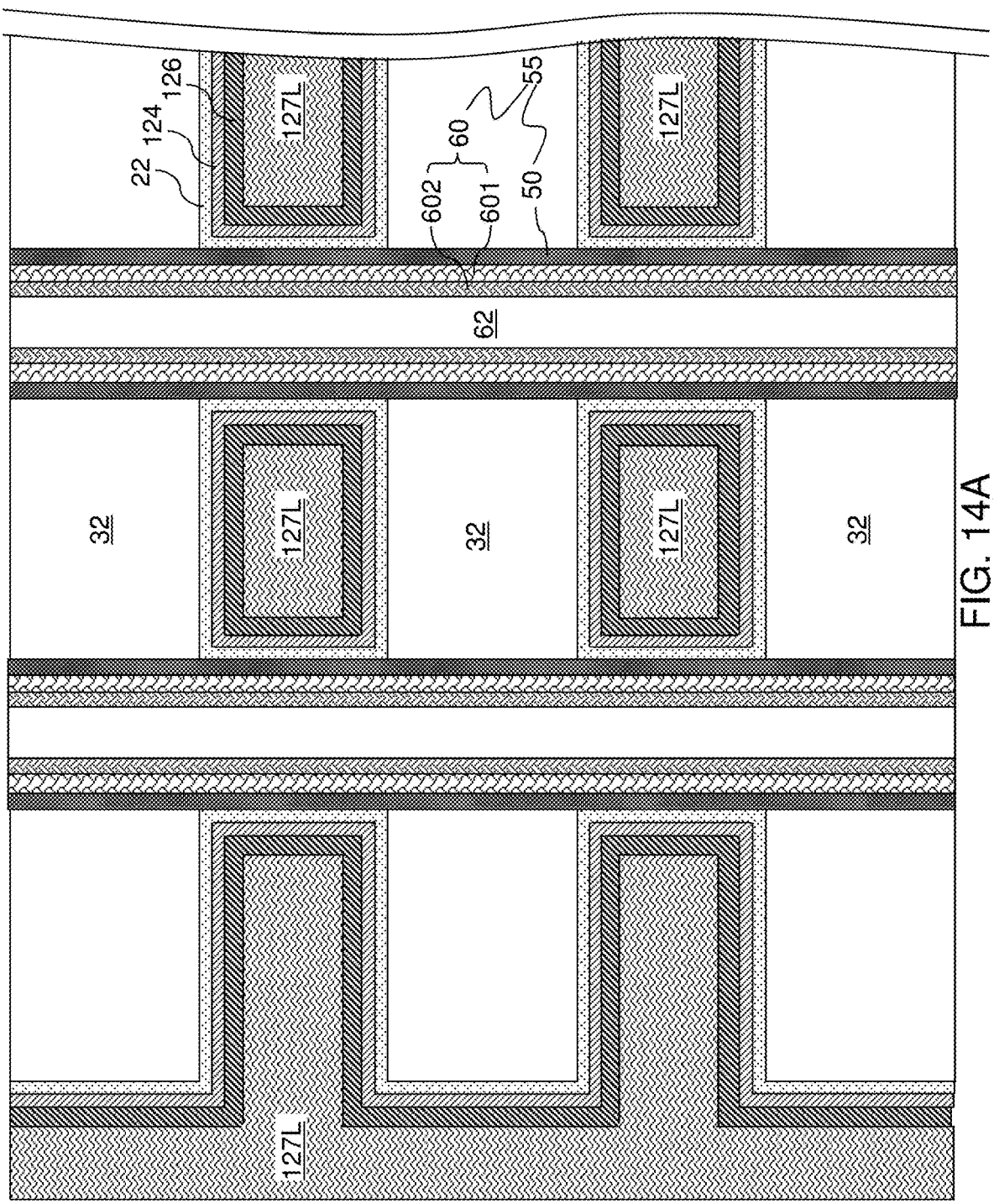
FIGS. 14A-14E are sequential vertical cross-sectional views of a third alternative exemplary structure during formation of electrically conductive layers.

Referring to FIG. 14A, a third alternative exemplary structure according to an embodiment of the present disclosure can be derived from the second alternative exemplary structure of FIG. 13C by depositing a sacrificial cover material layer 127L in the backside recesses 43 and at peripheral portions of the backside trenches 79. The metal-nucleation-promoting liner 126 is present as a continuous liner material layer, and the sacrificial cover material layer 127L can be deposited on the surfaces of the metal-nucleation-promoting liner 126. The sacrificial cover material layer 127L includes a material that can be subsequently removed selective to the materials of the metal-nucleation-suppressing layer 124 and the metal-nucleation-promoting layer 126. For example, the sacrificial cover material layer 127L can include a semiconductor material such as polysilicon or a silicon-germanium alloy, amorphous carbon or diamond-like carbon (DLC), a silicon-based inorganic polymer, or a doped silicate glass such as borosilicate glass or phosphosilicate glass. The sacrificial cover material layer 127L can be deposited by a conformal deposition process such as chemical vapor deposition. The duration of the deposition process that deposits the sacrificial cover material layer 127L is selected such that the backside recesses 43 are completely filled with the material of the sacrificial cover material layer 127L, and a center portion of each backside trench 79 is not filled with the material of the sacrificial cover material layer 127L.

Figure 14B:
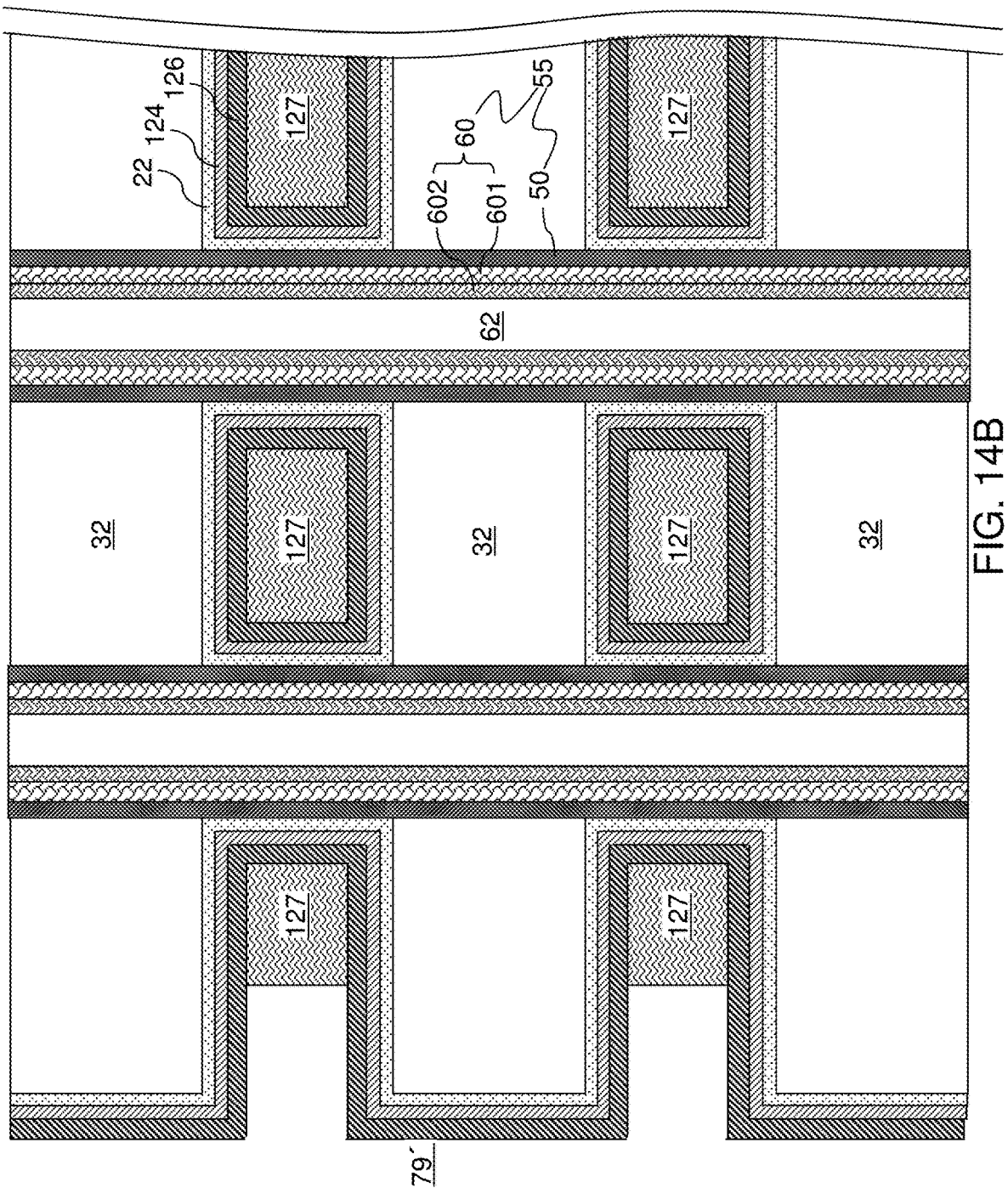

Referring to FIG. 14B, the material of the sacrificial cover material layer 127L can be selectively recessed from an unfilled portion of each backside trench 79. For example, a chlorine plasma containing selective etch can be used to etch a silicon sacrificial cover material layer 127L selectively to underlying tungsten metal-nucleation-promoting layer 126. The material of the sacrificial cover material layer 127L is removed from inside each backside trench 79 and from portions of the backside recesses 43 that are proximal to the backside trenches 79. In one embodiment, the distance of lateral recess of the sacrificial cover material layer 127L from sidewalls of the backside trenches 79 can be selected such that all cylindrical portions of the metal-nucleation-promoting layer 126 are covered by the remaining portions of the sacrificial cover material layer 127L. Each remaining portion of the sacrificial cover material layer 127L can be located with a respective one of the backside recesses 43, and is herein referred to as a sacrificial cover material portion 127. Portions of the metal-nucleation-promoting liner 126 (which is a continuous liner material layer at this step) that are proximal to the backside trenches 79 (such as the first and second backside trenches) can be physically exposed by laterally recessing the sacrificial cover material in the backside recesses. The lateral recess distance as measured from a most proximal sidewall of the backside trenches 79 can be in a range from 10 nm to 100 nm, although lesser and greater lateral recess distances can also be employed.

Figure 14C:
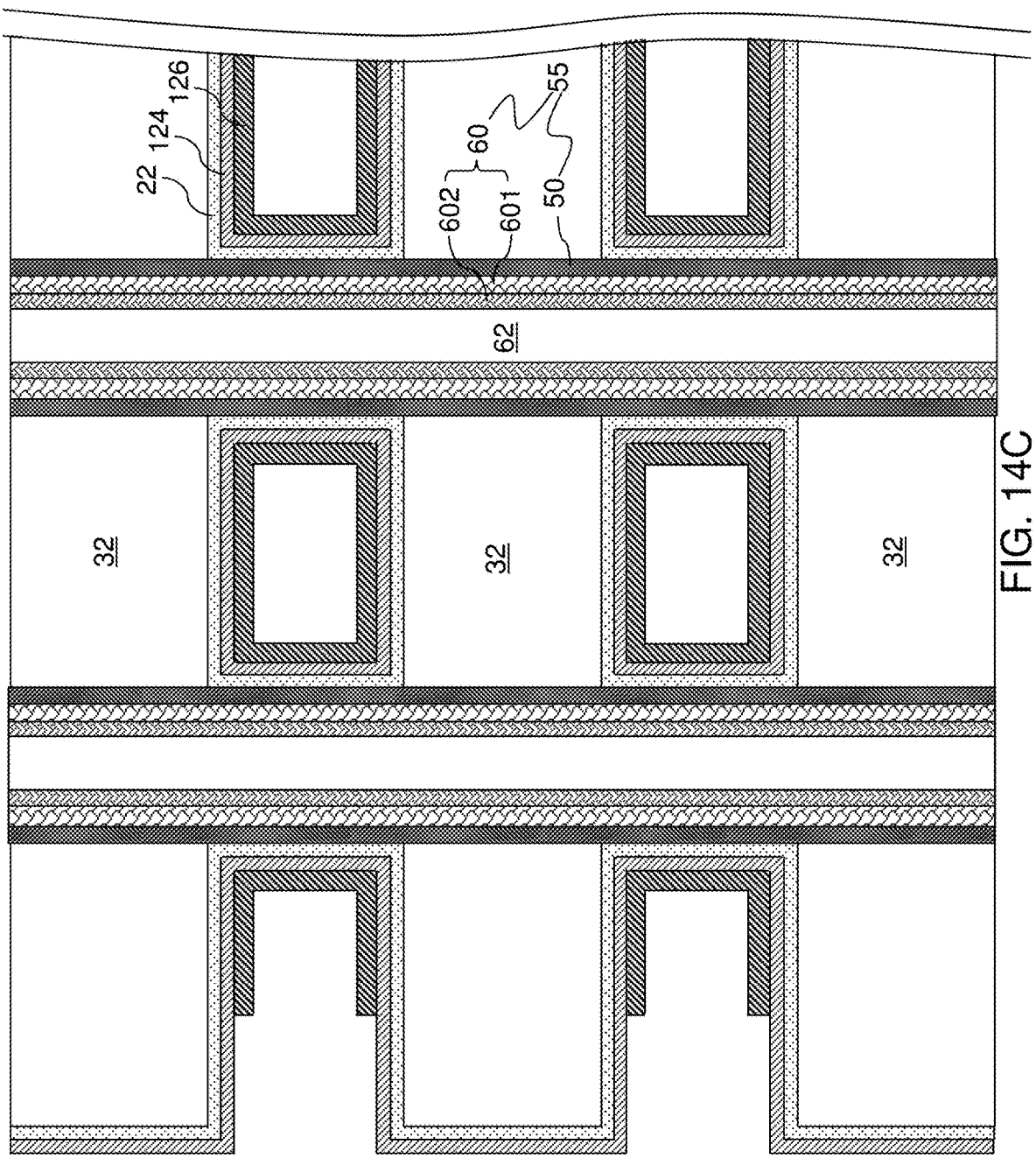

Referring to FIG. 14C, physically exposed portions of the metal-nucleation-promoting layer 126 can be removed selective to the material of the metal-nucleation-suppressing layer 124 by a selective etch process that employs the sacrificial cover material portions 127 as an etch mask. In one embodiment, the etch process can be an isotropic wet etch process, such as a hydrogen peroxide wet etch process, that etches the material of the metal-nucleation-promoting layer 126 selective to the material of the metal-nucleation-suppressing layer 124. The chemistry of the isotropic etch process can be selected depending on the material compositions of the metal-nucleation-promoting layer 126 and the metal-nucleation-suppressing layer 124. A single continuous structure of the metal-nucleation-promoting liner 126 as originally formed is divided into a plurality of metal-nucleation-promoting liners 126. Each of the metal-nucleation-promoting liners 126 can be a discrete structure that is located entirely within a level of a respective sacrificial material layer 42. For example, a metal-nucleation-promoting liner 126 can be located between a vertically neighboring pair of insulating layers 32. Subsequently, the sacrificial cover material portions 127 can be removed selective to the materials of the metal-nucleation-promoting liners 126 and the metal-nucleation-suppressing liner 124 by a selective etch process (e.g., chlorine plasma etch for silicon sacrificial cover material portions) or by ashing for carbon sacrificial cover material portions.

Thus, each metal-nucleation-promoting liner 126 can be formed by depositing and patterning a liner material (i.e., the material of the metal-nucleation-promoting liner 126) on the metal-nucleation-suppressing liner 124. The metal-nucleation-suppressing liner 124 can be located between, and can directly contact, each of the metal-nucleation-promoting liners 126 and a respective portion of the backside blocking dielectric layer 22. A metal-nucleation-promoting liner 126 is formed in each of the backside recesses 43. Each of the metal-nucleation-promoting liner 126 has a lesser lateral extent than the lateral distance between a neighboring pair of backside trenches 79. For example, if an entire set of metal-nucleation-promoting liners 126 located between a neighboring pair of a first backside trench 79 and a second backside trench 79 can have a lesser lateral extent than the lateral distance between the first backside trench 79 and the second backside trench 79.

Each metal-nucleation-promoting liner 126 can have a first horizontal portion formed over an overlying horizontal surface (such as a bottom surface of an overlying insulating layer 32) of a respective one of the backside recesses 43, a second horizontal portion formed over an underlying horizontal surface (such as a top surface of an underlying insulating layer 32) of the respective one of the backside recesses 43, cylindrical portions that connect the first horizontal portion and the second horizontal portion and laterally surrounding a respective one of the memory stack structures 55. Each of the first and second horizontal portions has a uniform thickness throughout. The total number of cylindrical portions per metal-nucleation-promoting liner 126 can be the same as the total number of memory stack structures 55 between a pair of backside trenches 79 that are adjacent to the metal-nucleation-promoting liner 126. In one embodiment, each of the metal-nucleation-promoting liners 126 can comprise, and/or consist essentially of an electrically conductive material, such as a material selected from silicon, a metal silicide (e.g., tungsten silicide), and an elemental metal (e.g., W or Ru).

Figure 14D:
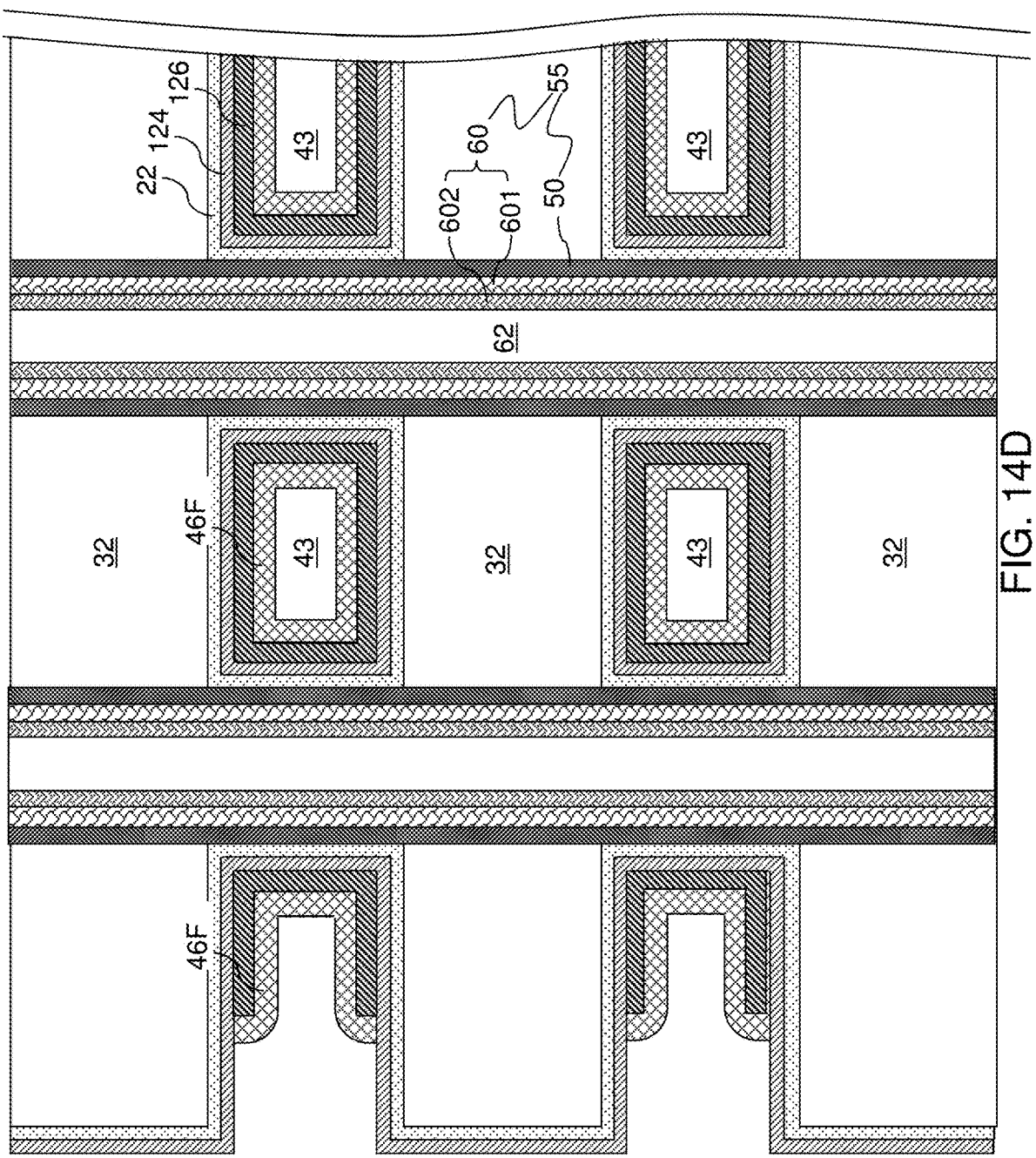

Referring to FIG. 14D, a metal can be selectively grown from surfaces of the metal-nucleation-promoting liners 126 while growing at a lower rate (including a rate of about zero resulting in no growth) the metal from surfaces of the backside recesses that are not covered by the metal-nucleation-promoting liners 126. In one embodiment, the metal can be LFW ALD W. Specifically, the metal grows from the surfaces of the metal-nucleation-promoting liners 126 while the metal grows at a lower rate (including not growing) from the surfaces of the metal-nucleation-suppressing liner 124. The metal that is deposited by the selective metal deposition process has a lesser incubation time on the surfaces of the metal-nucleation-promoting liner 126 than on the surfaces of the metal-nucleation-suppressing liner 124. Thus, the metal that is deposited by the selective metal deposition process can grow from the surfaces of the metal-nucleation-promoting liner 126 without growing from the surfaces of the metal-nucleation-suppressing liner 124, thereby shrinking the volume of each backside cavity 43 from between neighboring pairs of backside trenches 79 and without deposition of the metal in portions of the backside recesses 43 that are proximal to the backside trenches 79. The deposited metal forms a metal fill portion 46F within each backside recess.

Figure 14E:
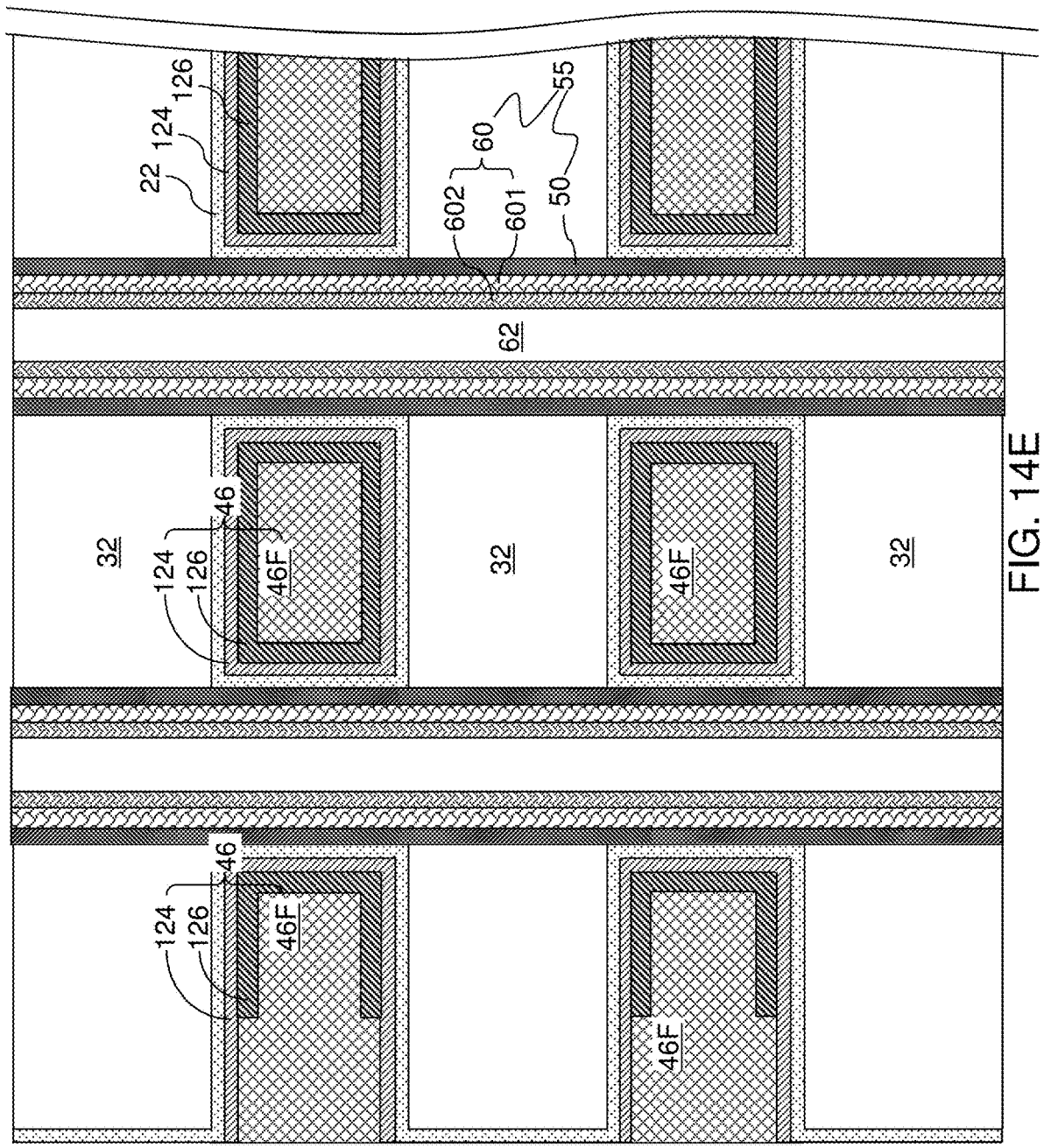

Referring to FIG. 14E, in one embodiment, horizontal portions of each metal fill portion 46F can merge within each backside recess to form horizontal seams that laterally surround each of the memory stack structures 55 located between the first backside trench 79 and the second backside trench 79. After formation of the horizontal seams, the metal fill portions 46F grow outward toward the backside trenches 79. In one embodiment, the incubation time on the surfaces of the metal-nucleation-suppressing liner 124 can be greater than the process time needed to form the seams. In this case, the metal does not grow from the surfaces of the metal-nucleation-suppressing liner 124 until, and/or after, formation of the seams.

The selective metal deposition process continues until all volumes of the backside recesses are filled with the seam-containing metal fill portions 46F. In one embodiment, convex surfaces of the metal fill portions 46F can protrude into the volumes of the backside trenches 79 after all volumes of the backside recesses 43 are filled with the metal fill portions 46F. In one embodiment, the incubation time on the surfaces of the metal-nucleation-suppressing liner 124 can be greater than the process time needed to form the entire volumes of the backside recesses 43 with the metal fill portions 46F. In this case, the metal does not grow from the surfaces of the metal-nucleation-suppressing liner 124 even after completion of formation of the metal fill portions 46F. An anneal process can be performed to remove all horizontal seams from the metal fill portions 46F.

Subsequently, an etch process can be performed to remove regions of the metal fill portions 46F that are located in the backside trenches 79. In this case, each of the metal fill portions 46F can have vertical sidewalls such that a first vertical sidewall of each metal fill portion 46F faces one of the backside trenches 79 (such as the first backside trench) and a second vertical sidewall of each metal fill portion 46F faces another one of the backside trenches 79 (such as the second backside trench).

The anisotropic etch removes portions of the metal-nucleation-suppressing liner 124 located within the backside trenches 79. Thus, the metal-nucleation-suppressing liner 124 is divided into a plurality of physically disjoined portions that are confined at a respective level of a sacrificial material layer 42, for example, between an overlying insulating layer 32 and an underlying insulating layer 32. Each metal-nucleation-suppressing liner 124, as divided by the anisotropic etch process, can laterally extend between a neighboring pair of backside trenches 79. In one embodiment, each combination of a metal-nucleation-suppressing liner 124 and a metal fill portion 46F embedded therein can have a pair of vertically coincident sidewalls that face two backside trenches 79.

Each combination of adjacent metal-nucleation-suppressing liner 124, a metal-nucleation-promoting liner 126, and a metal fill portion 46F collectively constitutes an electrically conductive layer 46, which can provide the same function as the electrically conducive layers 46 described above. In one embodiment, the metal fill portions 46F can comprise, and/or consist essentially of, tungsten. Subsequently, the processing steps of FIG. 9 can be performed to form source regions 61. Thereafter, the processing steps of FIGS. 10A and 10B can be performed.

Figure 15A:
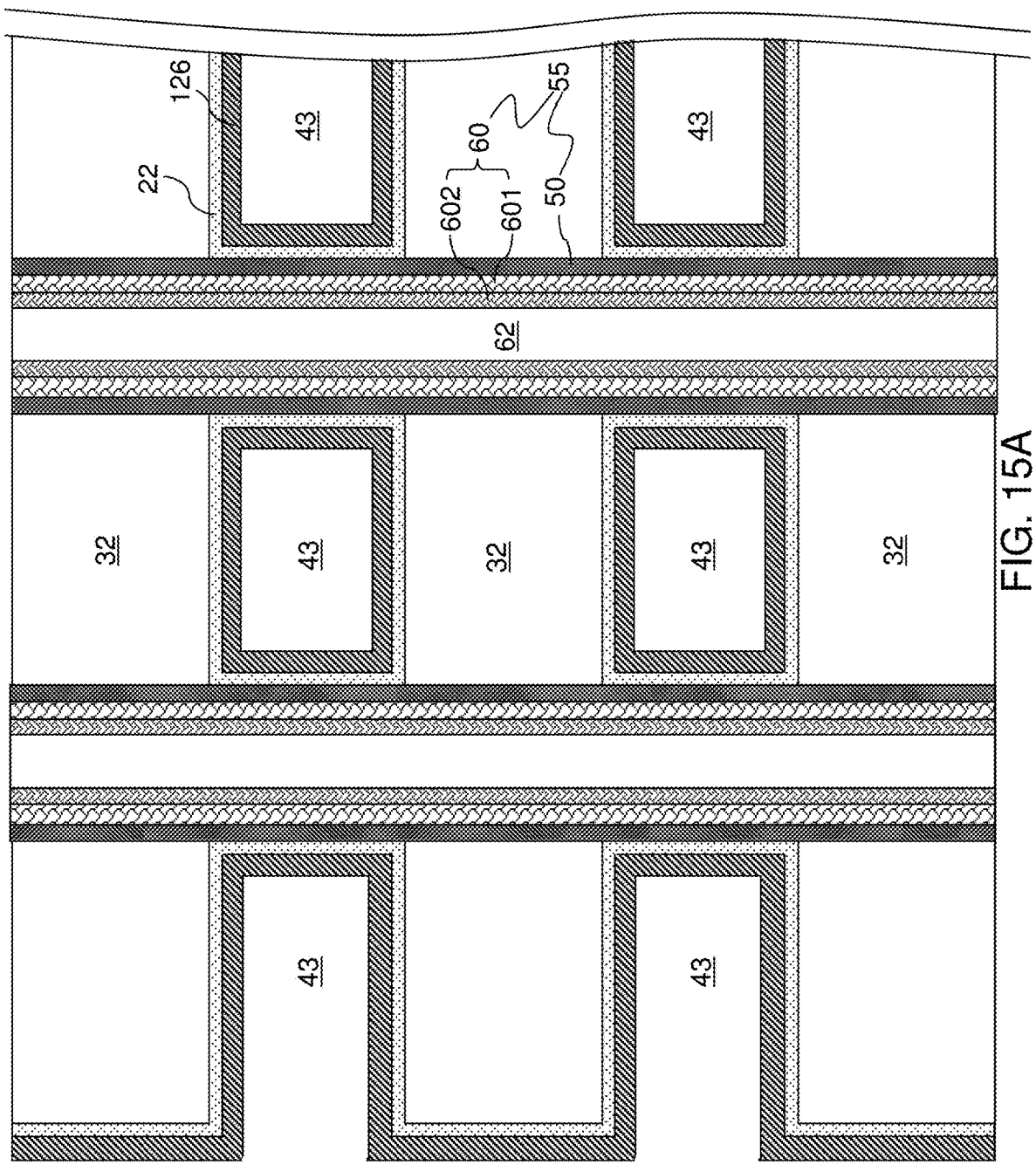

In a fourth embodiment, the backside blocking dielectric layer 22 is formed from a metal-nucleation-suppressing material, such as amorphous aluminum oxide. Therefore, in this embodiment, a separate metal-nucleation-suppressing liner 124 can be omitted. Referring to FIG. 15A, a fourth alternative exemplary structure according to the fourth embodiment is illustrated. This structure can be derived from the second alternative exemplary structure of FIG. 13A by depositing a backside blocking dielectric layer 22 employing the processes of FIG. 13B, by omitting formation of a separate metal-nucleation-suppressing liner 124, and by forming a metal-nucleation-promoting liner 126 employing the processing steps of FIG. 13C. Thus, the metal-nucleation-promoting liner 126 can be formed directly on surfaces of the backside blocking dielectric layer 22.

The backside blocking dielectric layer 22 can continuously extend from a bottommost one of the insulating layers 32 to a topmost one of the insulating layers 32. The backside blocking dielectric layer 22 can comprise horizontal portions that contact horizontal surfaces of the insulating layers 32, first vertical portions that contact sidewalls of the insulating layers 32, and second vertical portions that contact outer sidewalls of the memory stack structures 55. In one embodiment, the backside blocking dielectric layer 22 can include, or can consist essentially of, amorphous aluminum oxide.

The material of the backside blocking dielectric layer 22 can be selected such that the surfaces of the backside blocking dielectric layer 22 are less conducive to nucleation of a metal than the surfaces of the metal-nucleation-promoting liner 126. The metal-nucleation-promoting liner 126 is formed as a continuous liner material layer that continuously extends without a hole therein and covers all physically exposed surfaces of the backside blocking dielectric layer 22 around the backside recesses 43 and the backside trenches 79. As a continuous liner material layer, the metal-nucleation-promoting liner 126 can continuously extend between each neighboring pair of backside trenches 79 through each backside recess 43 therebetween.

The materials of the backside blocking dielectric layer and the metal-nucleation-promoting liner 126 are selected such that the material of the metal-nucleation-promoting liner 126 provides a shorter incubation time the metal to be subsequently deposited than the material of the backside blocking dielectric layer 22. In one embodiment, the incubation time of the metal-nucleation-promoting liner 126 for the metal can be less than 50%, 25%, 10%, 5%, 1%, 0.1%, and/or 0.01% of the incubation time for the backside blocking dielectric layer. In one embodiment, the metal-nucleation-promoting liner 126 can comprise, and/or can consist essentially of, a material selected from silicon, a metal silicide, and an elemental metal. In one embodiment, the metal-nucleation-promoting liner 126 can comprise, and/or can consist essentially of, a material selected from silicon, tungsten silicide, ruthenium, and tungsten.

In one embodiment, the metal-nucleation-promoting liner 126 can include a material that provides a minimal incubation time such as less than 10 seconds and/or less than 1 second. For example, the metal-nucleation-promoting liner 126 for tungsten deposition can include a material such as silicon, titanium oxide, tungsten silicide, ruthenium, or tungsten (including silicon-doped tungsten or boron-doped tungsten that can be deposited by alternately flowing a tungsten precursor gas (such as tungsten hexafluoride or tungsten hexachloride) and a hydride compound such as silane or diborane). Alternatively, materials such as boron or WCN can be employed the material of the metal-nucleation-promoting liner 126. An exemplary metal deposition process is the above described LFW ALD tungsten deposition process that employs a tungsten precursor gas (such as tungsten hexafluoride or tungsten hexachloride) as a reactant gas and hydrogen as a reducing agent.

The thickness of the metal-nucleation-promoting liner 126 can be selected such that the metal-nucleation-promoting liner 126 is formed as a continuous material layer without holes therein. For example, the thickness of the metal-nucleation-promoting liner 126 can be in a range from 0.8 nm to 3 nm, although lesser and greater thicknesses can also be employed for each of the two layers. A backside cavity 79' is present within each backside trench 79.

Figure 15B:
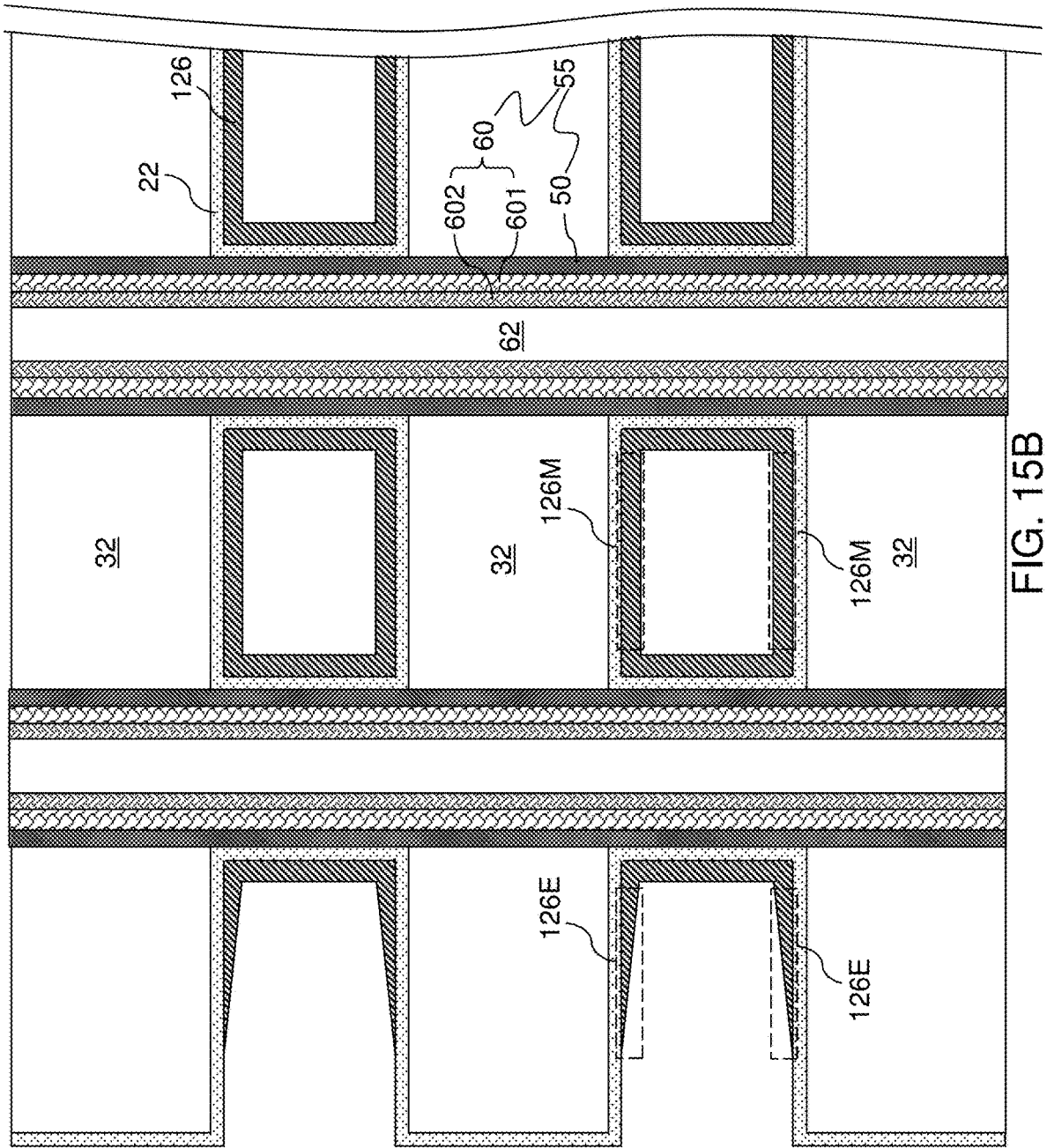

Referring to FIG. 15B, a selective etch process is performed to remove the material of the metal-nucleation-promoting liner 126 with an etch rate that decreases with distance from a most proximal backside trench 79. For example, $SF_6$ plasma etch can be used to etch the WCN metal-nucleation-promoting liner 126 selective to the backside blocking dielectric layer 22. The metal-nucleation-promoting liner 126, as initially formed as a continuous liner material layer, is etched with a variable etch rate that decreases in the backside recesses 43 with a lateral distance from a proximal one of the backside trenches 79. Each remaining portion of the continuous liner material layer constitutes a discrete liner. Thus, a single continuous structure of the metal-nucleation-promoting liner 126 as originally formed is divided into a plurality of metal-nucleation-promoting liners 126. Each of the metal-nucleation-promoting liners 126 can be located entirely within a level of a respective sacrificial material layer 42, and thus, can be located between a vertically neighboring pair of insulating layers 32.

Thus, each metal-nucleation-promoting liner 126 can be formed by depositing and patterning a liner material (i.e., the material of the metal-nucleation-promoting liner 126) on the backside blocking dielectric layer 22 in each of the backside recesses 43. Each of the metal-nucleation-promoting liner 126 has a lesser lateral extent than the lateral distance between a neighboring pair of backside trenches 79. For example, if an entire set of metal-nucleation-promoting liners 126 located between a neighboring pair of a first backside trench 79 and a second backside trench 79 can have a lesser lateral extent than the lateral distance between the first backside trench 79 and the second backside trench 79.

Each metal-nucleation-promoting liner 126 can have a first horizontal portion formed on an overlying horizontal surface (such as a bottom surface of an overlying portion of the backside blocking dielectric layer 22) of a respective one of the backside recesses 43, a second horizontal portion formed on an underlying horizontal surface (such as a top surface of an underlying portion of the backside blocking dielectric layer 22) of the respective one of the backside recesses 43, cylindrical portions that connect the first horizontal portion and the second horizontal portion and laterally surrounding a respective one of the memory stack structures 55. The total number of cylindrical portions per metal-nucleation-promoting liner 126 can be the same as the total number of memory stack structures 55 between a pair of backside trenches 79 that are adjacent to the metal-nucleation-promoting liner 126.

The etch rate of the anisotropic etch process that removes edge portions of the metal-nucleation-promoting liners 126 from the vicinities of the backside trenches 79 decreases with the lateral distance from the backside trenches 79. For the entire set of metal-nucleation-promoting liners 126 located between a first backside trench 79 and a second backside trench 79, each of the metal-nucleation-promoting liners 126 can be laterally spaced from the first backside trench 79 and from the second backside trench 79 by a same lateral offset distance. In one embodiment, each of the first and second horizontal portions can include a middle portion 126M having a uniform thickness, and recessed end portions 126E adjoined to the middle portion 126M having a tapered thickness that decreases with distance from the middle portion 126M.

Figure 15C:
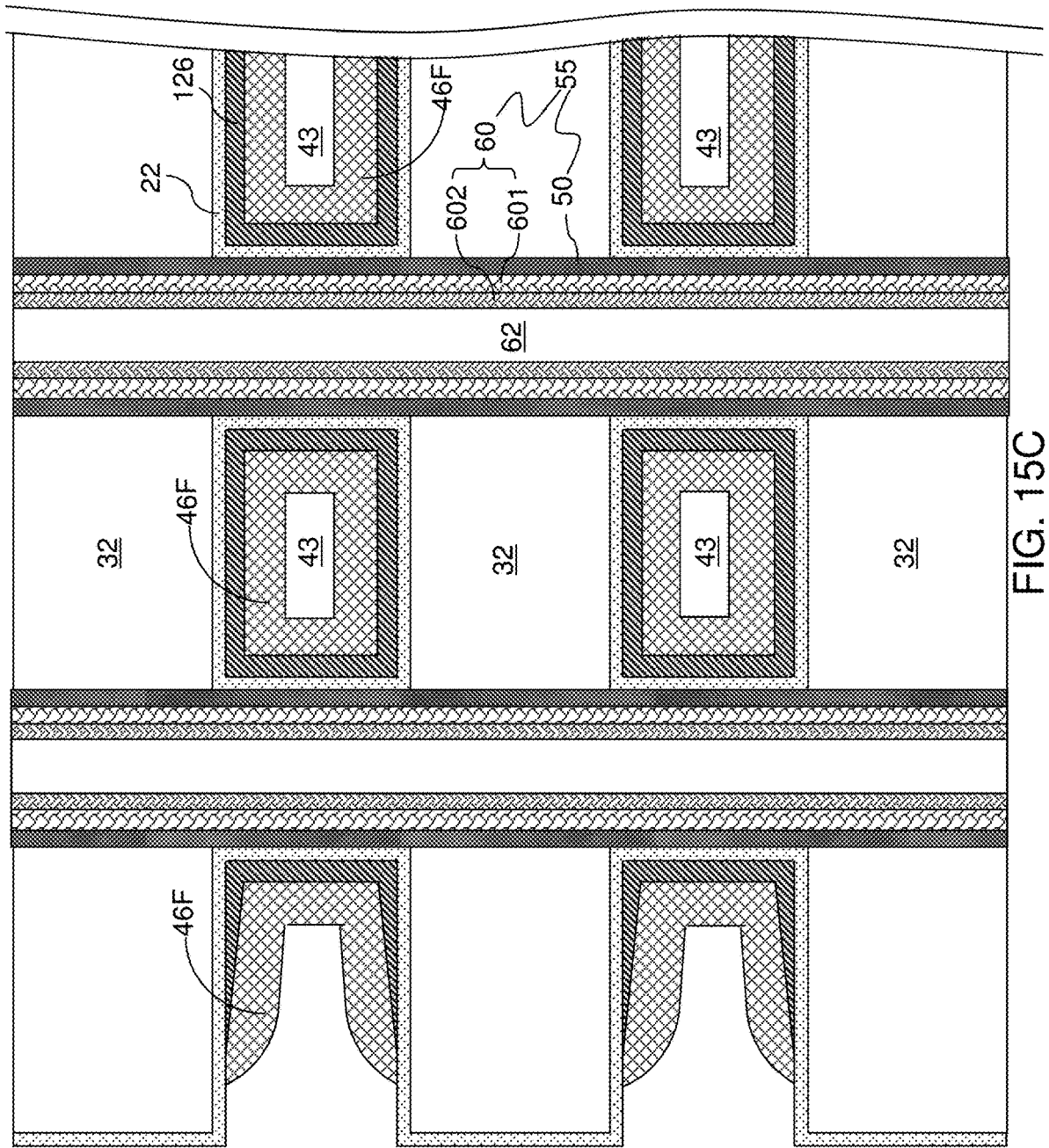

Referring to FIG. 15C, a metal can be selectively grown from surfaces of the metal-nucleation-promoting liners 126 while growing at a lower rate (including a rate of about zero resulting in no continuous layer growth) the metal from surfaces of the backside recesses that are not covered by the metal-nucleation-promoting liners 126. Specifically, the metal grows from the surfaces of the metal-nucleation-promoting liners 126 while the metal grows at a lower rate (including does not grow at all) from the surfaces of the backside blocking dielectric layer 22. The metal that is deposited by the selective metal deposition process has a lesser incubation time on the surfaces of the metal-nucleation-promoting liner 126 than on the surfaces of the backside blocking dielectric layer 22. Thus, the metal that is deposited by the selective metal deposition process can grow from the surfaces of the metal-nucleation-promoting liner 126 while growing at a lower rate (including not growing as a continuous layer) from the surfaces of the backside blocking dielectric layer 22, thereby shrinking the volume of each backside cavity 43 from between neighboring pairs of backside trenches 79 and in one embodiment without deposition of the metal in portions of the backside recesses 43 that are proximal to the backside trenches 79. The deposited metal forms a metal fill portion 46F within each backside recess.

Figure 15D:
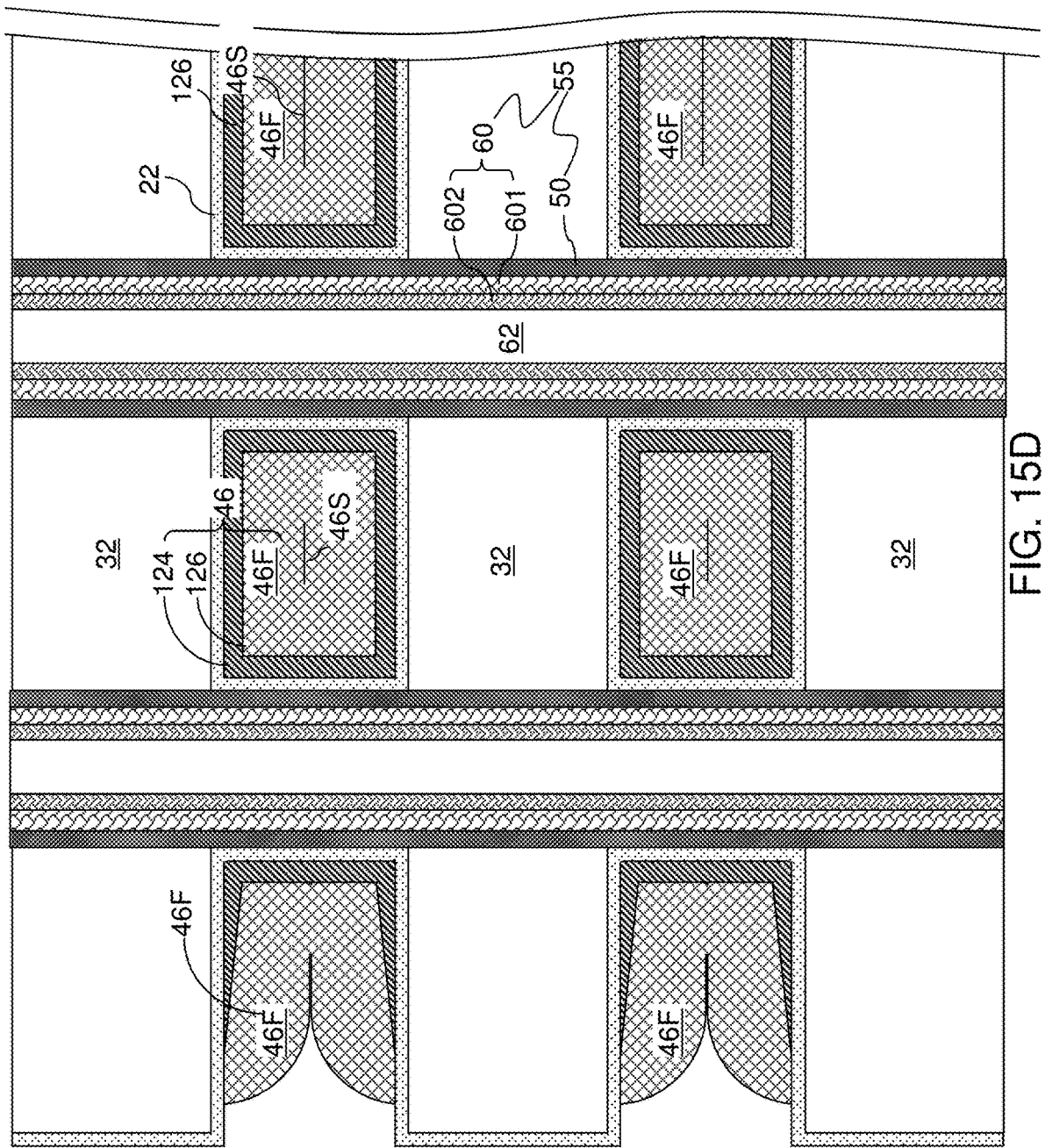

Referring to FIG. 15D, horizontal portions of each metal fill portion 46F can merge within each backside recess to form horizontal seams 46S that laterally surround each of the memory stack structures 55 located between the first backside trench 79 and the second backside trench 79. In one embodiment, after formation of the horizontal seams 46S, the metal fill portions 46F grow outward toward the backside trenches 79. In one embodiment, the incubation time on the surfaces of the backside blocking dielectric layer 22 can be greater than the process time needed to form the horizontal seams 46S. In this case, the metal does not grow from the surfaces of the backside blocking dielectric layer 22 until, and/or after, formation of the horizontal seams 46S.

Figure 15E:
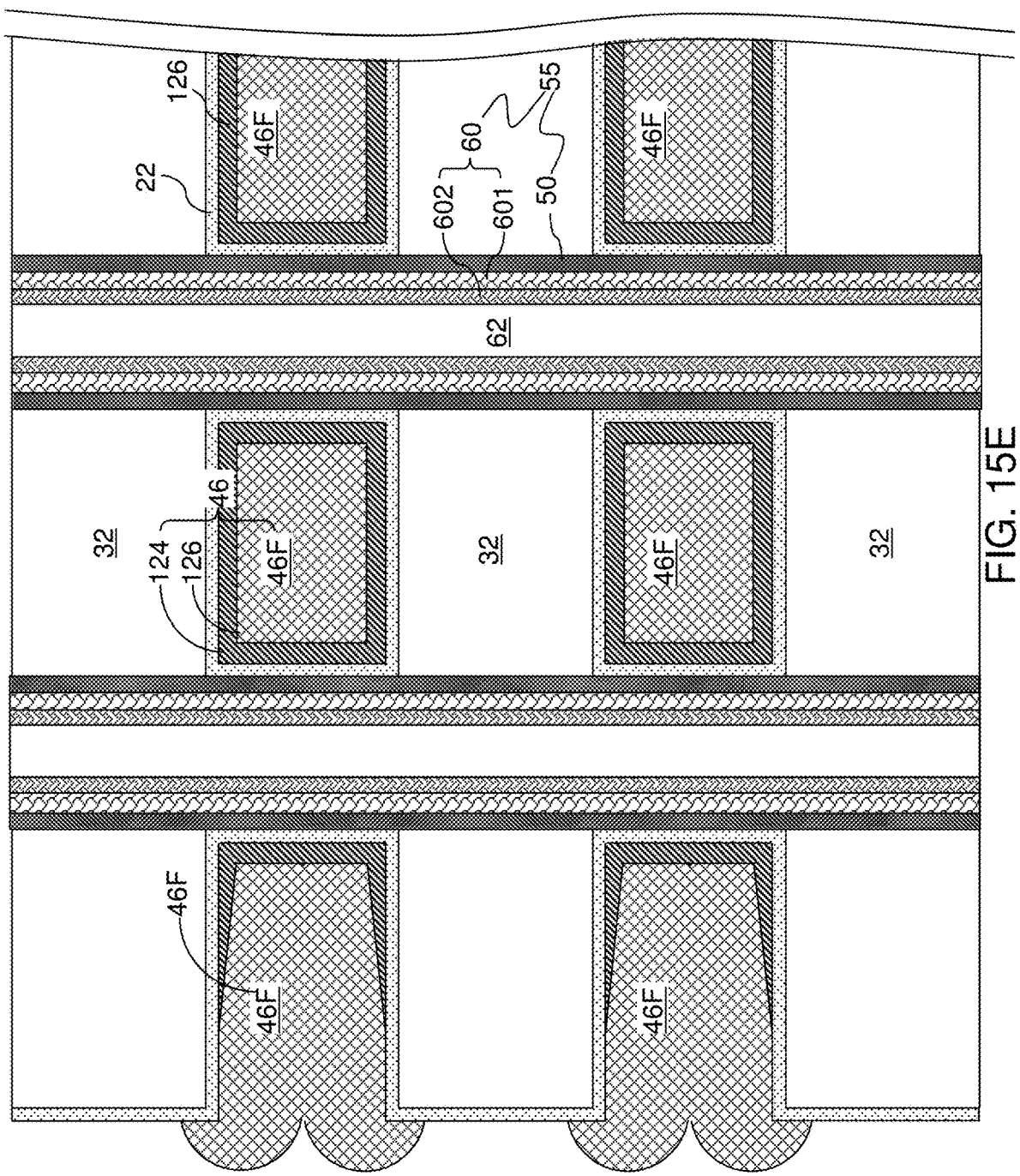

Referring to FIG. 15E, the selective metal deposition process continues until all volumes of the backside recesses 43 are filled with the metal fill portions 46F. In one embodiment, convex surfaces of the metal fill portions 46F can protrude into the volumes of the backside trenches 79 after all volumes of the backside recesses 43 are filled with the metal fill portions 46F. In one embodiment, the incubation time on the surfaces of the backside blocking dielectric layer 22 can be greater than the process time needed to form the entire volumes of the backside recesses 43 with the metal fill portions 46F. In this case, the metal does not grow from the surfaces of the backside blocking dielectric layer 22 even after completion of formation of the metal fill portions 46F. An anneal process is subsequently performed to remove all horizontal seams 46S from the metal fill portions 46F.

Referring to FIG. 15F, an etch process (such as an anisotropic etch process) can be optionally performed to remove regions of the metal fill portions 46F that are located in the backside trenches 79. In this case, each of the metal fill portions 46F can have vertical sidewalls such that a first vertical sidewall of each metal fill portion 46F faces one of the backside trenches 79 (such as the first backside trench) and a second vertical sidewall of each metal fill portion 46F faces another one of the backside trenches 79 (such as the second backside trench). Each combination of adjacent metal-nucleation-promoting liner 126 and metal fill portion 46F collectively constitutes an electrically conductive layer 46, which can provide the same function as the electrically conducive layers 46 described above. In one embodiment, the metal fill portions 46F can comprise, and/or consist essentially of, tungsten. Subsequently, the processing steps of FIG. 9 can be performed to form source regions 61. Thereafter, the processing steps of FIGS. 10A and 10B can be performed.

Figure 16A:
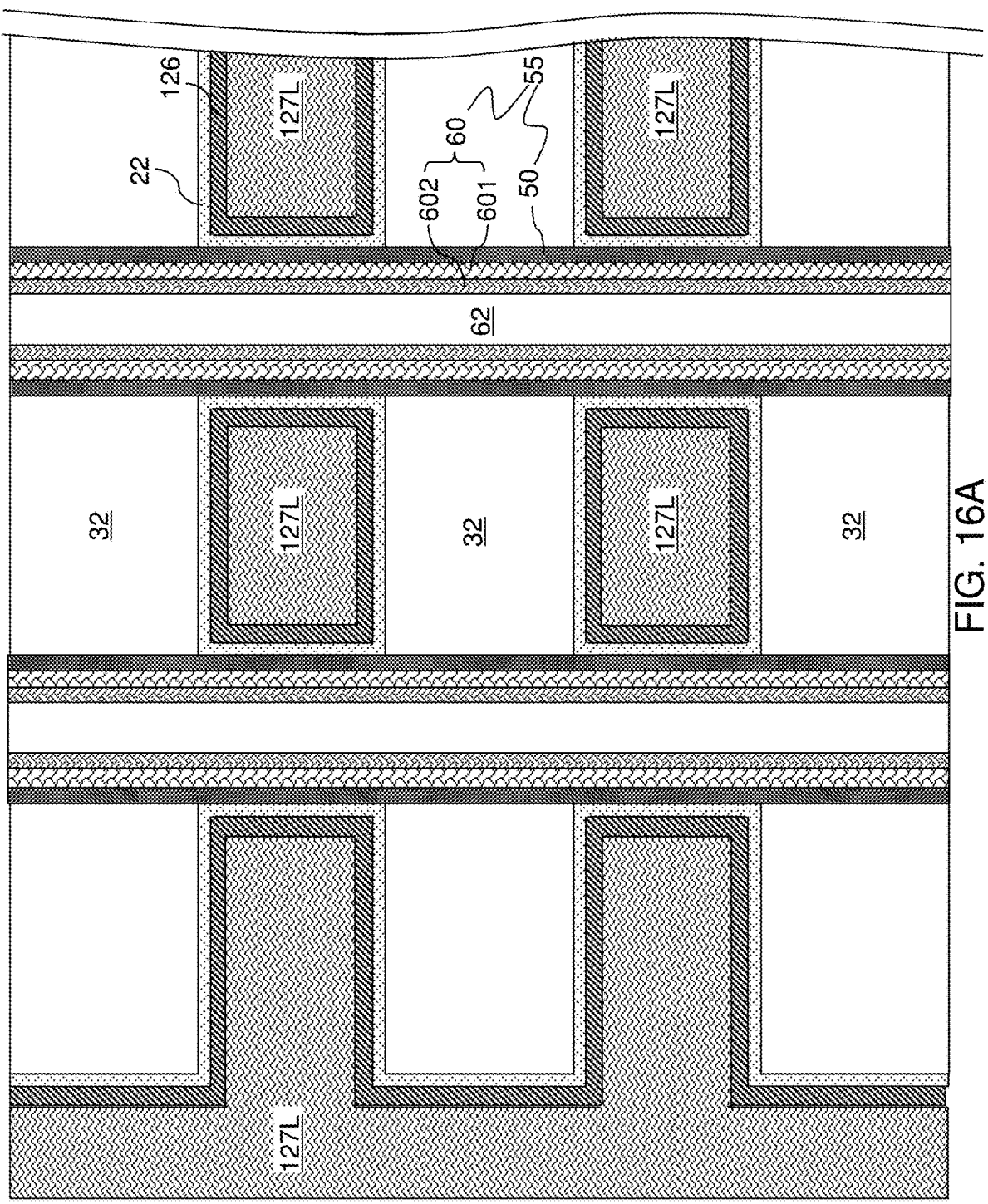
FIGS. 16A-16E are sequential vertical cross-sectional views of a fifth alternative exemplary structure during formation of electrically conductive layers.

Referring to FIG. 16A, a fifth alternative exemplary structure according to an embodiment of the present disclosure can be derived from the fourth alternative exemplary structure of FIG. 15A by depositing a sacrificial cover material layer 127L in the backside recesses 43 and at peripheral portions of the backside trenches 79. The metal-nucleation-promoting liner 126 is present as a continuous liner material layer, and the sacrificial cover material layer 127L can be deposited on the surfaces of the metal-nucleation-promoting liner 126. The sacrificial cover material layer 127L includes a material that can be subsequently removed selective to the material of the metal-nucleation-promoting layer 126. For example, the sacrificial cover material layer 127L can include a semiconductor material such as polysilicon or a silicon-germanium alloy, amorphous carbon or diamond-like carbon (DLC), a silicon-based inorganic polymer, or a doped silicate glass such as borosilicate glass or phosphosilicate glass. The sacrificial cover material layer 127L can be deposited by a conformal deposition process such as chemical vapor deposition. The duration of the deposition process that deposits the sacrificial cover material layer 127L is selected such that the backside recesses 43 are completely filled with the material of the sacrificial cover material layer 127L, and a center portion of each backside trench 79 is not filled with the material of the sacrificial cover material layer 127L.

Figure 16B:
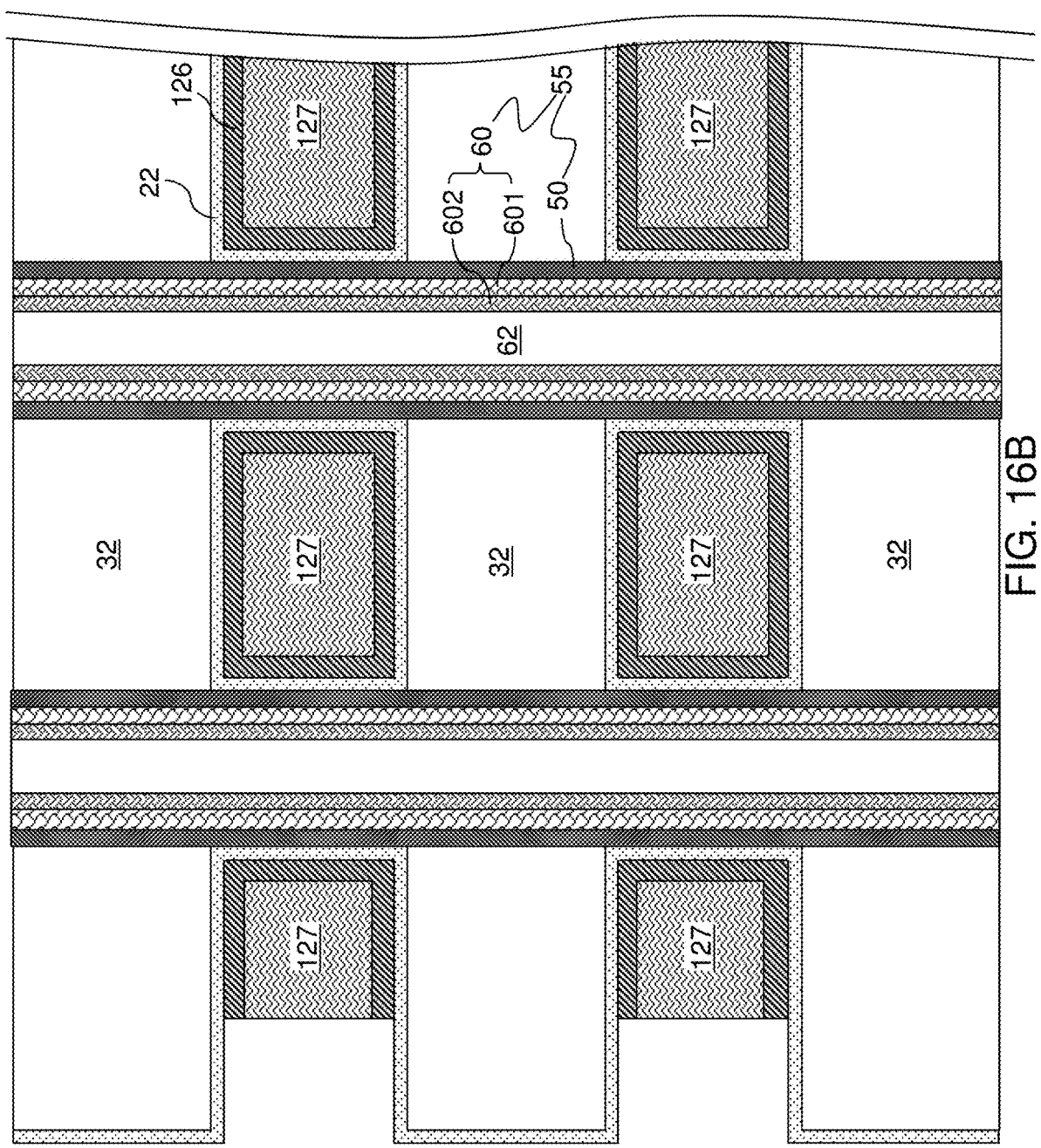

Referring to FIG. 16B, the material of the sacrificial cover material layer 127L can be selectively recessed from an unfilled portion of each backside trench 79 (e.g., by a chlorine plasma etch for a silicon material). The material of the sacrificial cover material layer 127L is removed from inside each backside trench 79 and from portions of the backside recesses 43 that are proximal to the backside trenches 79. In one embodiment, the distance of lateral recess of the sacrificial cover material layer 127L from sidewalls of the backside trenches 79 can be selected such that all cylindrical portions of the metal-nucleation-promoting layer 126 are covered by the remaining portions of the sacrificial cover material layer 127L. Each remaining portion of the sacrificial cover material layer 127L can be located with a respective one of the backside recesses 43, and is herein referred to as a sacrificial cover material portion 127. Portions of the metal-nucleation-promoting liner 126 (which is a continuous liner material layer at this step) that are proximal to the backside trenches 79 (such as the first and second backside trenches) can be physically exposed by laterally recessing the sacrificial cover material in the backside recesses. The lateral recess distance as measured from a most proximal sidewall of the backside trenches 79 can be in a range from 10 nm to 100 nm, although lesser and greater lateral recess distances can also be employed.

Physically exposed portions of the metal-nucleation-promoting layer 126 can be removed selective to the material of the backside blocking dielectric layer 22 that inhibits deposition of a metal thereupon. A selective etch process can be performed to remove the physically exposed portions of the metal-nucleation-promoting layer 126. The sacrificial cover material portions 127 can be employed as an etch mask. In one embodiment, the selective etch process can be a selective hydrogen peroxide wet etch process that etches the material of the metal-nucleation-promoting layer 126 (e.g., tungsten) selective to the material of the backside blocking dielectric layer 22 (e.g., amorphous aluminum oxide) and the sacrificial cover material portions 127. The chemistry of the isotropic etch process can be selected depending on the material compositions of the metal-nucleation-promoting layer 126, the blocking dielectric layer 22 and the sacrificial cover material portions 127. A single continuous structure of the metal-nucleation-promoting liner 126 as originally formed is divided into a plurality of metal-nucleation-promoting liners 126. Each of the metal-nucleation-promoting liners 126 can be a discrete structure that is located entirely within a level of a respective sacrificial material layer 42. For example, a metal-nucleation-promoting liner 126 can be located between a vertically neighboring pair of insulating layers 32.

Figure 16C:
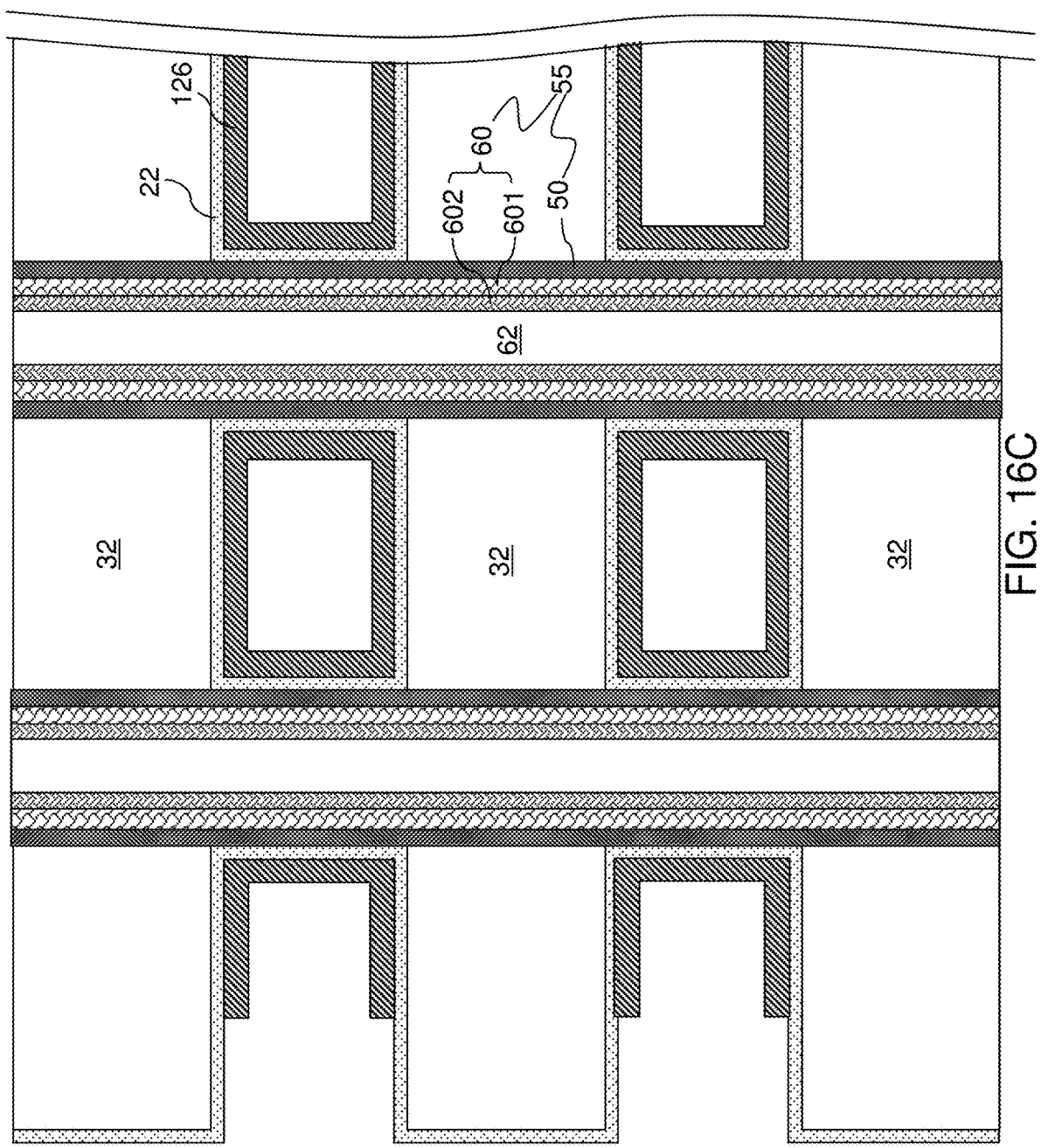

As shown in FIG. 16C, Subsequently, the sacrificial cover material portions 127 can be removed selective to the materials of the metal-nucleation-promoting liners 126 and the backside blocking dielectric layer 22 by a selective etch process (e.g., chlorine plasma for silicon material) or by ashing for carbon material. Thus, each metal-nucleation-promoting liner 126 can be formed by depositing and patterning a liner material (i.e., the material of the metal-nucleation-promoting liner 126) on the backside blocking dielectric layer 22 in each of the backside recesses 43. The metal-nucleation-promoting liner 126 can directly contact the backside blocking dielectric layer 22. Each of the metal-nucleation-promoting liner 126 has a lesser lateral extent than the lateral distance between a neighboring pair of backside trenches 79. For example, if an entire set of metal-nucleation-promoting liners 126 located between a neighboring pair of a first backside trench 79 and a second backside trench 79 can have a lesser lateral extent than the lateral distance between the first backside trench 79 and the second backside trench 79.

Each metal-nucleation-promoting liner 126 can have a first horizontal portion formed over an overlying horizontal surface (such as a bottom surface of an overlying insulating layer 32) of a respective one of the backside recesses 43, a second horizontal portion formed over an underlying horizontal surface (such as a top surface of an underlying insulating layer 32) of the respective one of the backside recesses 43, cylindrical portions that connect the first horizontal portion and the second horizontal portion and laterally surrounding a respective one of the memory stack structures 55. Each of the first and second horizontal portions has a uniform thickness throughout. The total number of cylindrical portions per metal-nucleation-promoting liner 126 can be the same as the total number of memory stack structures 55 between a pair of backside trenches 79 that are adjacent to the metal-nucleation-promoting liner 126.

Figure 16D:
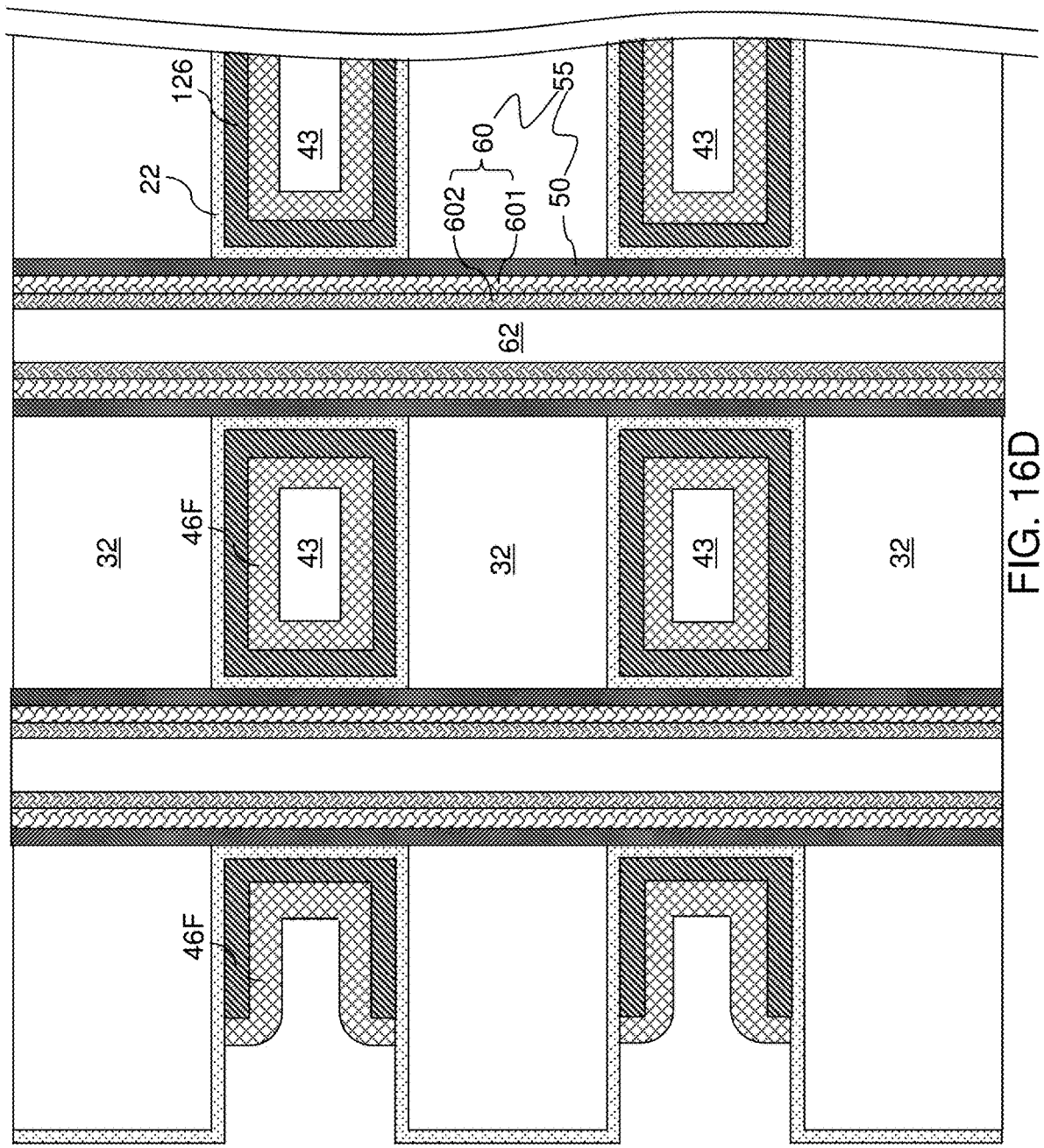

Referring to FIG. 16D, a metal can be selectively grown from surfaces of the metal-nucleation-promoting liners 126 while growing at a lower rate (including a rate of about zero) the metal from surfaces of the backside recesses that are not covered by the metal-nucleation-promoting liners 126. Specifically, the metal grows from the surfaces of the metal-nucleation-promoting liners 126 while the metal grows at a lower rate (including not growing as a continuous layer) from the surfaces of the backside blocking dielectric layer 22. The metal that is deposited by the selective metal deposition process has a lesser incubation time on the surfaces of the metal-nucleation-promoting liner 126 than on the surfaces of the backside blocking dielectric layer 22. Thus, the metal that is deposited by the selective metal deposition process can grow from the surfaces of the metal-nucleation-promoting liner 126 while growing at a lower rate (including not growing at all) from the surfaces of the backside blocking dielectric layer 22, thereby shrinking the volume of each backside cavity 43 from between neighboring pairs of backside trenches 79 and in one embodiment without deposition of the metal in portions of the backside recesses 43 that are proximal to the backside trenches 79. The deposited metal forms a metal fill portion 46F within each backside recess.

Figure 16E:
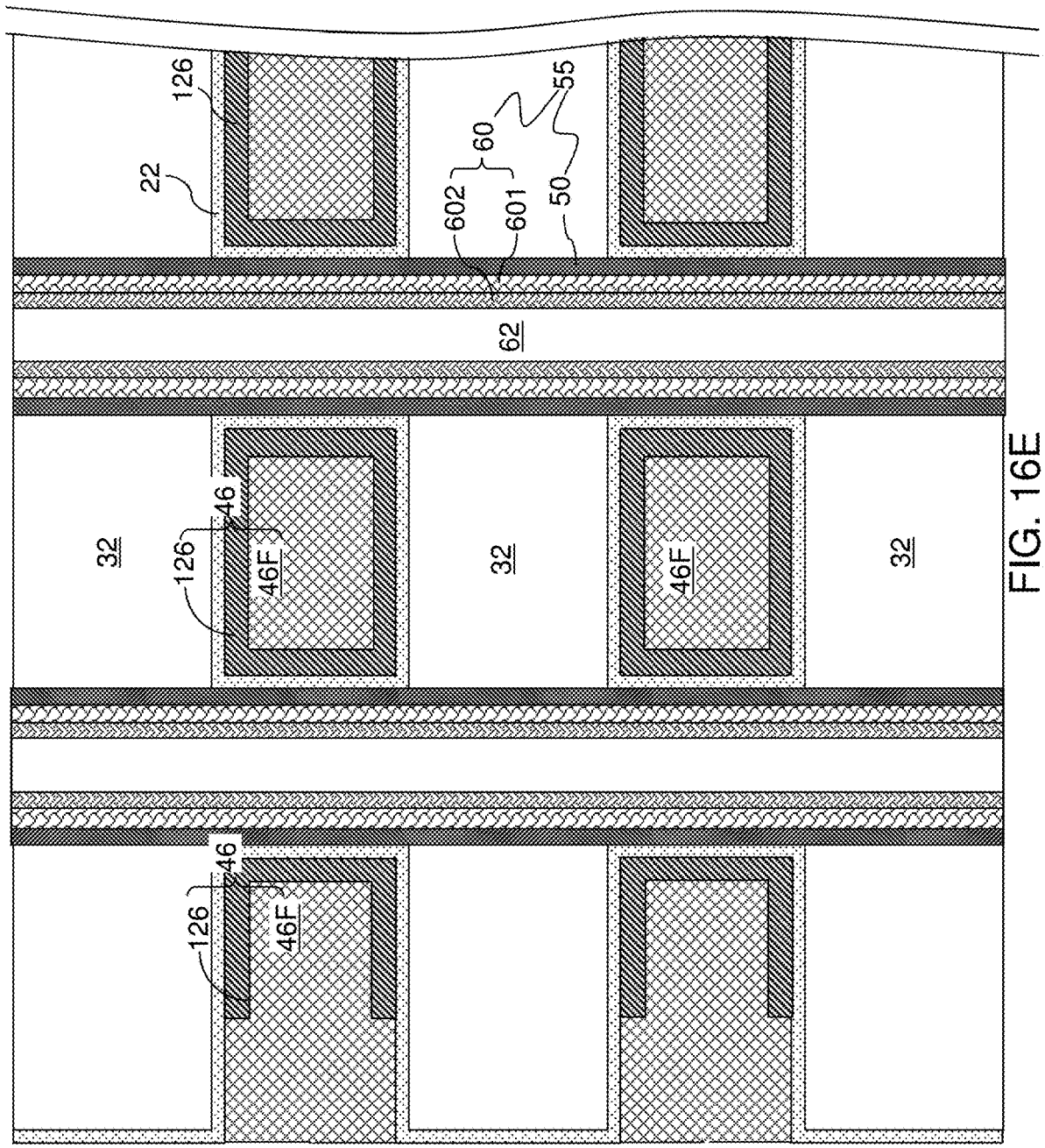

Referring to FIG. 16E, in one embodiment, horizontal portions of each metal fill portion 46F can merge within each backside recess to form horizontal seams that laterally surround each of the memory stack structures 55 located between the first backside trench 79 and the second backside trench 79. After formation of the horizontal seams, the metal fill portions 46F grow outward toward the backside trenches 79. In one embodiment, the incubation time on the surfaces of the backside blocking dielectric layer 22 can be greater than the process time needed to form the seams. In this case, the metal does not grow from the surfaces of the backside blocking dielectric layer 22 until, and/or after, formation of the seams.

The selective metal deposition process continues until all volumes of the backside recesses are filled with the seam-containing metal fill portions 46F. In one embodiment, convex surfaces of the metal fill portions 46F can protrude into the volumes of the backside trenches 79 after all volumes of the backside recesses 43 are filled with the metal fill portions 46F. In one embodiment, the incubation time on the surfaces of the backside blocking dielectric layer 22 can be greater than the process time needed to form the entire volumes of the backside recesses 43 with the metal fill portions 46F. In this case, the metal does not grow from the surfaces of the backside blocking dielectric layer 22 even after completion of formation of the metal fill portions 46F. An anneal process is subsequently performed to remove all horizontal seams 46S from the metal fill portions 46F.

Subsequently, an etch process (such as an anisotropic etch process) can be optionally performed to remove regions of the metal fill portions 46F that are located in the backside trenches 79. In this case, each of the metal fill portions 46F can have vertical sidewalls such that a first vertical sidewall of each metal fill portion 46F faces one of the backside trenches 79 (such as the first backside trench) and a second vertical sidewall of each metal fill portion 46F faces another one of the backside trenches 79 (such as the second backside trench).

In case the anisotropic etch process is omitted, or is replaced with a surface clean process that removes any trace of metallic material on surfaces of the backside blocking dielectric layer 22 from around the backside trenches 79, each metal fill portion 46F between a pair of backside trenches 79 can have two pairs of convex surfaces. In this case, one pair of convex surfaces can face a first backside trench 79, and another pair of convex surfaces can face a second backside trench 79. An insulating material such as an insulating spacer 74 (such as one illustrated in FIGS. 10A and 10B) can be formed directly on each pair of convex surfaces of a metal fill portion 46F.

Each combination of adjacent metal-nucleation-promoting liner 126 and a metal fill portion 46F collectively constitutes an electrically conductive layer 46, which can provide the same function as the electrically conducive layers 46 described above. In one embodiment, the metal fill portions 46F can comprise, and/or consist essentially of, tungsten. Subsequently, the processing steps of FIG. 9 can be performed to form source regions 61. Thereafter, the processing steps of FIGS. 10A and 10B can be performed.

According to various embodiments of the present disclosure, a three-dimensional memory device is provided, which comprises: an alternating stack of insulating layers 32 and electrically conductive layers 46 located over a substrate (9, 10); memory stack structures 55 extending through the alternating stack (32, 46), each of the memory stack structures 55 including charge storage elements (for example, as embodied as portions of the charge storage layer 54 located at levels of the electrically conductive layers 46), a tunneling dielectric 56, and a vertical semiconductor channel 60; a first backside trench 79 and a second backside trench 79 that extend through the alternating stack (32, 46) to the substrate (9, 10); and a backside blocking dielectric layer 22 located between each vertically neighboring pair of an insulating layer 32 and an electrically conductive layer 46 and laterally extending from the first backside trench 79 to the second backside trench 79. Each of the electrically conductive layers 46 comprises a respective metal fill portion (46F, 46B) that laterally extends from the first backside trench 79 to the second backside trench 79, and a liner (126, 28) having a lesser lateral extent than a lateral distance between the first backside trench 79 and the second backside trench 79.

In one embodiment, the liner (126 or 28) is located between each neighboring pair of a metal fill portion (46F or 46B) of the electrically conductive layers 46 and a horizontal portion of the backside blocking dielectric layer 22 that extends between the first backside trench 79 and the second backside trench 79.

In one embodiment, each of the liners (126 or 28) is laterally spaced from the first backside trench 79 and from the second backside trench 79 by a same lateral offset distance.

In one embodiment, each of the liners 126 comprises: a first horizontal portion overlying a respective one of the metal fill portions 46F of the electrically conductive layers 46; a second horizontal portion underlying the respective one of the metal fill portions 46F of the electrically conductive layers 46; and cylindrical portions that connect the first horizontal portion and the second horizontal portion and laterally surrounding a respective one of the memory stack structures 55.

In one embodiment, each of the first and second horizontal portions has a uniform thickness throughout. In another embodiment, each of the first and second horizontal portions includes: a middle portion 126M having a uniform thickness; and end portions 126E adjoined to the middle portion 126M and having a tapered thickness that decreases with distance from the middle portion 126M.

In one embodiment, the backside blocking dielectric layer 22 comprises aluminum oxide, the metal fill portions 46F of the electrically conductive layers 46 comprise, and/or consist essentially of, tungsten, and the liners 126 comprise a material selected from silicon, tungsten silicide, titanium oxide, ruthenium, and tungsten.

In some embodiments, each of the liners 126 directly contacts a horizontal surface of the backside blocking dielectric layer 22. In some other embodiments, a metal-nucleation-suppressing liner 124 is located between, and directly contacts, a respective one of the liners 126 and a respective portion of the backside blocking dielectric layer 22.

In some embodiments, the backside blocking dielectric layer 22 continuously extends from a bottommost layer of the alternating stack (32, 46) to a topmost layer of the alternating stack, and comprises horizontal portions that contact horizontal surfaces of the insulating layers 32, first vertical portions that contact sidewalls of the insulating layers 32, and second vertical portions that contact outer sidewalls of the memory stack structures 55.

In some embodiments, the alternating stack (32, 46) comprises a terrace region in which each electrically conductive layer 46 other than a topmost electrically conductive layer within the alternating stack (32, 46) laterally extends farther than an overlying electrically conductive layer within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 155 extend through the stepped surfaces and through a retro-stepped dielectric material portion 65 that overlies the stepped surfaces.

Each of the various exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a memory material layer 54 at a level of an electrically conductive layer 46) in a first device level of the array of monolithic three-dimensional NAND strings can be located over another memory cell (as embodied as another portion of the memory material layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as portions of the memory material layer located at levels of the electrically conductive layers 46). Each charge storage element can be located adjacent to a respective one of the plurality of semiconductor channels (59, 11, 60).

The methods of the present disclosure can be employed to fill distal portions of the backside recesses with tungsten word line material before filling proximal portions of the backside recesses, thereby preventing incomplete filling of the backside recesses and formation of cavities within the tungsten word lines located in the backside recesses. Elimination or reduction of cavities in the distal portions of the backside recesses increases volumes filled with conductive materials inside the backside recesses, and thus, increases structural integrity of the embodiment structures. Thus, collapse of the alternating stack during, or after, formation of the electrically conductive layers can be prevented through the methods of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate;
    memory stack structures extending through the alternating stack, each of the memory stack structures including charge storage elements, a tunneling dielectric, and a vertical semiconductor channel;
    a first backside trench and a second backside trench that extend through the alternating stack; and
    a backside blocking dielectric layer located between each vertically neighboring pair of an insulating layer of the insulating layers of the alternating stack and an electrically conductive layer of the electrically conductive layers of the alternating stack, and laterally extending from the first backside trench to the second backside trench,
    wherein each of the electrically conductive layers comprises a respective metal fill portion that laterally extends from the first backside trench to the second backside trench and having a lateral extent that equals a lateral distance between the first backside trench and the second backside trench, and comprises a respective liner having a lesser lateral extent than the lateral distance between the first backside trench and the second backside trench.

2. The three-dimensional memory device of claim 1, wherein:
    each of the liners is located between each neighboring pair of a metal fill portion of the electrically conductive layers and a horizontal portion of the backside blocking dielectric layer that extends between the first backside trench and the second backside trench; and
    each of the liners is laterally spaced from the first backside trench and from the second backside trench by a same lateral offset distance.

3. The three-dimensional memory device of claim 1, wherein each of the liners comprises:
    a first horizontal portion overlying a respective one of the metal fill portions of the electrically conductive layers;
    a second horizontal portion underlying the respective one of the metal fill portions of the electrically conductive layers; and
    cylindrical portions that connect the first horizontal portion and the second horizontal portion and laterally surrounding a respective one of the memory stack structures.

4. The three-dimensional memory device of claim 3, wherein each of the first and second horizontal portions has a uniform thickness throughout.

5. The three-dimensional memory device of claim 3, wherein each of the first and second horizontal portions includes:
    a middle portion having a uniform thickness; and
    end portions adjoined to the middle portion and having a tapered thickness that decreases with distance from the middle portion.

6. The three-dimensional memory device of claim 1, wherein:
    the backside blocking dielectric layer comprises amorphous aluminum oxide;
    the metal fill portions of the electrically conductive layers comprise tungsten; and
    the liners of the electrically conductive layers comprise a material selected from silicon, tungsten silicide, titanium oxide ruthenium, and tungsten.

7. The three-dimensional memory device of claim 6, wherein each of the liners directly contacts a horizontal surface of the backside blocking dielectric layer.

8. The three-dimensional memory device of claim 6, wherein a metal-nucleation-suppressing liner is located between, and directly contacts, a respective one of the liners and a respective portion of the backside blocking dielectric layer.

9. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

10. The three-dimensional memory device of claim 1, further comprising:
a first insulating spacer located in the first backside trench and in contact with a sidewall of the first backside trench; and
a second insulating spacer located in the second backside trench and in contact with a sidewall of the second backside trench,
wherein each liner of the electrically conductive layers is not in direct contact with the first insulating spacer and is not in direct contact with the second insulating spacer.

11. The three-dimensional memory device of claim 10, wherein each metal fill portion of the electrically conductive layers is in direct contact with the first insulating spacer and the second insulating spacer.

12. The three-dimensional memory device of claim 1, wherein the liner in each of the electrically conductive layers comprises an end portion having a tapered thickness that increases with a lateral distance from a proximal one of the first backside trench and the second backside trench.

13. The three-dimensional memory device of claim 1, wherein the respective liner of each of the electrically conductive layers comprises a respective metal-nucleation-promoting liner comprising a material that promotes deposition of tungsten thereupon.

14. The three-dimensional memory device of claim 1, wherein the respective liner of each of the electrically conductive layers comprises a material selected from silicon, titanium oxide, metal silicide, an elemental metal, or a doped elemental metal.

15. The three-dimensional memory device of claim 1, wherein each of the electrically conductive layers further comprises a respective titanium nitride metal-nucleation-suppressing liner comprising a material that suppresses deposition of tungsten thereupon.

16. The three-dimensional memory device of claim 15, wherein:
the respective liner is in direct contact with the respective titanium nitride metal-nucleation-suppressing liner and is in direct contact with the respective metal fill portion in each of the electrically conductive layers; and
the respective titanium nitride metal-nucleation-suppressing liner is in direct contact with the respective metal fill portion in each of the electrically conductive layers.

17. The three-dimensional memory device of claim 1, wherein the backside blocking dialectic layer has a lateral extent that equals the lateral distance between the first backside trench and the second backside trench.

18. A three-dimensional memory device, comprising:
an alternating stack of insulating layers and electrically conductive layers located over a substrate;
memory stack structures extending through the alternating stack, each of the memory stack structures including charge storage elements, a tunneling dielectric, and a vertical semiconductor channel;
a first backside trench and a second backside trench that extend through the alternating stack; and
a backside blocking dielectric layer located between each vertically neighboring pair of an insulating layer of the insulating layers of the alternating stack and an electrically conductive layer of the electrically conductive layers of the alternating stack, and laterally extending from the first backside trench to the second backside trench,
wherein:
each of the electrically conductive layers comprises a respective metal fill portion that laterally extends from the first backside trench to the second backside trench, and a liner having a lesser lateral extent than a lateral distance between the first backside trench and the second backside trench;
each of the liners is located between each neighboring pair of a metal fill portion of the electrically conductive layers and a horizontal portion of the backside blocking dielectric layer that extends between the first backside trench and the second backside trench; and
each of the liners is laterally spaced from the first backside trench and from the second backside trench by a same lateral offset distance.

19. A three-dimensional memory device, comprising:
an alternating stack of insulating layers and electrically conductive layers located over a substrate;
memory stack structures extending through the alternating stack, each of the memory stack structures including charge storage elements, a tunneling dielectric, and a vertical semiconductor channel;
a first backside trench and a second backside trench that extend through the alternating stack; and
a backside blocking dielectric layer located between each vertically neighboring pair of an insulating layer of the insulating layers of the alternating stack and an electrically conductive layer of the electrically conductive layers of the alternating stack, and laterally extending from the first backside trench to the second backside trench, wherein:

each of the electrically conductive layers comprises a respective metal fill portion that laterally extends from the first backside trench to the second backside trench, and a liner having a lesser lateral extent than a lateral distance between the first backside trench and the second backside trench; and each of the liners comprises:
- a first horizontal portion overlying a respective one of the metal fill portions of the electrically conductive layers;
- a second horizontal portion underlying the respective one of the metal fill portions of the electrically conductive layers; and
- cylindrical portions that connect the first horizontal portion and the second horizontal portion and laterally surrounding a respective one of the memory stack structures.

20. A three-dimensional memory device, comprising:

an alternating stack of insulating layers and electrically conductive layers located over a substrate;

memory stack structures extending through the alternating stack, each of the memory stack structures including charge storage elements, a tunneling dielectric, and a vertical semiconductor channel;

a first backside trench and a second backside trench that extend through the alternating stack; and a backside blocking dielectric layer located between each vertically neighboring pair of an insulating layer of the insulating layers of the alternating stack and an electrically conductive layer of the electrically conductive layers of the alternating stack, and laterally extending from the first backside trench to the second backside trench, wherein:

each of the electrically conductive layers comprises a respective metal fill portion that laterally extends from the first backside trench to the second backside trench, and a liner having a lesser lateral extent than a lateral distance between the first backside trench and the second backside trench;

the backside blocking dielectric layer comprises amorphous aluminum oxide;

the metal fill portions of the electrically conductive layers comprise tungsten; and the liners of the electrically conductive layers comprise a material selected from silicon, tungsten silicide, titanium oxide ruthenium, and tungsten.

* * * * *